(12) United States Patent
Kobayashi et al.

(10) Patent No.: US 7,807,331 B2
(45) Date of Patent: Oct. 5, 2010

(54) HYDROGENATED RING-OPENING METATHESIS POLYMER, RESIST COMPOSITION AND PATTERNING PROCESS

(75) Inventors: Tomohiro Kobayashi, Joetsu (JP); Takeshi Kinsho, Joetsu (JP); Takeru Watanabe, Joetsu (JP); Tadahiro Sunaga, Sodegaura (JP); Yuichi Okawa, Sodegaura (JP)

(73) Assignees: Shin-Etsu Chemical Co., Ltd., Tokyo (JP); Mitsui Chemicals, Inc., Tokyo (JP)

( * ) Notice: Subject to any disclaimer, the term of this patent is extended or adjusted under 35 U.S.C. 154(b) by 183 days.

(21) Appl. No.: 12/252,123

(22) Filed: Oct. 15, 2008

(65) Prior Publication Data

US 2009/0186307 A1   Jul. 23, 2009

(30) Foreign Application Priority Data

Oct. 19, 2007   (JP)   ............................ 2007-272193

(51) Int. Cl.
*G03F 7/004* (2006.01)
*G03F 7/30* (2006.01)
*C08F 232/08* (2006.01)

(52) U.S. Cl. .................... 430/270.1; 430/326; 430/330; 430/905; 526/281

(58) Field of Classification Search ............... 430/270.1, 430/326, 330, 905; 526/280, 281
See application file for complete search history.

(56) References Cited

U.S. PATENT DOCUMENTS

| | | | |
|---|---|---|---|
| 6,136,499 A * | 10/2000 | Goodall et al. | 430/270.1 |
| 6,372,854 B1 | 4/2002 | Sunaga et al. | |
| 6,492,090 B2 * | 12/2002 | Nishi et al. | 430/270.1 |
| 6,525,153 B1 * | 2/2003 | Jayaraman et al. | 526/281 |
| 6,605,408 B2 * | 8/2003 | Nishi et al. | 430/270.1 |
| 6,673,515 B2 * | 1/2004 | Nishi et al. | 430/270.1 |
| 6,794,111 B2 * | 9/2004 | Nishi et al. | 430/270.1 |
| 6,800,720 B2 | 10/2004 | Yamamoto et al. | |
| 7,081,501 B2 | 7/2006 | Okawa et al. | |
| 2009/0246686 A1 | 10/2009 | Watanabe et al. | |

FOREIGN PATENT DOCUMENTS

| | | |
|---|---|---|
| JP | 4-39665 A | 2/1992 |
| JP | 5-257281 A | 10/1993 |
| JP | 2001-354756 A | 12/2001 |

* cited by examiner

*Primary Examiner*—John S Chu
(74) *Attorney, Agent, or Firm*—Birch, Stewart, Kolasch & Birch, LLP

(57) ABSTRACT

Resist compositions comprising a hydrogenated ring-opening metathesis polymer bearing an alicyclic structure in its backbone and comprising structural units having an oxygen atom incorporated as part of the cyclic structure exhibit a high resolution and minimal proximity bias upon ArF excimer laser lithography and have high etching resistance.

11 Claims, 1 Drawing Sheet

HYDROGENATED RING-OPENING METATHESIS POLYMER, RESIST COMPOSITION AND PATTERNING PROCESS

CROSS-REFERENCE TO RELATED APPLICATION

This non-provisional application claims priority under 35 U.S.C. §119(a) on Patent Application No. 2007-272193 filed in Japan on Oct. 19, 2007, the entire contents of which are hereby incorporated by reference.

TECHNICAL FIELD

This invention relates to a hydrogenated ring-opening metathesis polymer, a resist composition comprising the hydrogenated ring-opening metathesis polymer as a base resin, especially suited for exposure to high-energy radiation of wavelength 300 nm or less (inclusive of excimer lasers), and a patterning process using the resist composition.

BACKGROUND OF THE INVENTION

While there is continuing a demand for a finer pattern rule in the drive for higher integration and operating speeds in LSI devices, active efforts have been devoted to develop the microfabrication technology utilizing deep- and vacuum-ultraviolet lithography.

In particular, the ArF excimer laser is widely acknowledged as a light source of next generation to the KrF excimer laser and indispensable for the photolithography of 90-45 nm node advanced semiconductor devices. While polyhydroxystyrene derivatives played a main role as the base resin in resist compositions of the KrF excimer laser generation, they are difficultly applicable to the photolithography using the ArF excimer laser as the light source because they are opaque to wavelength 193 nm. For the ArF excimer laser photolithography, it is the key factor to search for base resins having transparency.

Poly(meth)acrylic acid and derivatives thereof were considered attractive as the resins which are fully transparent at 193 nm and have relatively satisfactory development properties, but left a problem of dry etching resistance. For improving dry etching resistance, poly(meth)acrylate derivatives having alicyclic structures such as adamantane and norbornane structures incorporated in the pendant ester moiety were developed as described in JP-A 4-39665 and JP-A 5-257281. They become the main stream of development work.

These derivatives, however, are still insufficient in etching resistance. It is expected from the future pattern miniaturization trend that etching resistance will become a factor of more significance because formation of a thinner film of resist is essential to acquire a resolution.

Also proposed in the art are resins having an alicyclic structure as the backbone, for example, polynorbornene derivatives and alternating copolymers of polynorbornene derivatives and maleic anhydride. Although some have sufficient etching resistance, there remains unsolved the problem of poor resolution due to inferior development properties, i.e., swelling and low dissolution contrast during development.

Also, for reducing the load to the mask design, improving only the maximum resolution is insufficient, and the proximity bias (or pattern density difference) must be reduced concomitantly.

DISCLOSURE OF THE INVENTION

An object of the invention is to provide a hydrogenated ring-opening metathesis polymer bearing an alicyclic structure in its backbone and having improved etching resistance and improved development properties, a resist composition comprising the same which is suited for exposure to high-energy radiation, and a patterning process using the resist composition.

We have found that a hydrogenated product of ring-opening metathesis polymer bearing an alicyclic structure in its backbone and comprising structural units having an oxygen atom incorporated as part of the cyclic structure is appropriate as the resin that meets all the above-discussed properties of polymers necessary for use as the base polymer in resist compositions, specifically transmittance to UV and deep-UV (inclusive of excimer laser), dissolution in alkaline developer, and etching resistance. We have also found that when the polymer further comprises acid labile units of the structure in which carboxylic acid serving as an alkali soluble group is protected with a specific alkoxymethyl group, the polymer acquires further improved resolution while maintaining the foregoing properties, that is, meets both an improvement in maximum resolution and a reduction of proximity bias.

In a first aspect, the invention provides a hydrogenated ring-opening metathesis polymer comprising structural units [A] and optional structural units [B] and/or [C] in a constitutional molar ratio defined as [A]/([B]+[C]) from 1/99 to 100/0. The units [A] have the general formula

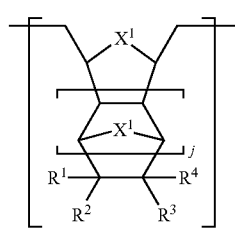

[1]

wherein at least one of $R^1$ to $R^4$ is an alkoxymethyl ester-bearing functional group having the general formula [2]:

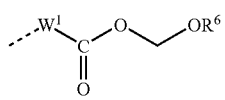

[2]

wherein the broken line denotes a valence bond, $W^1$ is a single bond, divalent $C_1$-$C_{10}$ hydrocarbon, or divalent $C_1$-$C_{10}$ hydrocarbon in which one hydrogen atom is substituted by —$OR^5$, $R^5$ is hydrogen, straight, branched or cyclic $C_1$-$C_{10}$ alkyl, straight, branched or cyclic $C_2$-$C_{10}$ alkoxyalkyl, or straight, branched or cyclic $C_1$-$C_{10}$ acyl, and $R^6$ is straight, branched or cyclic $C_1$-$C_{20}$ alkyl, and the remainders of $R^1$ to $R^4$ are each independently selected from the group consisting of hydrogen, straight, branched or cyclic $C_1$-$C_{20}$ alkyl, halogen, straight, branched or cyclic $C_1$-$C_{20}$ haloalkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkylcarbonyloxy, $C_7$-$C_{20}$ arylcarbonyloxy, straight, branched or cyclic $C_1$-$C_{20}$ alkylsulfonyloxy, $C_6$-$C_{20}$ arylsulfonyloxy, straight, branched or cyclic $C_2$-$C_{20}$ alkoxycarbonyl, and straight, branched or cyclic $C_3$-$C_{20}$ alkoxycarbonylalkyl, $X^1$ which may be the same or different is —O— or —$CR^7_2$— wherein $R^7$ is hydrogen or straight or branched $C_1$-$C_{10}$ alkyl, and j is 0 or an integer of 1 to 3. The units [B] have the general formula [3]:

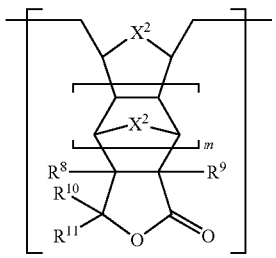

[3]

wherein $R^8$ to $R^{11}$ are each independently hydrogen or straight, branched or cyclic $C_1$-$C_{10}$ alkyl, $X^2$ which may be the same or different is —O— or —CR$^{12}{}_2$— wherein $R^{12}$ is hydrogen or straight or branched $C_1$-$C_{10}$ alkyl, and m is 0 or an integer of 1 to 3. The units [C] have the general formula [4]:

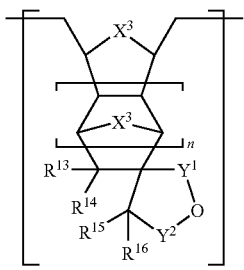

[4]

wherein $R^{13}$ to $R^{16}$ are each independently hydrogen or straight, branched or cyclic $C_1$-$C_{10}$ alkyl, $X^3$ which may be the same or different is —O— or —CR$^{17}{}_2$— wherein $R^{17}$ is hydrogen or straight or branched $C_1$-$C_{10}$ alkyl, one of $Y^1$ and $Y^2$ is —(C=O)— and the other is —CR$^{18}{}_2$— wherein $R^{18}$ is hydrogen or straight or branched $C_1$-$C_{10}$ alkyl, and n is 0 or an integer of 1 to 3.

In preferred embodiments, at least one of $X^1$ in formula [1], $X^2$ in formula [3], and $X^3$ in formula [4] is —O—; and at least one of $R^1$ to $R^4$ is an alkoxymethyl ester-bearing functional group of formula [2] wherein $R^6$ is methyl, neopentyl, 1-adamantyl or 2-adamantyl.

In a preferred embodiment, the hydrogenated ring-opening metathesis polymer may further comprise structural units [D] having the general formula [5]:

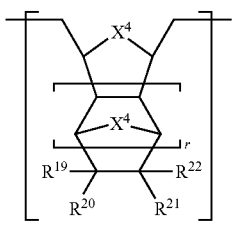

[5]

wherein at least one of $R^{19}$ to $R^{22}$ is an ester-bearing functional group having the general formula [6]:

[6]

wherein the broken line denotes a valence bond, $W^2$ is a single bond, divalent $C_1$-$C_{10}$ hydrocarbon, or divalent $C_1$-$C_{10}$ hydrocarbon in which one hydrogen atom is substituted by —OR$^{23}$, $R^{23}$ is hydrogen, straight, branched or cyclic $C_1$-$C_{10}$ alkyl, straight, branched or cyclic $C_2$-$C_{10}$ alkoxyalkyl, or straight, branched or cyclic $C_1$-$C_{10}$ acyl, and $R^{24}$ is straight, branched or cyclic $C_1$-$C_{20}$ alkyl or straight, branched or cyclic $C_1$-$C_{20}$ haloalkyl, and the remainders of $R^{19}$ to $R^{22}$ are each independently selected from the group consisting of hydrogen, straight, branched or cyclic $C_1$-$C_{20}$ alkyl, halogen, straight, branched or cyclic $C_1$-$C_{20}$ haloalkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkylcarbonyloxy, $C_7$-$C_{20}$ arylcarbonyloxy, straight, branched or cyclic $C_1$-$C_{20}$ alkylsulfonyloxy, $C_6$-$C_{20}$ arylsulfonyloxy, straight, branched or cyclic $C_2$-$C_{20}$ alkoxycarbonyl, and straight, branched or cyclic $C_3$-$C_{20}$ alkoxycarbonylalkyl, $X^4$ which may be the same or different is —O— or —CR$^{25}{}_2$— wherein $R^{25}$ is hydrogen or straight or branched $C_1$-$C_{10}$ alkyl, and r is 0 or an integer of 1 to 3. Preferably the total of structural units [A] of formula [1], structural units [B] of formula [3] and structural units [C] of formula [4], and structural units [D] of formula [5] are present in a constitutional molar ratio defined as ([A]+[B]+[C])/[D] from 99/1 to 20/80.

In a preferred embodiment, the hydrogenated ring-opening metathesis polymer may further comprise structural units [E] having the general formula [7]:

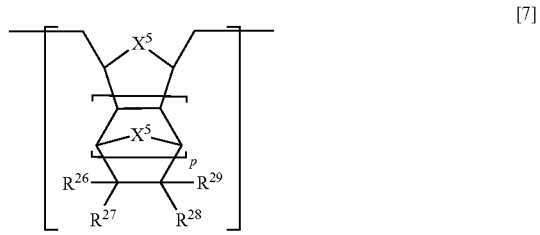

[7]

wherein at least one of $R^{26}$ to $R^{29}$ is a carboxyl-bearing functional group having the general formula [8]:

[8]

wherein the broken line denotes a valence bond, $W^3$ is a single bond, divalent $C_1$-$C_{10}$ hydrocarbon, or divalent $C_1$-$C_{10}$ hydrocarbon in which one hydrogen atom is substituted by —OR$^{30}$, $R^{30}$ is hydrogen, straight, branched or cyclic $C_1$-$C_{10}$ alkyl, straight, branched or cyclic $C_2$-$C_{10}$ alkoxyalkyl, or straight, branched or cyclic $C_1$-$C_{10}$ acyl, and the remainders of $R^{26}$ to $R^{79}$ are each independently selected from the group consisting of hydrogen, straight, branched or cyclic $C_1$-$C_{20}$ alkyl, halogen, straight, branched or cyclic $C_1$-$C_{20}$ haloalkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkylcarbonyloxy, $C_7$-$C_{20}$ arylcarbonyloxy, straight, branched or cyclic $C_1$-$C_{20}$ alkylsulfonyloxy, $C_6$-$C_{20}$ arylsulfonyloxy, straight, branched or cyclic $C_2$-$C_{20}$ alkoxycarbonyl, and straight, branched or cyclic $C_3$-$C_{20}$ alkoxycarbonylalkyl, $X^5$ which may be the same or different is —O— or —$CR^{31}_2$— wherein $R^{31}$ is hydrogen or straight or branched $C_1$-$C_{10}$ alkyl, and p is 0 or an integer of 1 to 3. Preferably the total of structural units [A] of formula [1], structural units [B] of formula [3] and structural units [C] of formula [4], and structural units [E] of formula [7] are present in a constitutional molar ratio defined as ([A]+[B]+[C])/[E] from 99/1 to 20/80. Also preferably the total of structural units [A] of formula [1], structural units [B] of formula [3], structural units [C] of formula [4] and structural units [D] of formula [5], and structural units [E] of formula [7] are present in a constitutional molar ratio defined as ([A]+[B]+[C]+[D])/[E] from 99/1 to 20/80.

In a preferred embodiment, the hydrogenated ring-opening metathesis polymer has a weight average molecular weight of 2,000 to 200,000 as measured by gel permeation chromatography versus polystyrene standards.

In a second aspect, the invention provides a resist composition comprising the hydrogenated ring-opening metathesis polymer defined herein as a base resin.

In a third aspect, the invention provides a pattern forming process comprising the steps of applying a resist composition comprising the hydrogenated ring-opening metathesis polymer defined herein as a base resin onto a substrate to form a coating; heat treating the coating and then exposing it to high-energy radiation or electron beam through a photomask; and optionally heat treating the exposed coating and developing it with a developer.

BENEFITS OF THE INVENTION

The hydrogenated ring-opening metathesis polymer bearing an alicyclic structure in its backbone and comprising structural units having an alkoxymethyl ester group in which carboxylic acid serving as an alkali soluble group is protected with a specific alkoxymethyl group meets both an improved maximum resolution and a reduced proximity bias. The resist composition comprising the polymer is suited for semiconductor microfabrication by high-energy radiation lithography. Using the resist composition, patterns are advantageously formed.

BRIEF DESCRIPTION OF THE DRAWING

The only FIGURE.

DESCRIPTION OF THE PREFERRED EMBODIMENT

Figure 1:
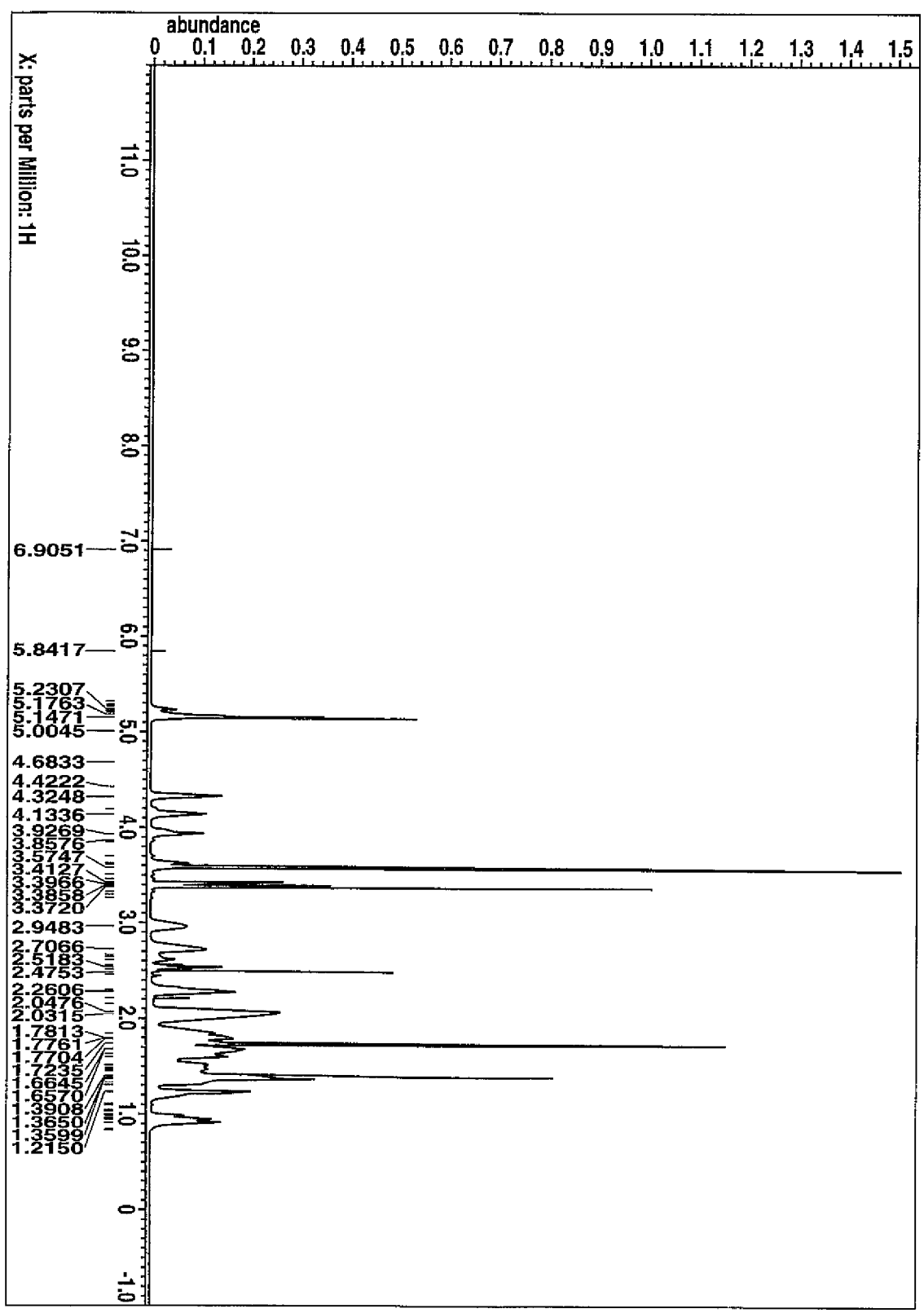
FIG. 1 is a diagram showing the $^1$H-NMR spectrum (600 MHz, deuterated THF) of the hydrogenated ring-opening metathesis polymer obtained in Example 1.

As used herein, the singular forms "a," "an" and "the" include plural referents unless the context clearly dictates otherwise. The notation (Cn-Cm) means a group containing from n to m carbon atoms per group.

While a certain compound is herein represented by a chemical formula, many compounds have a chemical structure for which there can exist enantiomers or diastereomers. Each chemical formula collectively represents all such stereoisomers whether it is either a planar or stereostructural formula. Such stereoisomers may be used alone or in admixture.

Polymer

The invention provides a hydrogenated ring-opening metathesis polymer comprising structural units [A] having the general formula [1] and optionally, structural units [B] having the general formula [3] and/or structural units [C] having the general formula [4].

The structural units [A] have the general formula [1].

[1]

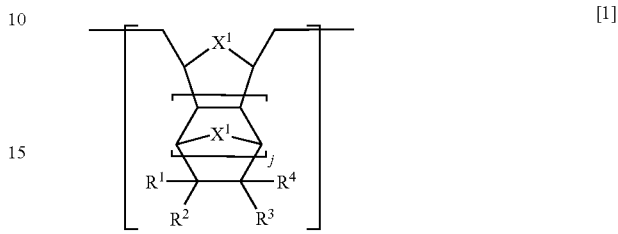

In formula [1], at least one of $R^1$ to $R^4$ is an alkoxymethyl ester-bearing functional group having the general formula [2], that is, an acid labile group. The "acid labile group" is a technical term generally used in the resist-related art. The acid labile group with which an alkali soluble group is protected functions such that when an acid, typically a strong acid is generated by a photoacid generator upon exposure, the protective group is decomposed or deprotected under the catalysis of the strong acid. As a result, the alkali soluble group, typically carboxylic acid is yielded.

[2]

$$\cdots W^1 \diagdown \underset{\underset{O}{\|}}{C} \diagup O \diagdown \diagup OR^6$$

Herein the broken line denotes a valence bond. $W^1$ is a single bond, a divalent $C_1$-$C_{10}$ hydrocarbon group, or a divalent $C_1$-$C_{10}$ hydrocarbon group in which one hydrogen atom is substituted by —$OR^5$. $R^5$ is hydrogen, a straight, branched or cyclic $C_1$-$C_{10}$ alkyl group, a straight, branched or cyclic $C_2$-$C_{10}$ alkoxyalkyl group, or a straight, branched or cyclic $C_1$-$C_{10}$ acyl group. $R^6$ is a straight, branched or cyclic $C_1$-$C_{20}$ alkyl group.

The remainders of $R^1$ to $R^4$ are each independently selected from the group consisting of hydrogen, a straight, branched or cyclic $C_1$-$C_{20}$ alkyl group, halogen, a straight, branched or cyclic $C_1$-$C_{20}$ haloalkyl group, a straight, branched or cyclic $C_1$-$C_{20}$ alkoxy group, a straight, branched or cyclic $C_2$-$C_{20}$ alkoxyalkyl group, a straight, branched or cyclic $C_2$-$C_{20}$ alkylcarbonyloxy group, a $C_7$-$C_{20}$ arylcarbonyloxy group, a straight, branched or cyclic $C_1$-$C_{20}$ alkylsulfonyloxy group, a $C_6$-$C_{20}$ arylsulfonyloxy group, a straight, branched or cyclic $C_2$-$C_{20}$ alkoxycarbonyl group, and a straight, branched or cyclic $C_3$-$C_{20}$ alkoxycarbonylalkyl group. $X^1$ may be the same or different and is —O— or —$CR^7_2$— wherein $R^7$ is hydrogen or a straight or branched $C_1$-$C_{10}$ alkyl group. The subscript j is 0 or an integer of 1 to 3.

Of the groups represented by $R^5$, the straight, branched or cyclic $C_1$-$C_{10}$ alkyl groups include, for example, methyl, ethyl, propyl, isopropyl, n-butyl, isobutyl, tert-butyl, cyclopentyl, cyclohexyl, 1-ethylcyclopentyl and 1-ethylcyclohexyl. Examples of the straight, branched or cyclic $C_2$-$C_{10}$ alkoxyalkyl group include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl. Examples of the straight, branched or cyclic $C_1$-$C_{10}$ acyl group include formyl, acetyl, pivaloyl and cyclohexylcarbonyl. Of these R⁵ groups, preferred are hydrogen, straight or branched $C_1$-$C_6$ alkyl, straight, branched or cyclic $C_2$-$C_7$ alkoxyalkyl, and straight or branched $C_2$-$C_7$ acyl. Most preferred are hydrogen, methyl, ethyl, methoxymethyl, 1-ethoxyethyl, tetrahydrofuran-2-yl, and acetyl.

Examples of the straight, branched or cyclic $C_1$-$C_{20}$ alkyl group represented by R⁶ include methyl, ethyl, propyl, isopropyl, n-butyl, isobutyl, tert-butyl, neopentyl, cyclopentyl, cyclohexyl, 1-ethylcyclopentyl, 1-ethylcyclohexyl, 2-norbornyl, 2-ethyl-2-norbornyl, 1-adamantyl, and 2-adamantyl. Of these groups, preferred are methyl, neopentyl, 1-adamantyl, and 2-adamantyl.

When $W^1$ stands for a single bond, it means that the alkoxymethyl ester group is directly attached, not via $W^1$. $W^1$ may also be a divalent $C_1$-$C_{10}$ hydrocarbon group, examples of which include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, and 1,4-cyclohexylene. Of these, methylene, ethylidene, ethylene, 1-methylethylene, 2-methylethylene, trimethylene, and 2-methyltrimethylene are preferred. $W^1$ may also be a divalent $C_1$-$C_{10}$ hydrocarbon group in which one hydrogen atom is substituted by —OR⁵, for example, substituted forms of the foregoing hydrocarbon groups having one substituent group —OR⁵ at an arbitrary position and having valence bonds at two positions. Most preferably, $W^1$ is a single bond.

The remainders of R¹ to R⁴ are each independently selected from among hydrogen; straight, branched or cyclic $C_1$-$C_{20}$ alkyl groups, such as methyl, ethyl, propyl, isopropyl, n-butyl, tert-butyl, cyclohexyl and menthyl; halogen atoms such as chlorine, bromine, iodine and fluorine; straight, branched or cyclic $C_1$-$C_{20}$ haloalkyl groups, such as fluoromethyl, chloromethyl, bromomethyl, difluoromethyl, dichloromethyl, dibromomethyl, trifluoromethyl, trichloromethyl and tribromomethyl; straight, branched or cyclic $C_1$-$C_{12}$ alkoxy groups, such as methoxy, ethoxy, isopropoxy, n-butoxy, tert-butoxy and menthoxy; straight, branched or cyclic $C_2$-$C_{20}$ alkoxyalkyl groups, such as methoxymethyl, methoxyethyl, tert-butoxymethyl, tert-butoxyethyl and cyclohexyloxymethyl; straight, branched or cyclic $C_2$-$C_{20}$ alkylcarbonyloxy groups such as acetoxy; $C_7$-$C_{20}$ arylcarbonyloxy groups such as naphthoyloxy; straight, branched or cyclic $C_1$-$C_{20}$ alkylsulfonyloxy groups such as mesyloxy; $C_6$-$C_{20}$ arylsulfonyloxy groups such as tosyloxy; straight, branched or cyclic $C_2$-$C_{20}$ alkoxycarbonyl groups such as methoxycarbonyl, ethoxycarbonyl, n-propoxycarbonyl, isopropoxycarbonyl, n-butoxycarbonyl, tert-butoxycarbonyl and cyclohexyloxycarbonyl; and straight, branched or cyclic $C_3$-$C_{20}$ alkoxycarbonylalkyl groups such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl and cyclohexyloxycarbonylmethyl. Of these, preferred are hydrogen, straight, branched or cyclic $C_1$-$C_{20}$ alkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkoxycarbonyl, and straight, branched or cyclic $C_3$-$C_{20}$ alkoxycarbonylalkyl. Most preferred are hydrogen, straight or branched $C_1$-$C_{10}$ alkyl, straight or branched $C_2$-$C_{10}$ alkoxycarbonyl, and straight or branched $C_3$-$C_{10}$ alkoxycarbonylalkyl.

$X^1$ is —O— or —$CR^7_2$— wherein $R^7$ is hydrogen or a straight or branched $C_1$-$C_{10}$ alkyl group. The letter j is 0 or an integer of 1 to 3. When j is 1 to 3, $X^1$ may be the same or different. Exemplary of $R^7$ are hydrogen or straight or branched $C_1$-$C_{10}$ alkyl groups such as methyl, ethyl, n-propyl, isopropyl, n-butyl and tert-butyl. Preferably $X^1$ is —O— or —$CH_2$—. More preferably all $X^1$ groups are either —O— or —$CH_2$—. Preferably j is 0 or 1.

Illustrative examples of the structural units [A] of formula [1] include structural units of the following chemical formulas [9-1-1] to [9-4-32].

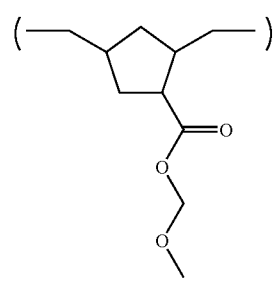

[9-1-1]

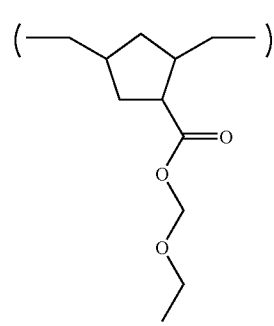

[9-1-2]

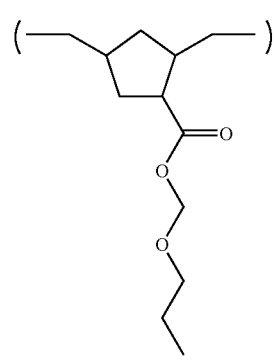

[9-1-3]

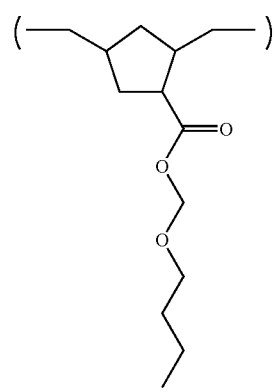

[9-1-4]

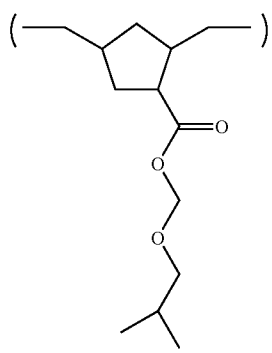 [9-1-5]
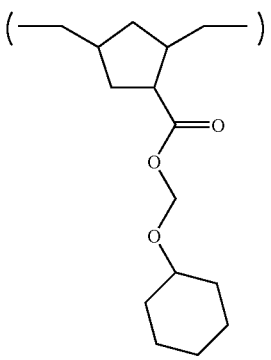 [9-1-9]
[9-1-6]
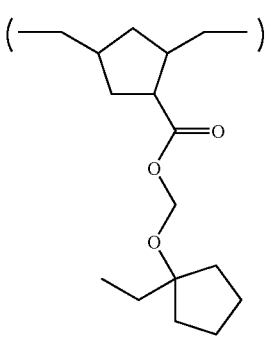 [9-1-10]
[9-1-7]
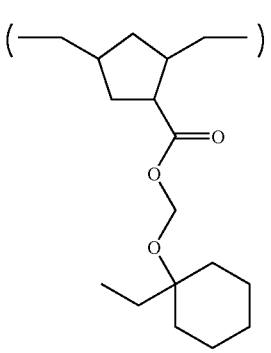 [9-1-11]
[9-1-8]
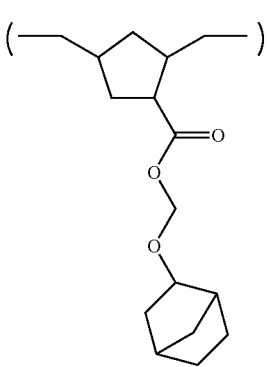 [9-1-12]

[9-1-13]
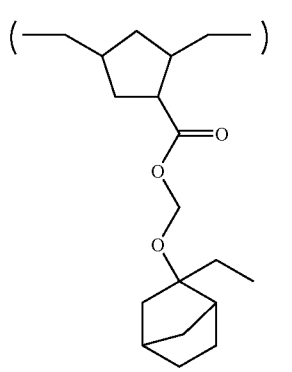
[9-1-14]
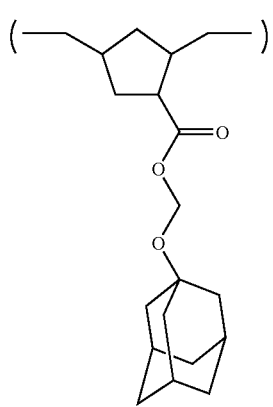
[9-1-15]
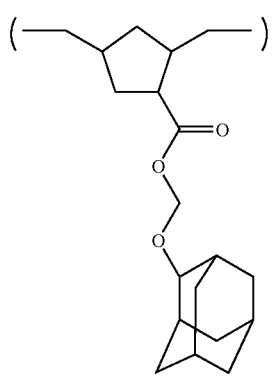
[9-1-16]
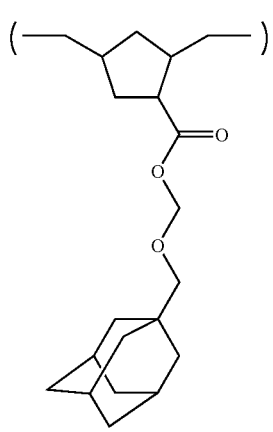
[9-1-17]
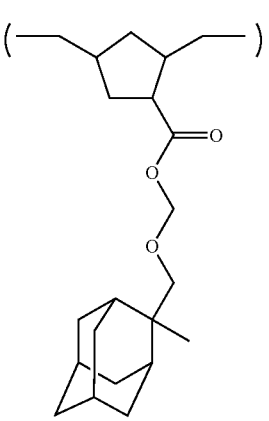
[9-1-18]
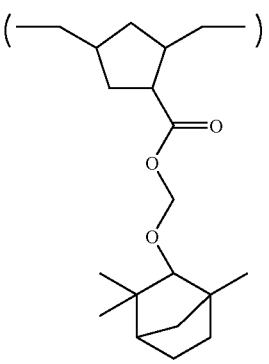
[9-1-19]
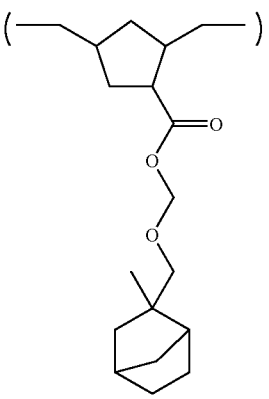
[9-1-20]
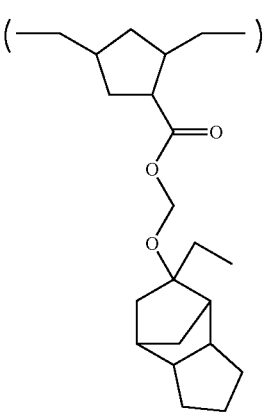

[9-1-21] 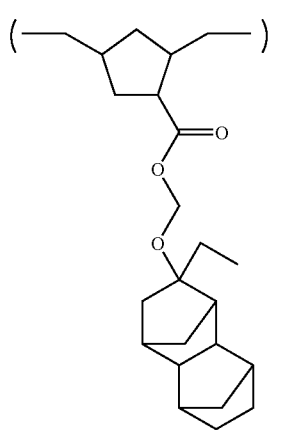
[9-1-22] 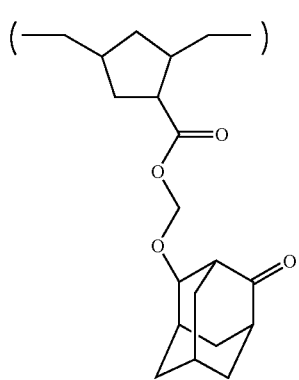
[9-1-23] 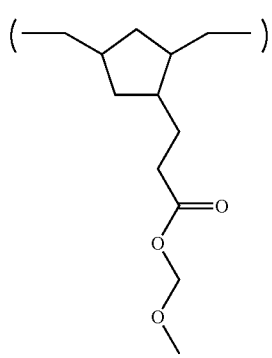
[9-1-24] 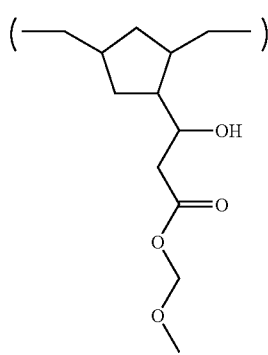
[9-1-25] 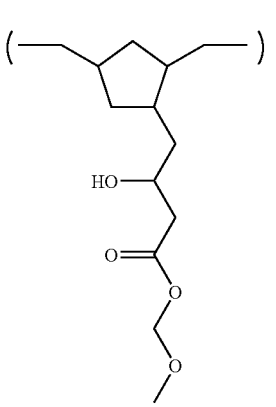
[9-1-26] 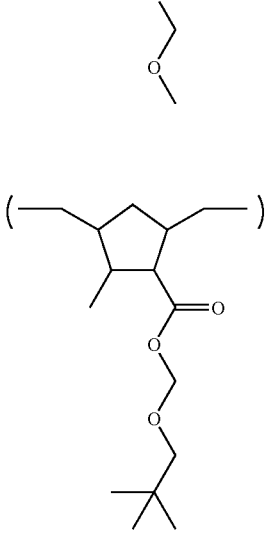
[9-1-27] 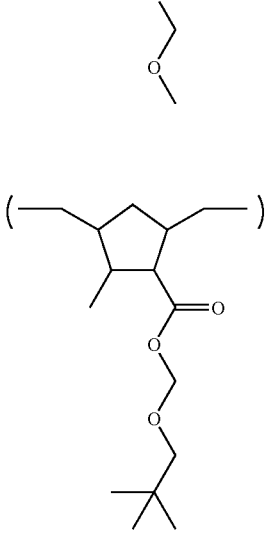
[9-1-28] 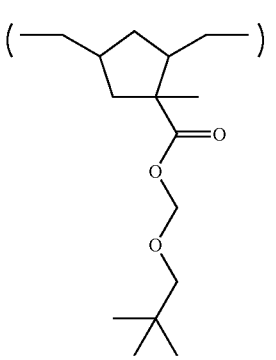

[9-1-29]
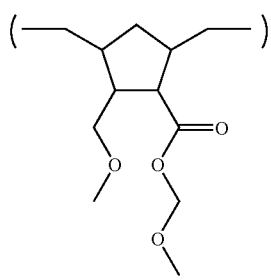
[9-1-30]
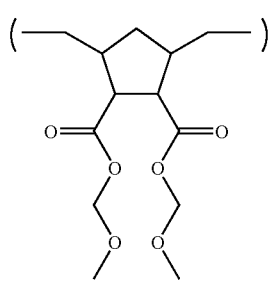
[9-1-31]
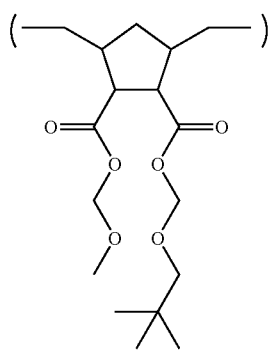
[9-1-32]
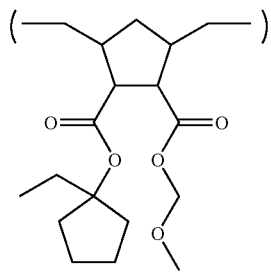
[9-2-1]
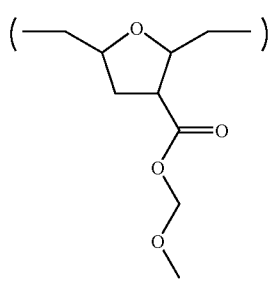
[9-2-2]
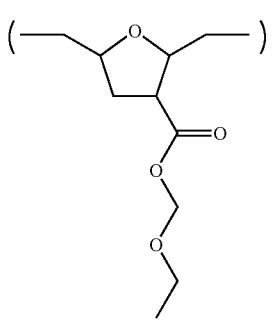
[9-2-3]
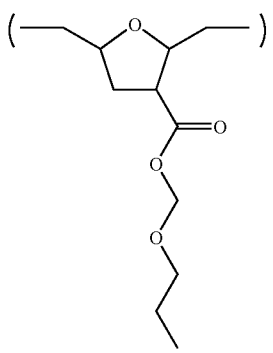
[9-2-4]
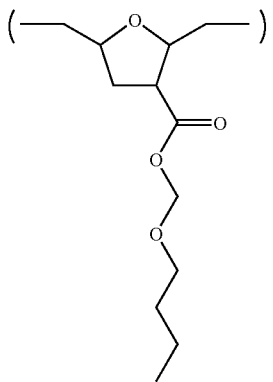
[9-2-5]
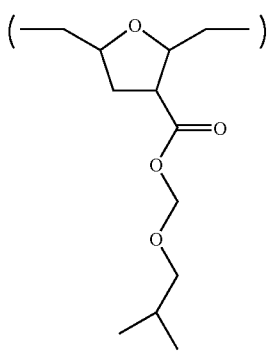

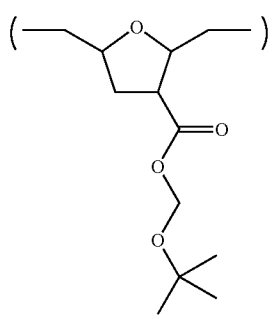 [9-2-6]
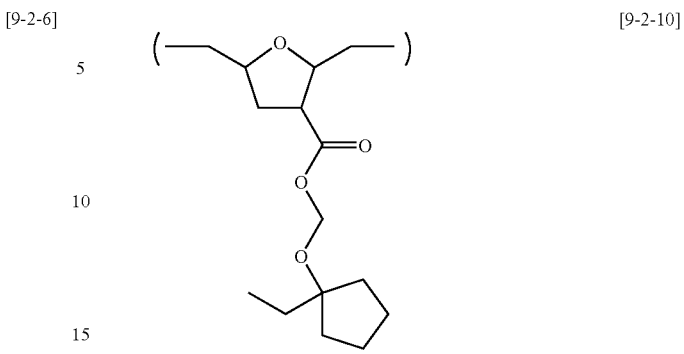 [9-2-10]
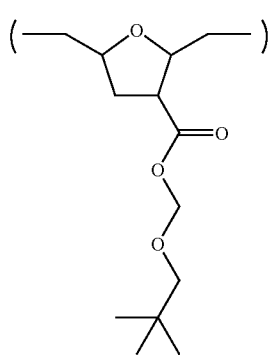 [9-2-7]
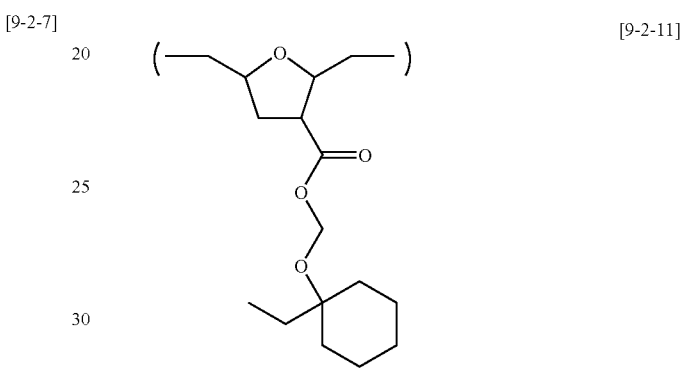 [9-2-11]
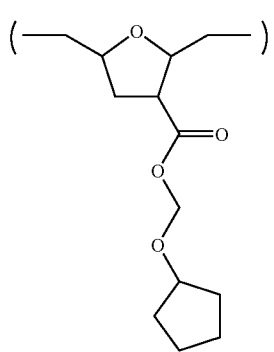 [9-2-8]
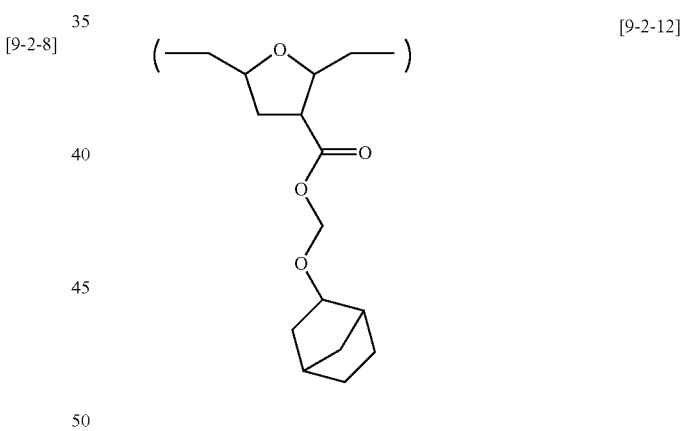 [9-2-12]
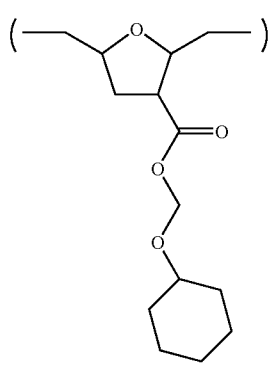 [9-2-9]
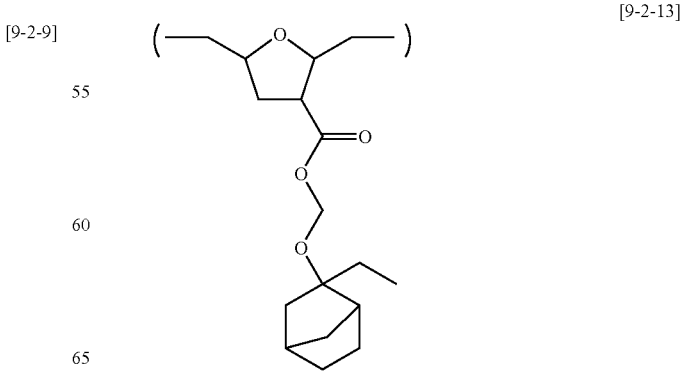 [9-2-13]

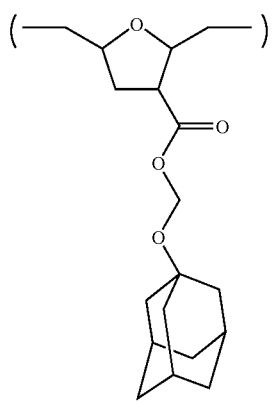
[9-2-14]
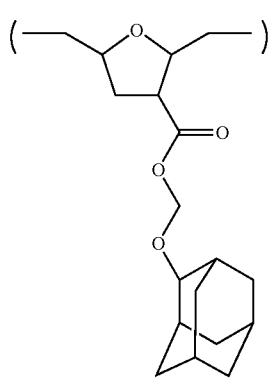
[9-2-15]
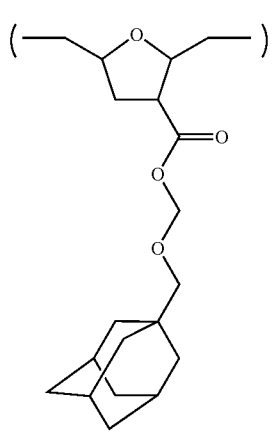
[9-2-16]
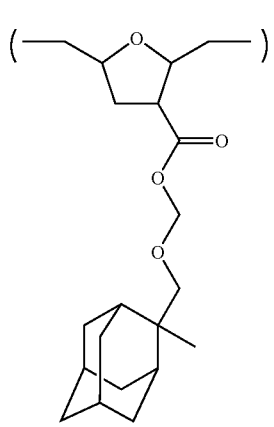
[9-2-17]
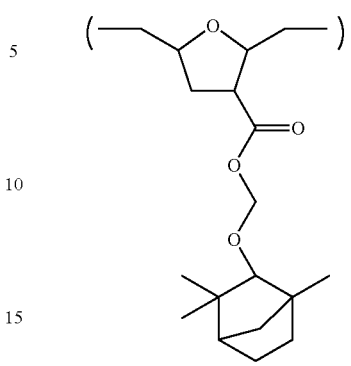
[9-2-18]
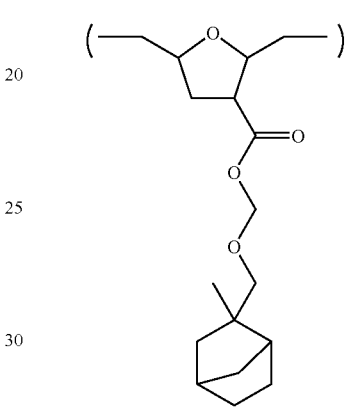
[9-2-19]
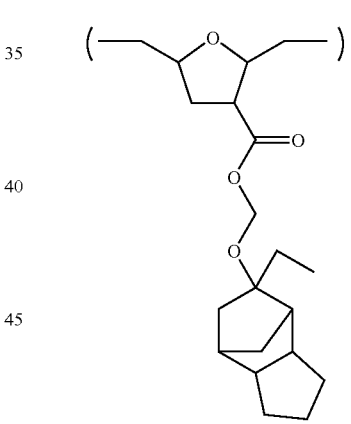
[9-2-20]
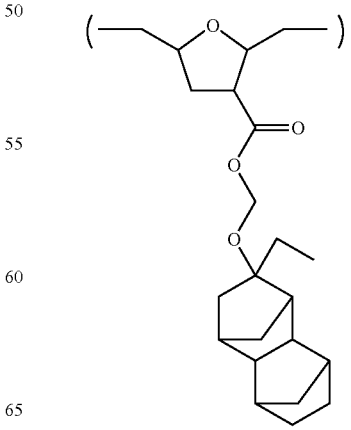
[9-2-21]

[9-2-22]
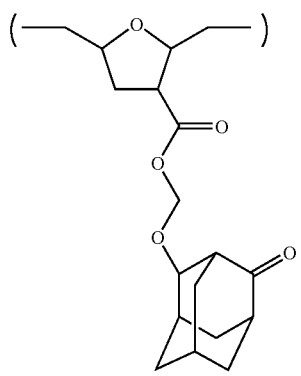
[9-2-23]
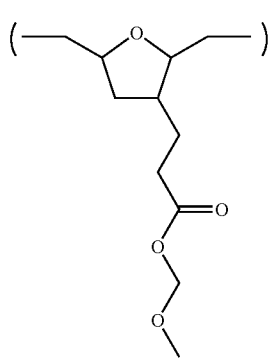
[9-2-24]
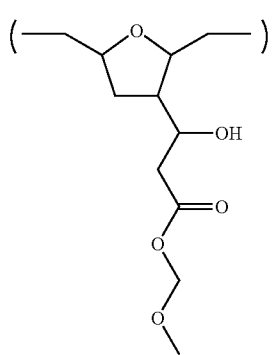
[9-2-25]
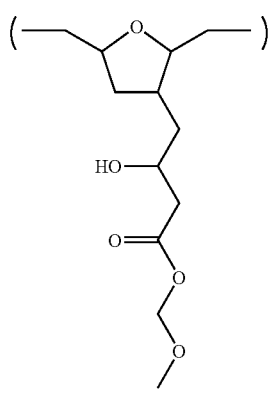
[9-2-26]
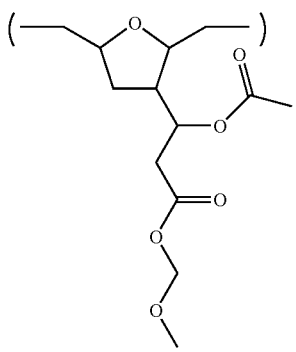
[9-2-27]
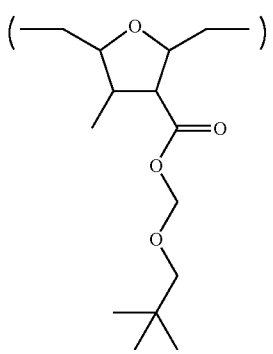
[9-2-28]
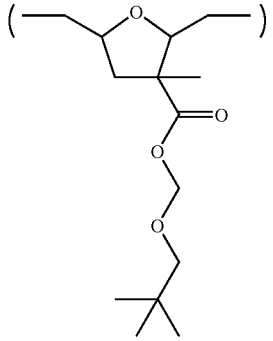
[9-2-29]
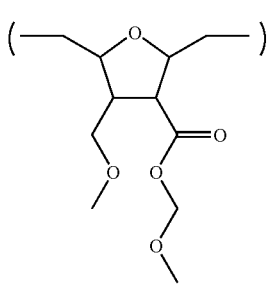
[9-2-30]
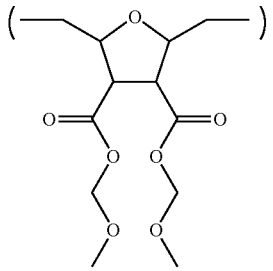

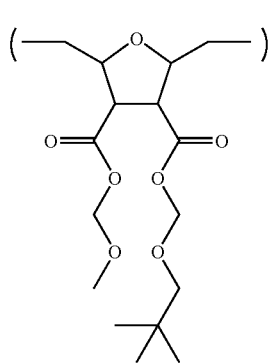
[9-2-31]
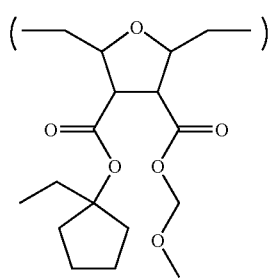
[9-2-32]
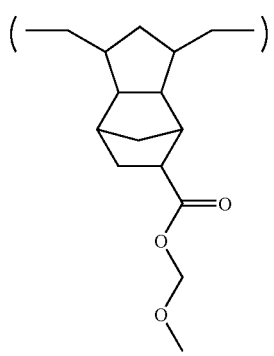
[9-3-1]
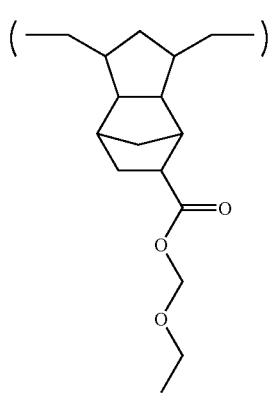
[9-3-2]
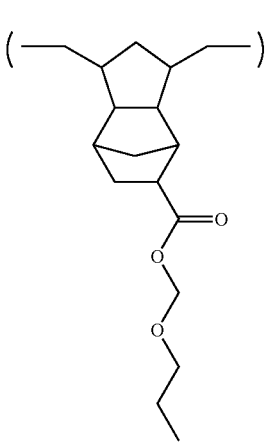
[9-3-3]
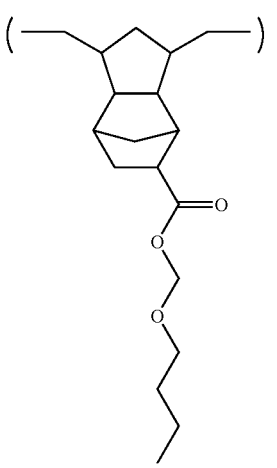
[9-3-4]
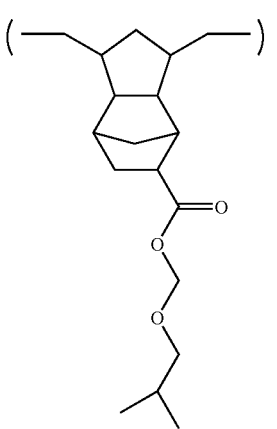
[9-3-5]

[9-3-6]
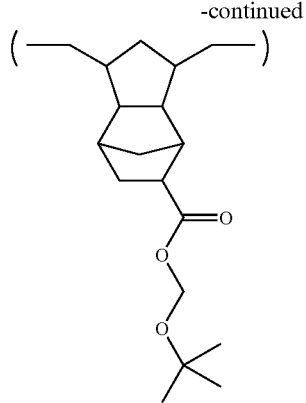
[9-3-7]
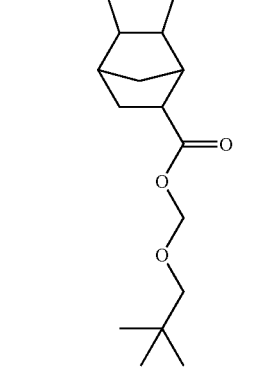
[9-3-8]
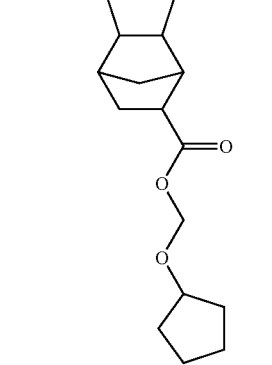
[9-3-9]
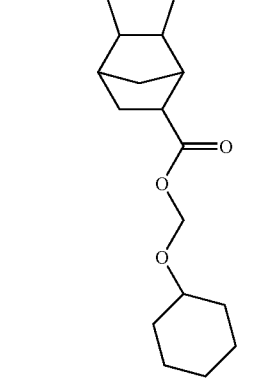
[9-3-10]
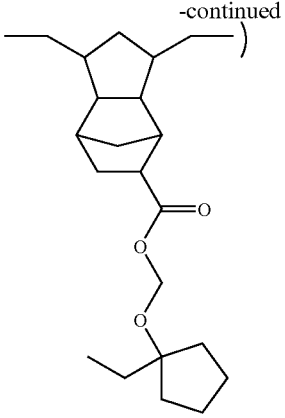
[9-3-11]
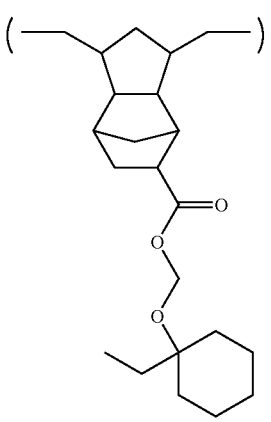
[9-3-12]
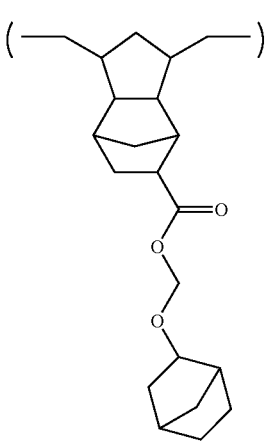

-continued
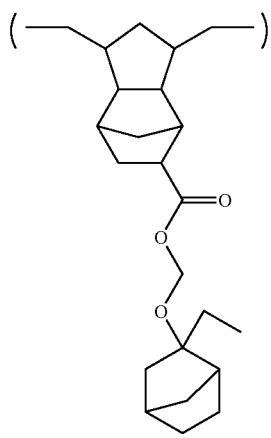
[9-3-13]
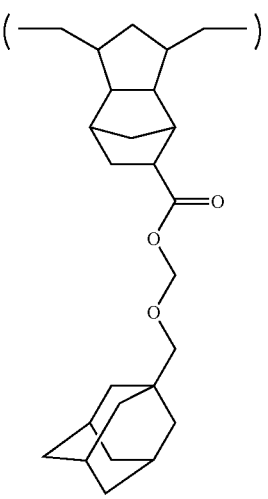
[9-3-16]
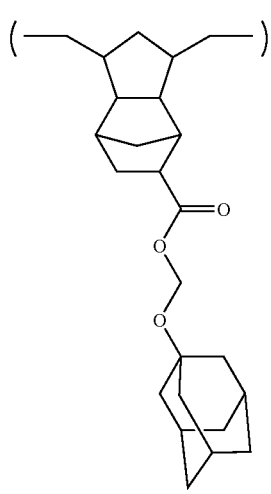
[9-3-14]
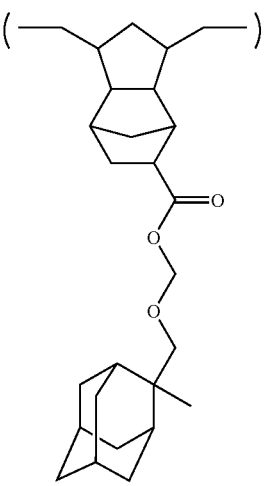
[9-3-17]
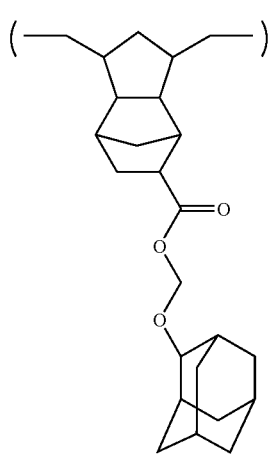
[9-3-15]
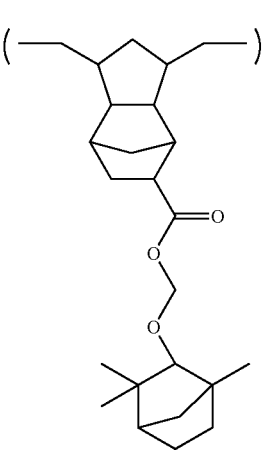
[9-3-18]

[9-3-19]
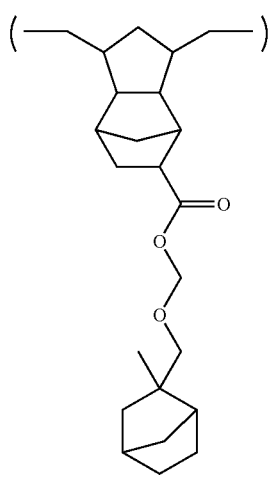
[9-3-20]
[9-3-21]
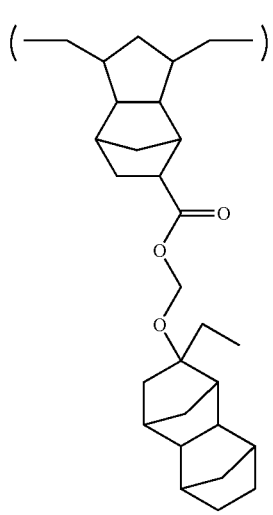
[9-3-22]
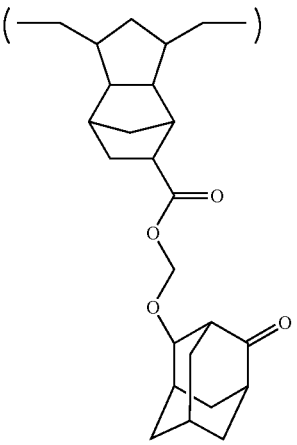
[9-3-23]
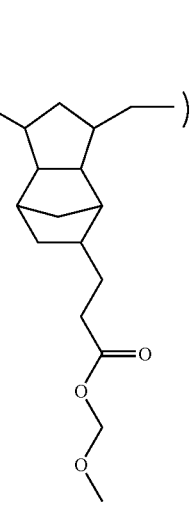
[9-3-24]
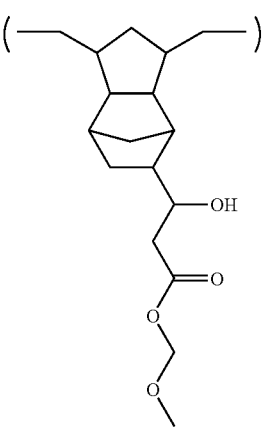

[9-3-25]
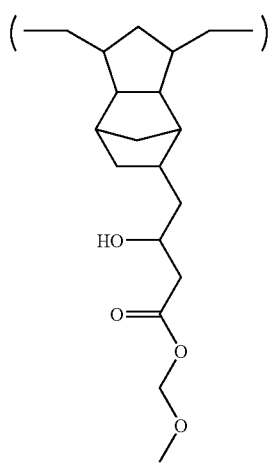
[9-3-26]
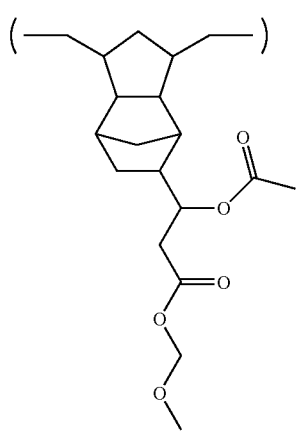
[9-3-27]
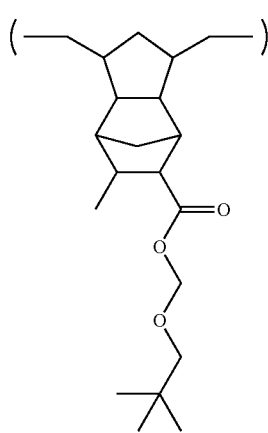
[9-3-28]
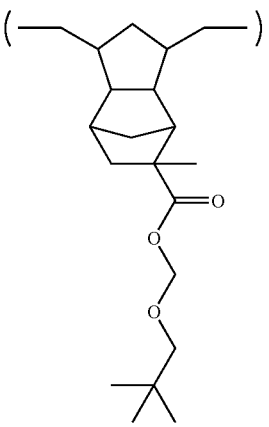
[9-3-29]
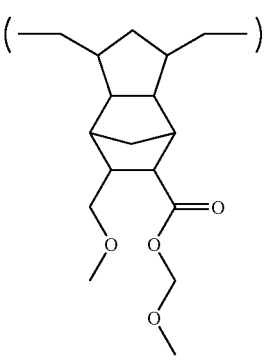
[9-3-30]
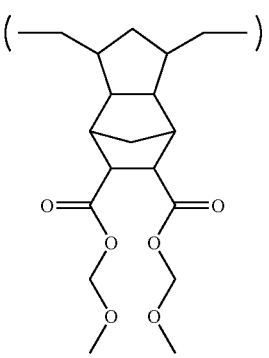
[9-3-31]
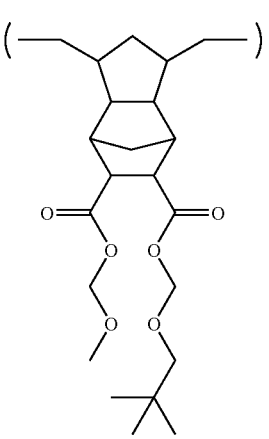

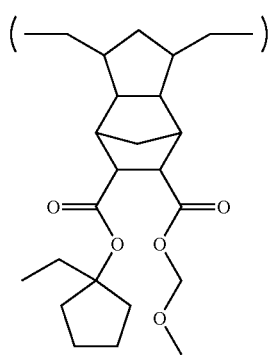
[9-3-32]
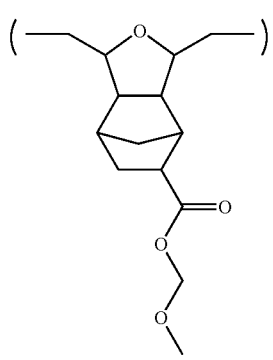
[9-4-1]
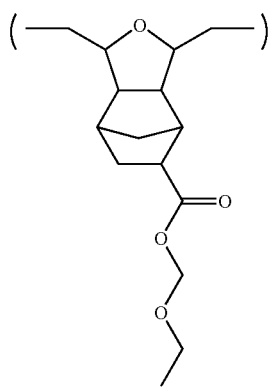
[9-4-2]
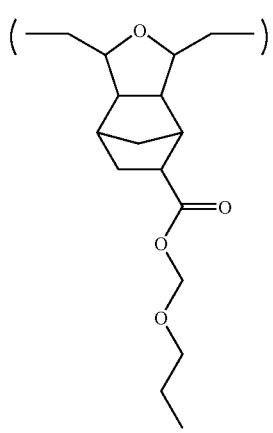
[9-4-3]
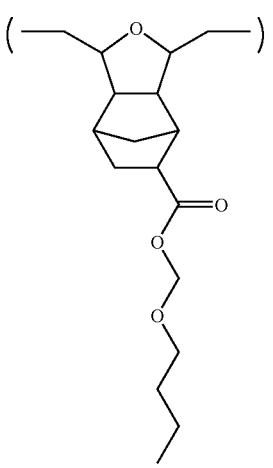
[9-4-4]
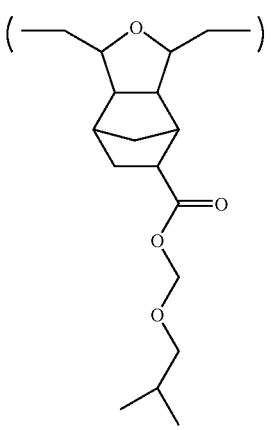
[9-4-5]
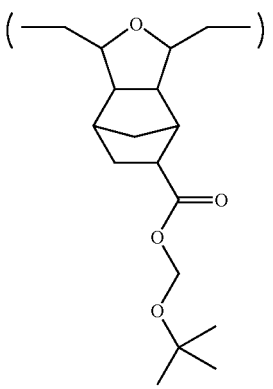
[9-4-6]

[9-4-7]
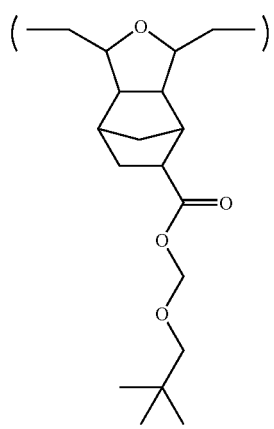
[9-4-8]
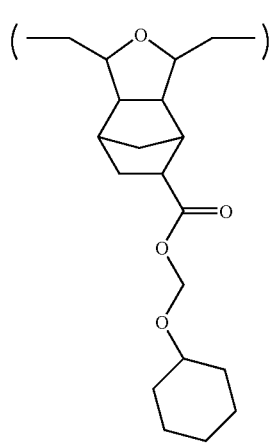
[9-4-9]
[9-4-10]
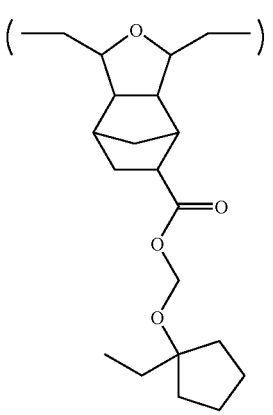
[9-4-11]
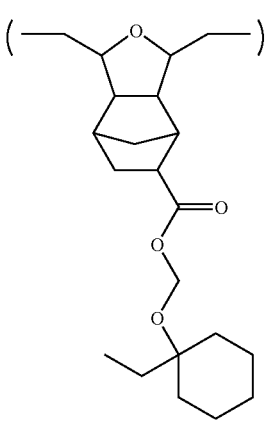
[9-4-12]
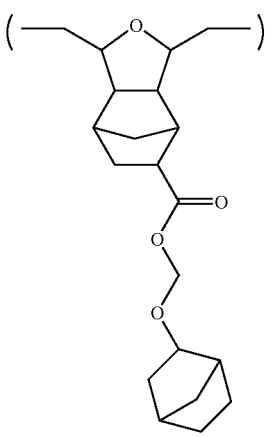

[9-4-13]
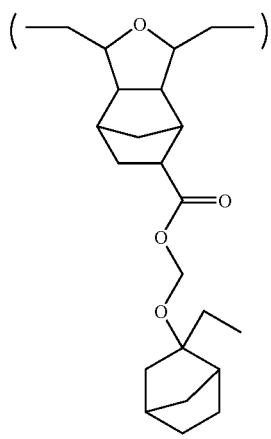
[9-4-16]
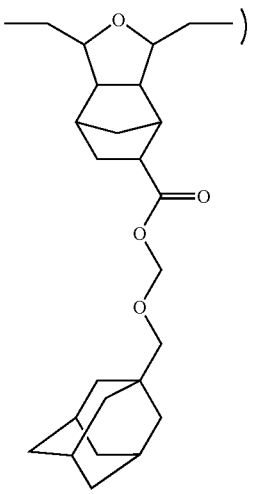
[9-4-14]
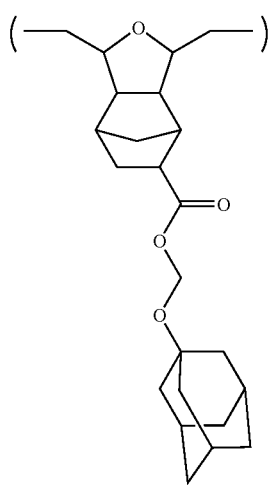
[9-4-17]
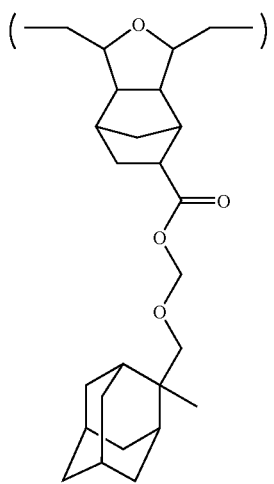
[9-4-15]
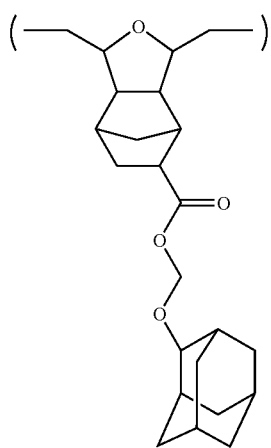
[9-4-18]
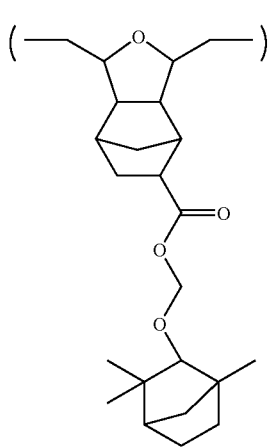

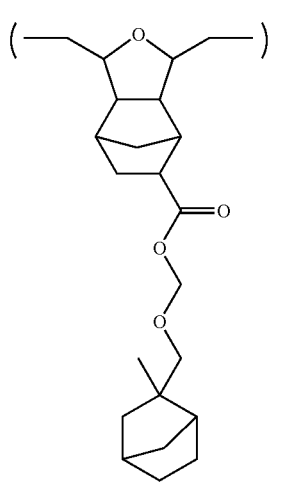
[9-4-19]
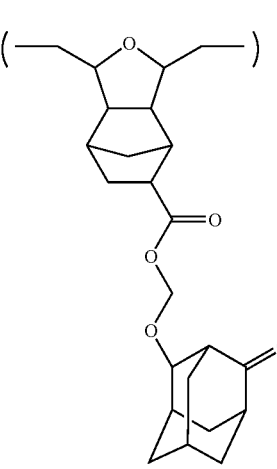
[9-4-22]
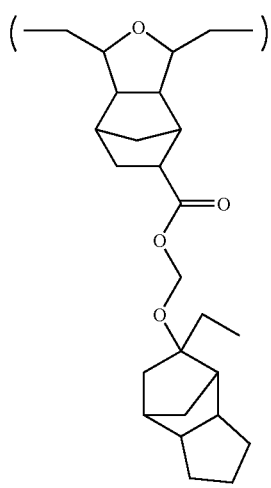
[9-4-20]
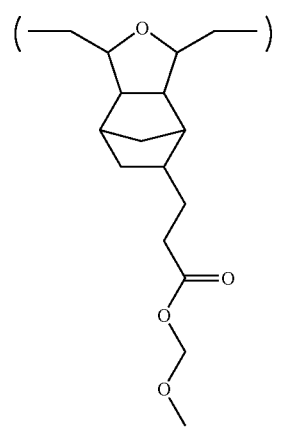
[9-4-23]
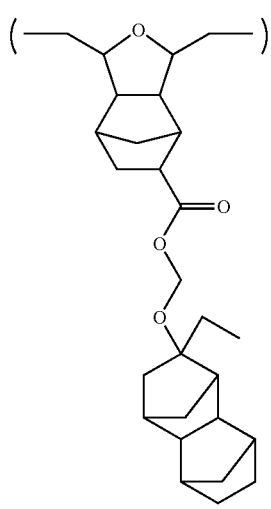
[9-4-21]
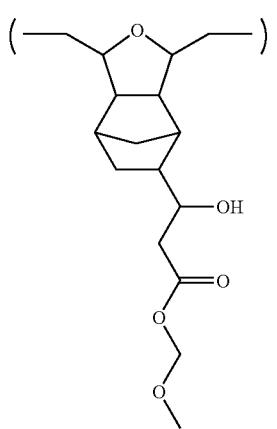
[9-4-24]

-continued
[9-4-25]
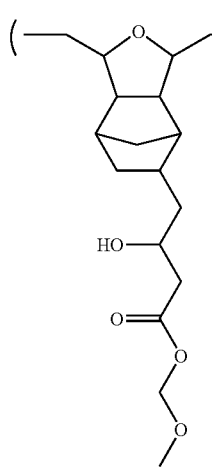
[9-4-26]
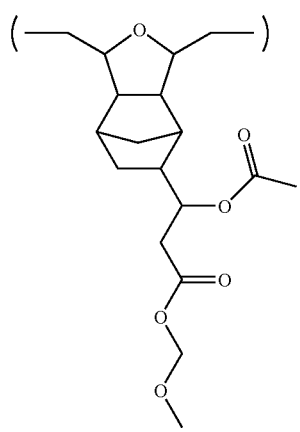
[9-4-27]
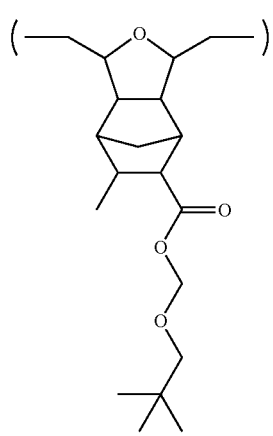
-continued
[9-4-28]
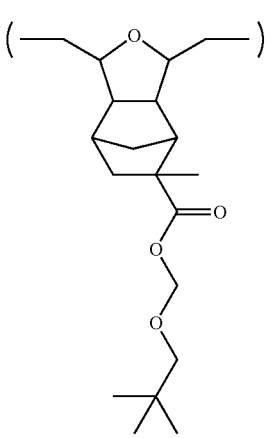
[9-4-29]
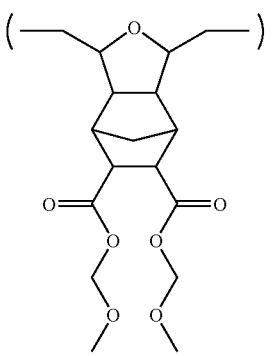
[9-4-30]
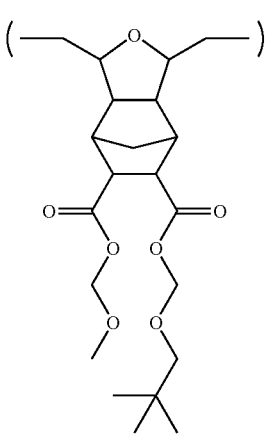
[9-4-31]

-continued

[9-4-32]

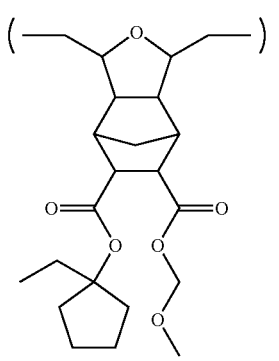

As described above, for a certain compound represented by a general formula, there can exist enantiomers or diastereomers. In such a case, one stereostructural formula collectively represents all such stereoisomers. Such stereoisomers may be used alone or in admixture.

For example, the formula [9-1-20] includes the following partial structure [10-10]:

[10-10]

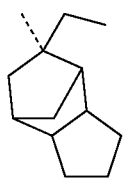

which collectively represents one or a mixture of two selected from groups of [10-10-1] and [10-10-2].

[10-10-1]

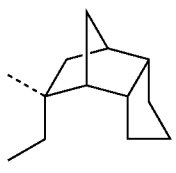

[10-10-2]

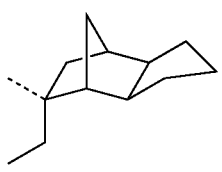

Similarly, the formula [9-1-21] includes the following partial structure [10-11]:

[10-11]

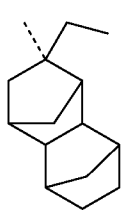

which collectively represents one or a mixture of two or more selected from groups of [10-11-1] to [10-11-4].

[10-11-1]

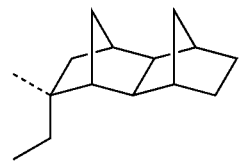

[10-11-2]

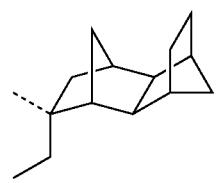

[10-11-3]

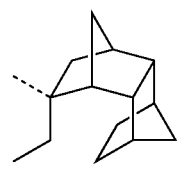

[10-11-4]

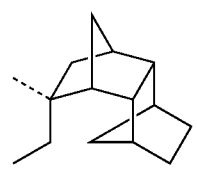

Furthermore, each of the above partial structures [10-10-1], [10-10-2], [10-11-1] to [10-11-4] collectively represents a corresponding enantiomer and a mixture of enantiomers.

The structural units [B] have the general formula [3].

[3]

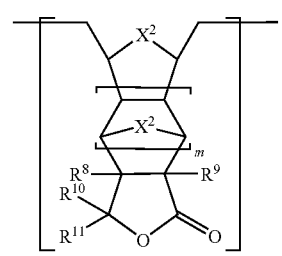

In formula [3], $R^8$ to $R^{11}$ are each independently hydrogen or a straight, branched or cyclic $C_1$-$C_{10}$ alkyl group such as methyl, ethyl, n-propyl, isopropyl, n-butyl, tert-butyl, cyclohexyl or menthyl. $X^2$ which may be the same or different is —O— or —$CR^{12}_2$— wherein $R^{12}$ is hydrogen or a straight or branched $C_1$-$C_{10}$ alkyl group. The subscript m is 0 or an integer of 1 to 3. When m is 1 to 3, $X^2$ may be the same or different. Exemplary of $R^{12}$ are hydrogen or straight or branched $C_1$-$C_{10}$ alkyl groups such as methyl, ethyl, n-propyl, isopropyl, n-butyl and tert-butyl. Preferably $X^2$ is —O— or —$CH_2$—. More preferably all $X^2$ groups are either —O— or —$CH_2$—. Preferably m is 0 or 1.

Illustrative examples of the structural units [B] of formula [3] include structural units of the following chemical formulas [11-1] to [11-16].

[11-1] 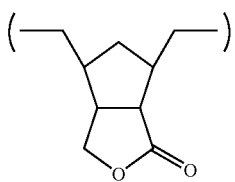
[11-2] 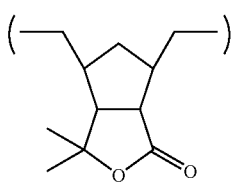
[11-3] 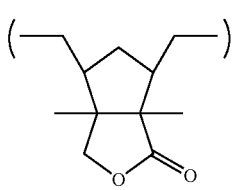
[11-4] 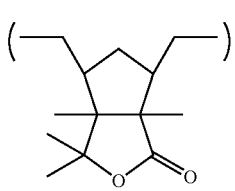
[11-5] 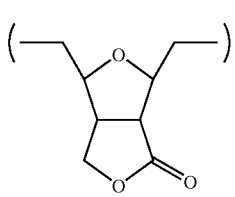
[11-6] 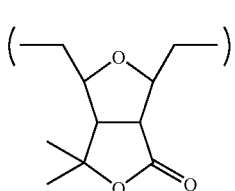
[11-7] 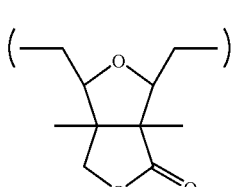
[11-8] 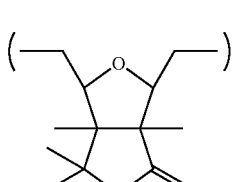
-continued
[11-9] 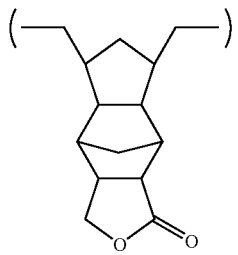
[11-10] 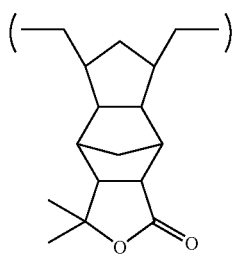
[11-11] 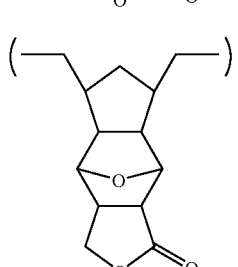
[11-12] 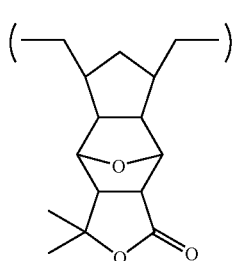
[11-13] 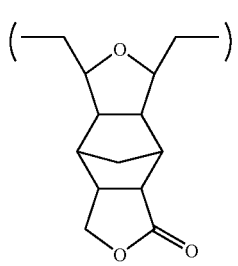
[11-14] 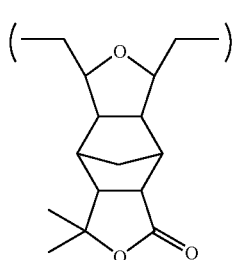

-continued

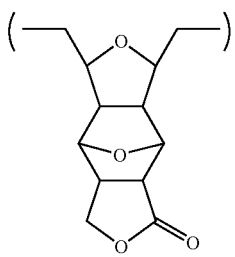
[11-15]

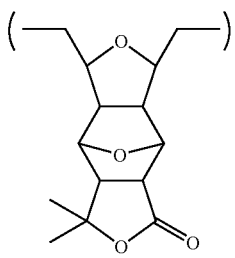
[11-16]

The structural units [C] have the general formula [4].

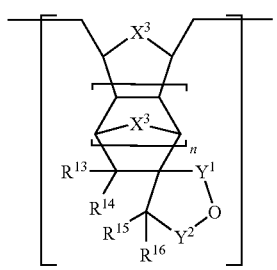
[4]

In formula [4], $R^{13}$ to $R^{16}$ are each independently hydrogen or a straight, branched or cyclic $C_1$-$C_{10}$ alkyl group such as methyl, ethyl, n-propyl, isopropyl, n-butyl, tert-butyl, cyclohexyl or menthyl. $X^3$ which may be the same or different is —O— or —$CR^{17}_2$— wherein $R^{17}$ is hydrogen or a straight or branched $C_1$-$C_{10}$ alkyl group, and n is 0 or an integer of 1 to 3. When n is 1 to 3, $X^3$ may be the same or different. Exemplary of $R^{17}$ are hydrogen or straight or branched $C_1$-$C_{10}$ alkyl groups such as methyl, ethyl, n-propyl, isopropyl, n-butyl and tert-butyl. Preferably $X^3$ is —O— or —$CH_2$—. More preferably all $X^3$ groups are either —O— or —$CH_2$—. One of $Y^1$ and $Y^2$ is —(C=O)— and the other is —$CR^{18}_2$— wherein $R^{18}$ is hydrogen or a straight or branched $C_1$-$C_{10}$ alkyl group. Exemplary of $R^{18}$ are hydrogen or straight or branched $C_1$-$C_{10}$ alkyl groups such as methyl, ethyl, n-propyl, isopropyl, n-butyl and tert-butyl. Preferably, one of $Y^1$ and $Y^2$ is —(C=O)— and the other is —$CH_2$—. Preferably n is 0 or 1.

Illustrative examples of the structural units [C] of formula [4] include structural units of the following chemical formulas [12-1] to [12-16].

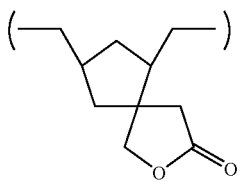
[12-1]

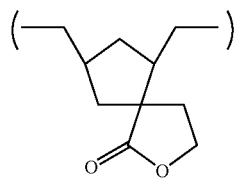
[12-2]

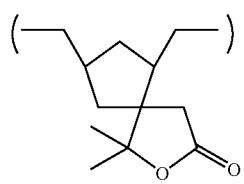
[12-3]

[12-4]

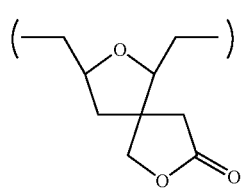
[12-5]

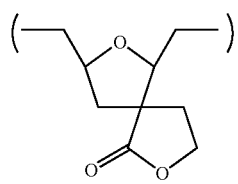
[12-6]

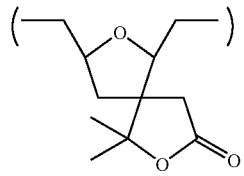
[12-7]

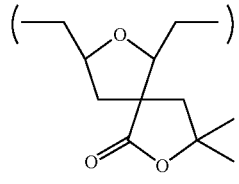
[12-8]

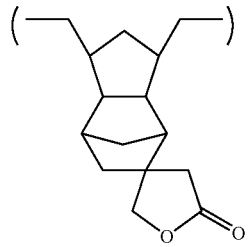
[12-9]

[12-10] 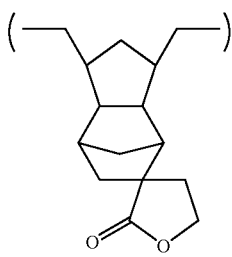

[12-11] 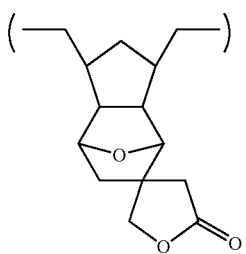

[12-12] 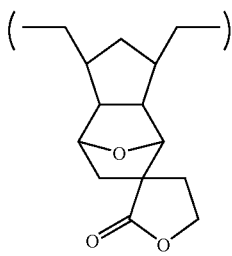

[12-13] 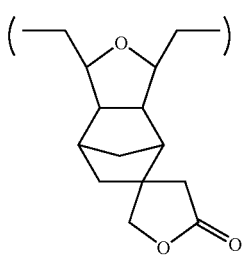

[12-14] 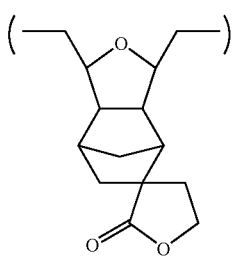

[12-15] 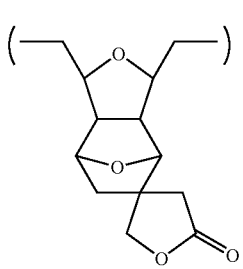

[12-16] 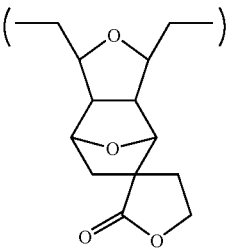

In the hydrogenated product of a ring-opening metathesis polymer used herein, at least one of $X^1$ in formula [1] representative of structural units [A], $X^2$ in formula [3] representative of structural units [B], and $X^3$ in formula [4] representative of structural units [C] should preferably be —O—. The inclusion of an oxygen atom in the backbone-forming alicyclic compound is not only effective for improving the adhesion of the polymer to silicon or other substrates to be coated therewith, wetting tension upon development with an aqueous alkaline solution, and the solubility of the polymer in polar organic solvents used in the step of applying the resist composition to silicon wafers, such as ketones and alcohols, but also effective for improving affinity to water and development with a stripping agent (or developer) such as an aqueous alkaline solution following exposure. In a preferred embodiment, at least one of $X^1$ in formula [1] representative of structural units [A], $X^2$ in formula [3] representative of structural units [B], and $X^3$ in formula [4] representative of structural units [C] is —O— and the remainders are —CH$_2$—. The amount of —O— units is 0 to 99 mol %, preferably 2 to 95 mol %, more preferably 5 to 80 mol %, and most preferably 10 to 70 mol %, based on the total of $X^1$, $X^2$ and $X^3$ units.

In the polymer of the invention, the molar ratio of structural units [A] of formula [1] to the sum of structural units [B] of formula [3] and structural units [C] of formula [4], that is, [A]/([B]+[C]) is from 1/99 to 100/0. Namely, the inclusion of at least structural units [A] is essential.

The structural units [A] contain alkoxymethyl ester-bearing functional groups represented by formula (2), namely groups which are decomposable with the acid generated by a photosensitive agent upon exposure, to produce carboxylic acid, and are thus necessary to form a resist pattern by development with an aqueous alkaline solution following exposure. The structural units [A] having a functional group of formula [2] in which carboxylic acid is protected with a specific alkoxymethyl group are able to react with the acid generated by the photosensitive agent and generate carboxylic acid. The polymer comprising structural units [A] is improved in maximum resolution and reduced in proximity bias. When a pattern is lithographically formed using a resist material, the term "maximum resolution" refers to the minimum pattern size which can be resolved. When an isolated pattern having features of the same size at wide intervals and a grouped pattern having features of the same size at narrow intervals are resolved, the term "proximity bias" refers to the difference of feature size between the isolated and grouped patterns as actually formed. A resist material having both reduced maximum resolution and proximity bias allows for pattern formation at a high resolution independent of the mask pattern.

The structural units [B] and/or [C] are necessary to provide adhesion to silicon or other substrates to be coated. When the constitutional molar ratio [A]/([B]+[C]) is from 1/99 to 100/0, hydrogenated ring-opening metathesis polymers having improved maximum resolution, reduced proximity bias and improved adhesion to substrates are obtained. Preferably the polymers are formulated so as to meet a molar ratio [A]/([B]+[C]) from 10/90 to 90/10, and more preferably from 20/80 to 80/20.

In the hydrogenated ring-opening metathesis polymers, each of the structural units [A], [B] and [C] may be of one type, or any or all of them may be a mixture of two or more types. For instance, hydrogenated products of ring-opening metathesis polymers are included in which the structural units [A] are comprised of structural units [A-1-1] and [A-1-2] of the following general formulas [1-1] and [1-2], respectively, the structural units [B] are comprised of structural units [B-3-1] and [B-3-2] of the following general formulas [3-1] and [3-2], respectively, and the structural units [C] are comprised of structural units [C-4-1] and [C-4-2] of the following general formulas [4-1] and [4-2], respectively.

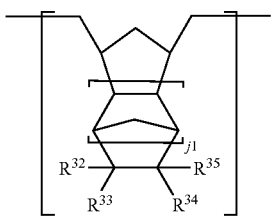

[1-1]

In formula [1-1], at least one of $R^{32}$ to $R^{35}$ is a functional group having alkoxymethyl ester represented by the general formula (2), and the remainders are each independently selected from among hydrogen, straight, branched or cyclic $C_1$-$C_{20}$ alkyl, halogen, straight, branched or cyclic $C_1$-$C_{20}$ haloalkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkylcarbonyloxy, $C_7$-$C_{20}$ arylcarbonyloxy, straight, branched or cyclic $C_1$-$C_{20}$ alkylsulfonyloxy, $C_6$-$C_{20}$ arylsulfonyloxy, straight, branched or cyclic $C_2$-$C_{20}$ alkoxycarbonyl, and straight, branched or cyclic $C_3$-$C_{20}$ alkoxycarbonylalkyl, and j1 is 0 or an integer of 1 to 3.

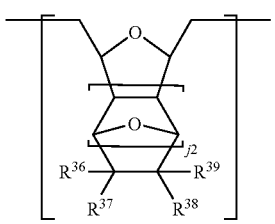

[1-2]

In formula [1-2], at least one of $R^{36}$ to $R^{39}$ is a functional group having alkoxymethyl ester represented by the general formula (2), and the remainders are each independently selected from among hydrogen, straight, branched or cyclic $C_1$-$C_{20}$ alkyl, halogen, straight, branched or cyclic $C_1$-$C_{20}$ haloalkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkylcarbonyloxy, $C_7$-$C_{20}$ arylcarbonyloxy, straight, branched or cyclic $C_1$-$C_{20}$ alkylsulfonyloxy, $C_6$-$C_{20}$ arylsulfonyloxy, straight, branched or cyclic $C_2$-$C_{20}$ alkoxycarbonyl, and straight, branched or cyclic $C_3$-$C_{20}$ alkoxycarbonylalkyl, and j2 is 0 or an integer of 1 to 3.

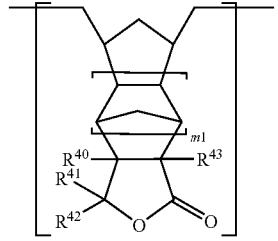

[3-1]

In formula [3-1], $R^{40}$ to $R^{43}$ are each independently selected from hydrogen and straight, branched or cyclic $C_1$-$C_{10}$ alkyl, and m1 is 0 or an integer of 1 to 3.

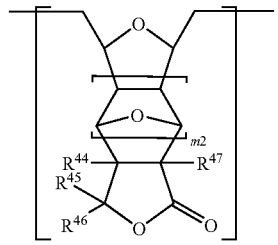

[3-2]

In formula [3-2], $R^{44}$ to $R^{47}$ are each independently selected from hydrogen and straight, branched or cyclic $C_1$-$C_{10}$ alkyl, and m2 is 0 or an integer of 1 to 3.

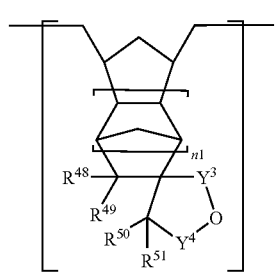

[4-1]

In formula [4-1], $R^{48}$ to $R^{51}$ are each independently selected from hydrogen and straight, branched or cyclic $C_1$-$C_{10}$ alkyl, one of $Y^3$ and $Y^4$ is —(C═O)— and the other is —CH$_2$—, and n1 is 0 or an integer of 1 to 3.

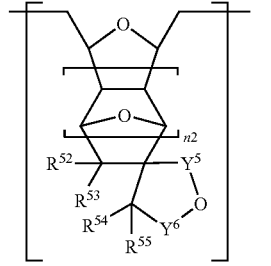

[4-2]

In formula [4-2], $R^{52}$ to $R^{55}$ are each independently selected from hydrogen and straight, branched or cyclic $C_1$-$C_{10}$ alkyl, one of $Y^5$ and $Y^6$ is —(C═O)— and the other is —CH$_2$—, and n2 is 0 or an integer of 1 to 3.

In another preferred embodiment, the hydrogenated ring-opening metathesis polymers may contain, in addition to the structural units [A] and [B] and/or [C], structural units [D] of the following general formula [5].

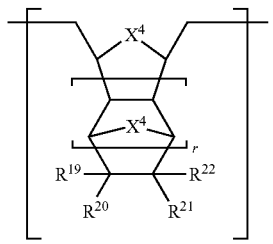

[5]

Herein at least one of $R^{19}$ to $R^{22}$ is an ester-bearing functional group having the general formula [6]:

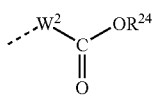

[6]

wherein the broken line denotes a valence bond, $W^2$ is a single bond, a divalent $C_1$-$C_{10}$ hydrocarbon group, or a divalent $C_1$-$C_{10}$ hydrocarbon group in which one hydrogen atom is substituted by —$OR^{23}$. $R^{23}$ is hydrogen, a straight, branched or cyclic $C_1$-$C_{10}$ alkyl group, a straight, branched or cyclic $C_2$-$C_{10}$ alkoxyalkyl group, or a straight, branched or cyclic $C_1$-$C_{10}$ acyl group. $R^{24}$ is a straight, branched or cyclic $C_1$-$C_{20}$ alkyl group or a straight, branched or cyclic $C_1$-$C_{20}$ haloalkyl group. The remainders of $R^{19}$ to $R^{22}$ are each independently selected from the group consisting of hydrogen, a straight, branched or cyclic $C_1$-$C_{20}$ alkyl group, halogen, a straight, branched or cyclic $C_1$-$C_{20}$ haloalkyl group, a straight, branched or cyclic $C_1$-$C_{20}$ alkoxy group, a straight, branched or cyclic $C_2$-$C_{20}$ alkoxyalkyl group, a straight, branched or cyclic $C_2$-$C_{20}$ alkylcarbonyloxy group, a $C_7$-$C_{20}$ arylcarbonyloxy group, a straight, branched or cyclic $C_1$-$C_{20}$ alkylsulfonyloxy group, a $C_6$-$C_{20}$ arylsulfonyloxy group, a straight, branched or cyclic $C_2$-$C_{20}$ alkoxycarbonyl group, and a straight, branched or cyclic $C_3$-$C_{20}$ alkoxycarbonylalkyl group. $X^4$ which may be the same or different is —O— or —$CR^{25}_2$— wherein $R^{25}$ is hydrogen or a straight or branched $C_1$-$C_{10}$ alkyl group, and r is 0 or an integer of 1 to 3.

Of the groups represented by $R^{23}$, the straight, branched or cyclic $C_1$-$C_{10}$ alkyl groups include, for example, methyl, ethyl, propyl, isopropyl, n-butyl, isobutyl, tert-butyl, cyclopentyl, cyclohexyl, 1-ethylcyclopentyl and 1-ethylcyclohexyl. Examples of the straight, branched or cyclic $C_2$-$C_{10}$ alkoxyalkyl group include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl. Examples of the straight, branched or cyclic $C_1$-$C_{10}$ acyl group include formyl, acetyl, pivaloyl and cyclohexylcarbonyl. Of these $R^{23}$ groups, preferred are hydrogen, straight or branched $C_1$-$C_6$ alkyl, straight, branched or cyclic $C_2$-$C_7$ alkoxyalkyl, and straight or branched $C_2$-$C_7$ acyl. Most preferred are hydrogen, methyl, ethyl, methoxymethyl, 1-ethoxyethyl, tetrahydrofuran-2-yl, and acetyl.

Of the groups represented by $R^{24}$, examples of the straight, branched or cyclic $C_1$-$C_{20}$ alkyl group include methyl, ethyl, propyl, isopropyl, n-butyl, isobutyl, tert-butyl, cyclopentyl, cyclohexyl, 1-methylcyclopentyl, 1-ethylcyclopentyl, 1-methylcyclohexyl, and 1-ethylcyclohexyl. Examples of the straight, branched or cyclic $C_1$-$C_{20}$ haloalkyl group include fluoromethyl, chloromethyl, bromomethyl, difluoromethyl, dichloromethyl, dibromomethyl, trifluoromethyl, trichloromethyl, and tribromomethyl. Notably, $R^{24}$ may be an acid labile group, i.e., a group which is decomposed with the acid generated by a photosensitive agent upon exposure, to generate carboxylic acid. Exemplary of such acid labile groups are some of the above-exemplified groups, specifically tertiary ester groups such as tert-butyl, 1-methylcyclopentyl, 1-ethylcyclopentyl, 1-methylcyclohexyl, and 1-ethylcyclohexyl. Of these $R^{24}$ groups, straight, branched or cyclic $C_1$-$C_{10}$ alkyl groups are preferred. More preferred are methyl, ethyl, propyl, isopropyl, n-butyl, isobutyl, tert-butyl, 1-methylcyclopentyl, and 1-ethylcyclopentyl.

When $W^2$ stands for a single bond, it means that the ester group is directly attached, not via $W^2$. $W^2$ may also be a divalent $C_1$-$C_{10}$ hydrocarbon group, examples of which include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, and 1,4-cyclohexylene. Of these, methylene, ethylidene, ethylene, 1-methylethylene, 2-methylethylene, trimethylene, and 2-methyltrimethylene are preferred. $W^2$ may also be a divalent $C_1$-$C_{10}$ hydrocarbon group in which one hydrogen atom is substituted by —$OR^{23}$, for example, substituted forms of the foregoing hydrocarbon groups having one substituent group —$OR^{23}$ at an arbitrary position and having valence bonds at two positions. Most preferably, $W^2$ is a single bond.

The remainders of $R^{19}$ to $R^{22}$ are each independently selected from among hydrogen; straight, branched or cyclic $C_1$-$C_{20}$ alkyl groups, such as methyl, ethyl, propyl, isopropyl, n-butyl, tert-butyl, cyclohexyl and menthyl; halogen atoms such as chlorine, bromine, iodine and fluorine; straight, branched or cyclic $C_1$-$C_{20}$ haloalkyl groups, such as fluoromethyl, chloromethyl, bromomethyl, difluoromethyl, dichloromethyl, dibromomethyl, trifluoromethyl, trichloromethyl and tribromomethyl; straight, branched or cyclic $C_1$-$C_{20}$ alkoxy groups, such as methoxy, ethoxy, isopropoxy, n-butoxy, tert-butoxy and menthoxy; straight, branched or cyclic $C_2$-$C_{20}$ alkoxyalkyl groups, such as methoxymethyl, methoxyethyl, tert-butoxymethyl, tert-butoxyethyl and cyclohexyloxymethyl; straight, branched or cyclic $C_2$-$C_{20}$ alkylcarbonyloxy groups such as acetoxy; $C_7$-$C_{20}$ arylcarbonyloxy groups such as naphthoyloxy; straight, branched or cyclic $C_1$-$C_{20}$ alkylsulfonyloxy groups such as mesyloxy; $C_6$-$C_{20}$ arylsulfonyloxy groups such as tosyloxy; straight, branched or cyclic $C_2$-$C_{20}$ alkoxycarbonyl groups such as methoxycarbonyl, ethoxycarbonyl, n-propoxycarbonyl, isopropoxycarbonyl, n-butoxycarbonyl, tert-butoxycarbonyl and cyclohexyloxycarbonyl; and straight, branched or cyclic $C_3$-$C_{20}$ alkoxycarbonylalkyl groups such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl and cyclohexyloxycarbonylmethyl. Of these, preferred are hydrogen, straight, branched or cyclic $C_1$-$C_{20}$ alkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkoxycarbonyl, and straight, branched or cyclic $C_3$-$C_{20}$ alkoxycarbonylalkyl. Most preferred are hydrogen, straight or branched $C_1$-$C_{10}$ alkyl, straight or branched $C_2$-$C_{10}$ alkoxycarbonyl, and straight or branched $C_3$-$C_{10}$ alkoxycarbonylalkyl.

$X^4$ is —O— or —$CR^{25}{}_2$— wherein $R^{25}$ is hydrogen or a straight or branched $C_1$-$C_{10}$ alkyl group. The letter r is 0 or an integer of 1 to 3. When r is 1 to 3, $X^4$ may be the same or different. Exemplary of $R^{25}$ are hydrogen or straight or branched $C_1$-$C_{10}$ alkyl groups such as methyl, ethyl, n-propyl, isopropyl, n-butyl and tert-butyl. Preferably $X^4$ is —O— or —$CH_2$—. More preferably all $X^4$ groups are either —O— or —$CH_2$—. Preferably r is 0 or 1.

Illustrative examples of the structural units [D] of formula [5] include structural units of the following chemical formulas [13-1-1] to [13-4-18].

[13-1-1]

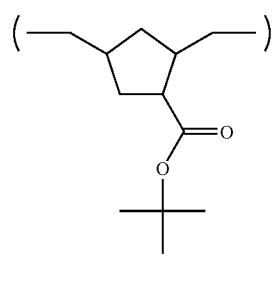

[13-1-2]

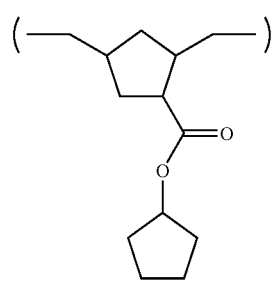

[13-1-3]

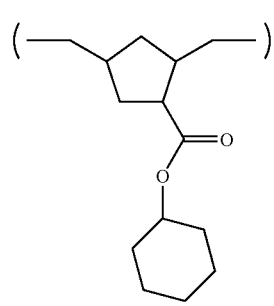

[13-1-4]

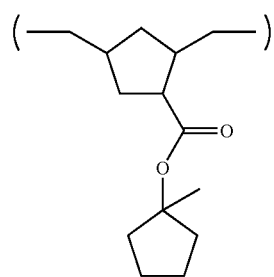

-continued

[13-1-5]

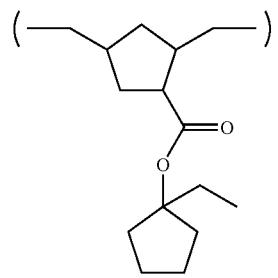

[13-1-6]

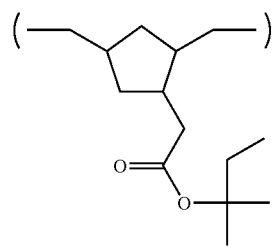

[13-1-7]

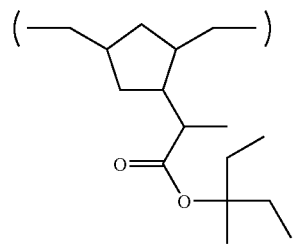

[13-1-8]

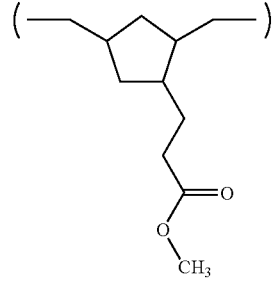

[13-1-9]

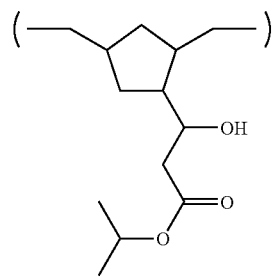

[13-1-10]

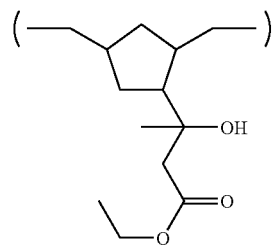

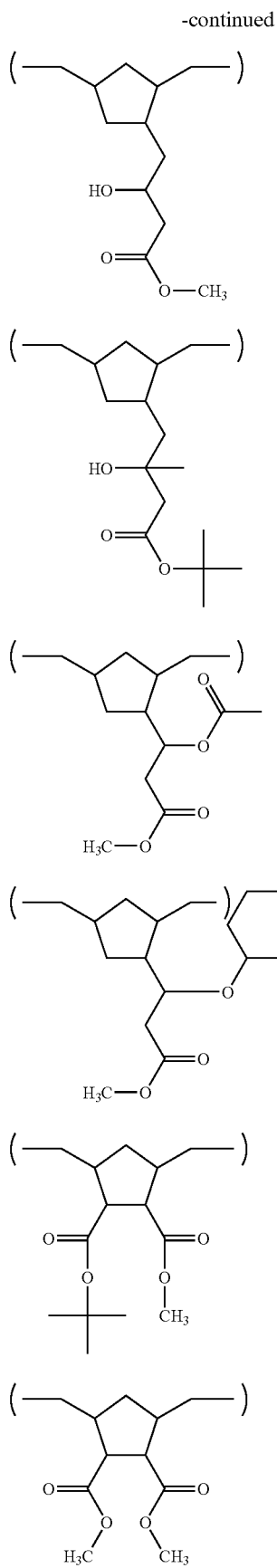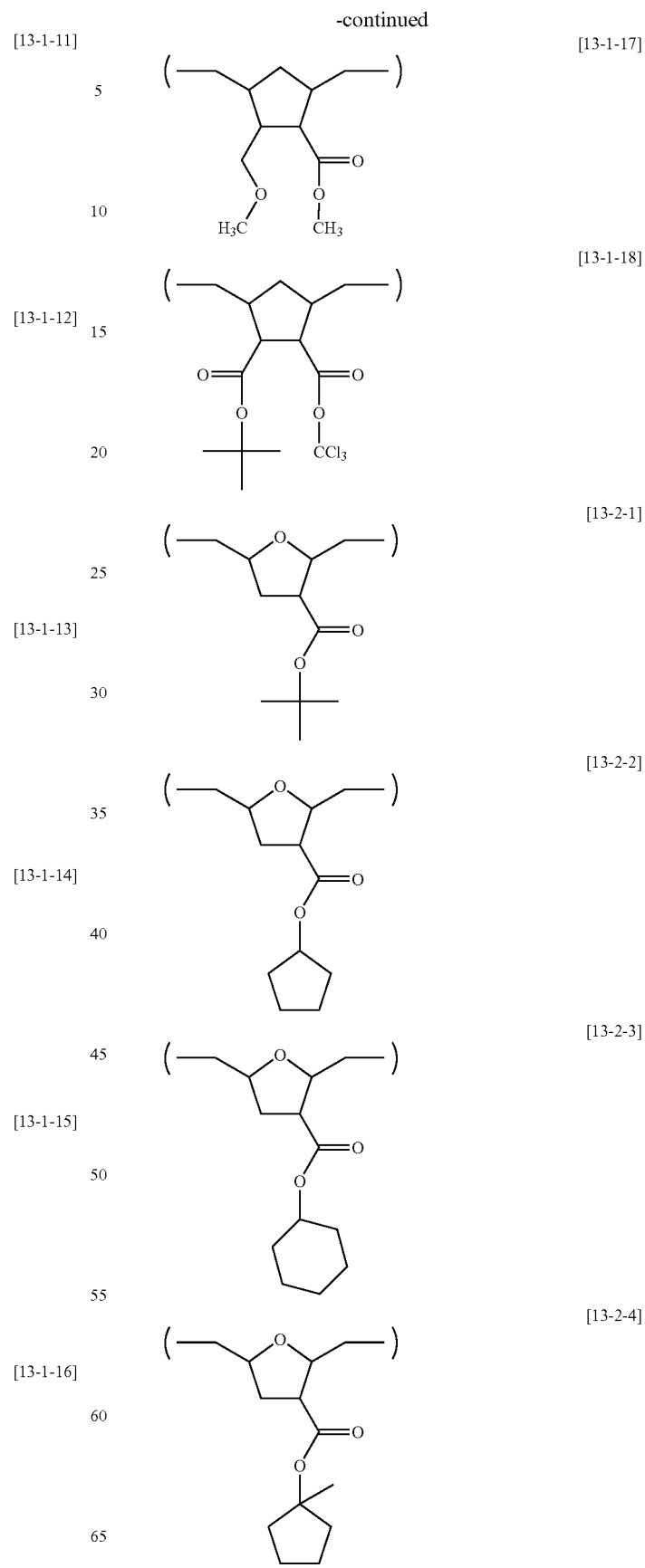

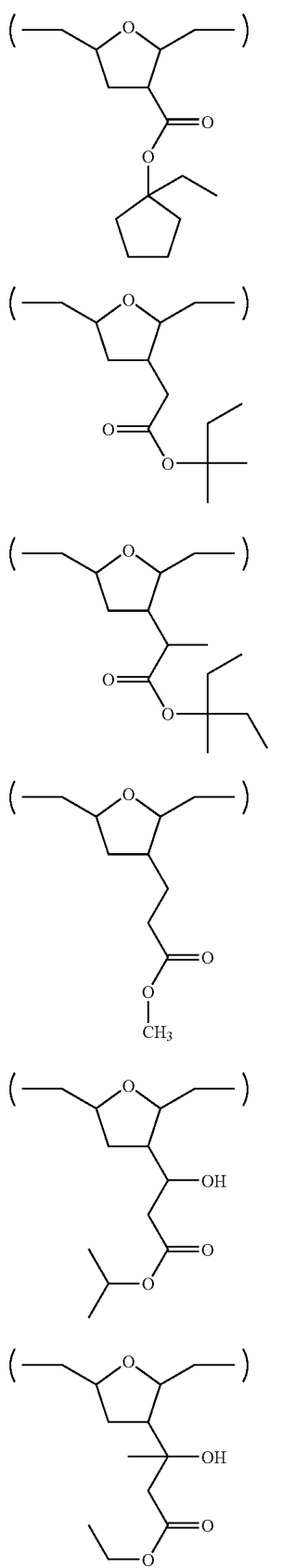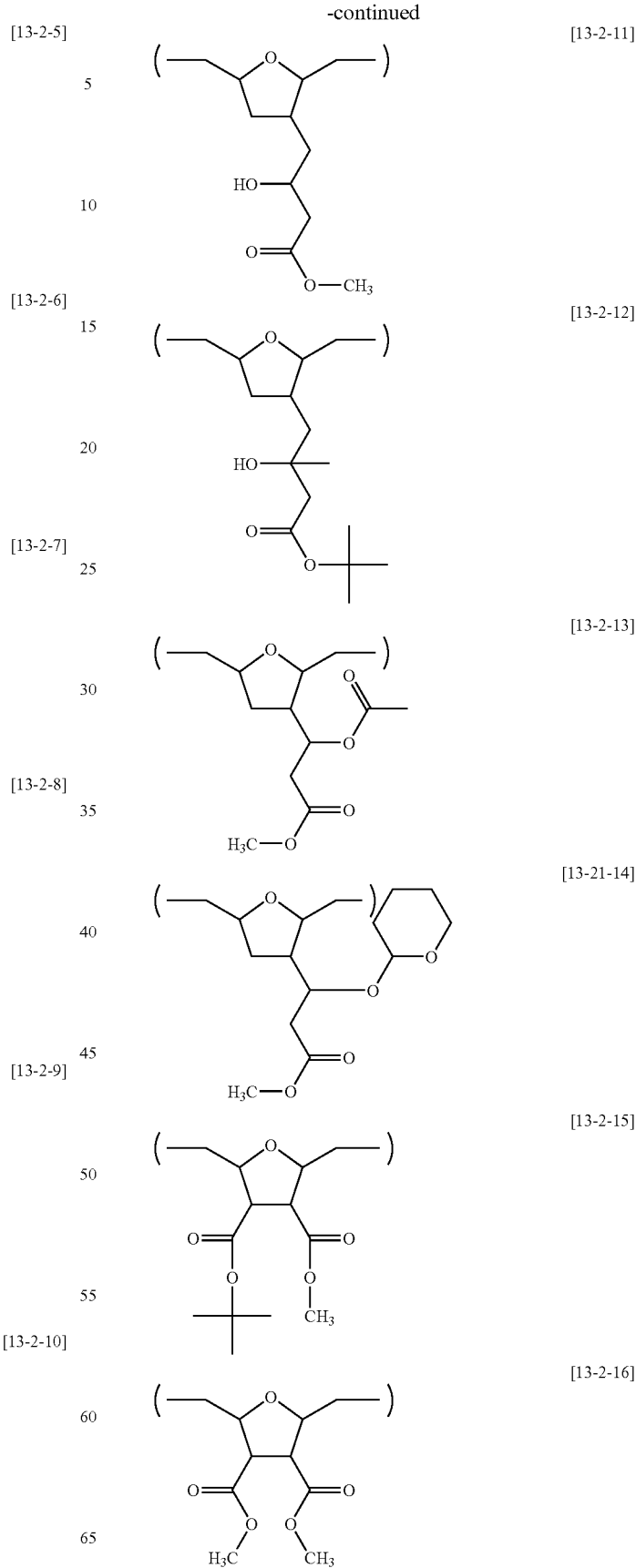

[13-2-17]
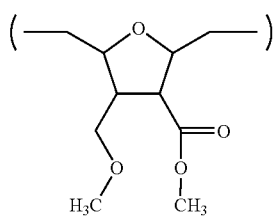
[13-2-18]
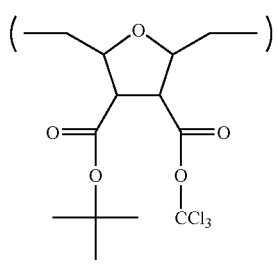
[13-3-1]
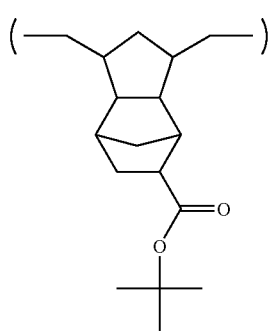
[13-3-2]
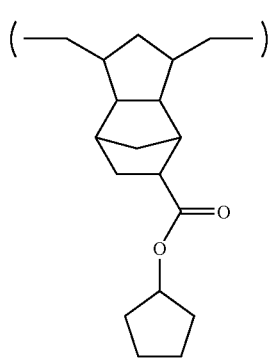
[13-3-3]
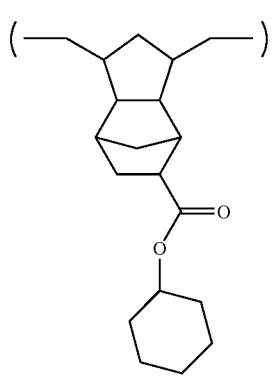
[13-3-4]
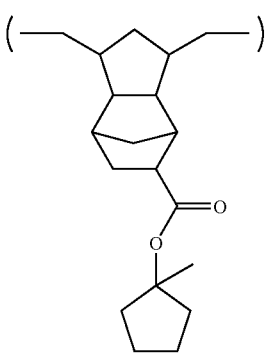
[13-3-5]
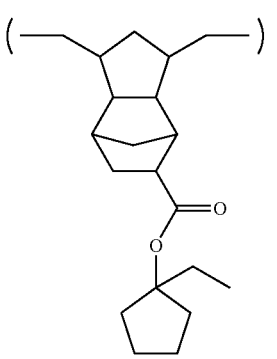
[13-3-6]
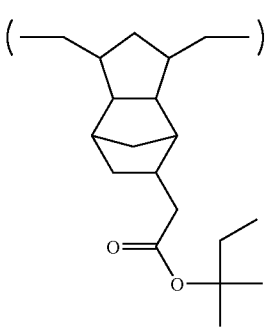
[13-3-7]
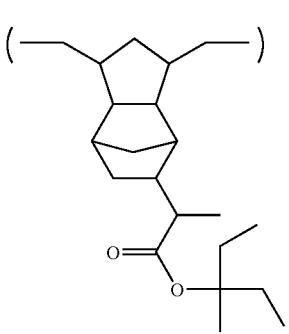

[13-3-8]
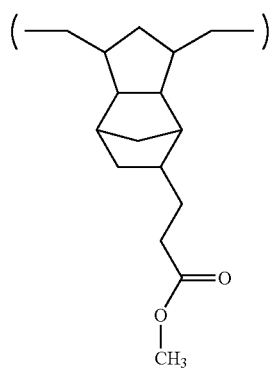
[13-3-9]
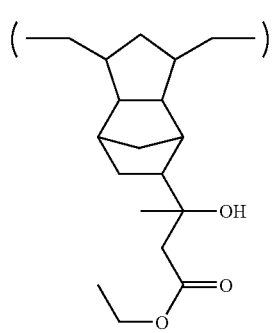
[13-3-10]
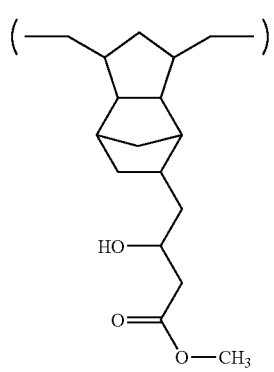
[13-3-11]
[13-3-12]
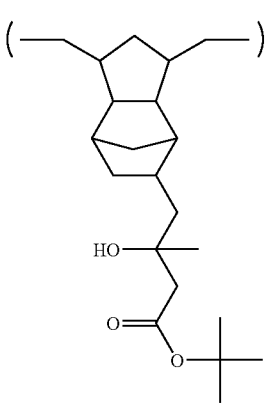
[13-3-13]
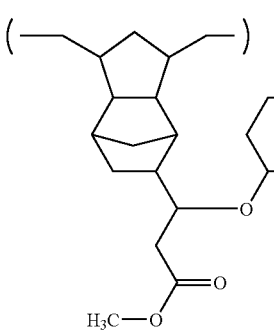
[13-3-14]
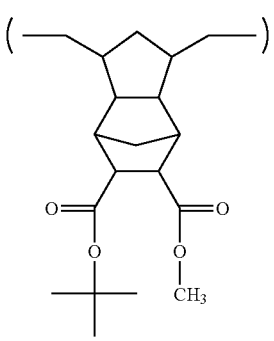
[13-3-15]

-continued
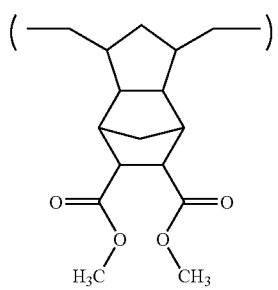
[13-3-16]
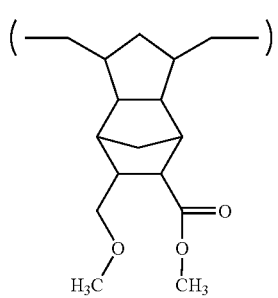
[13-3-17]
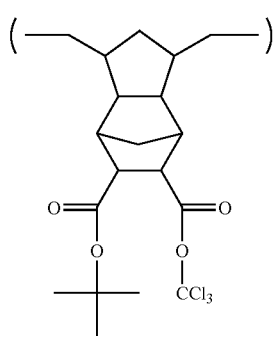
[13-3-18]
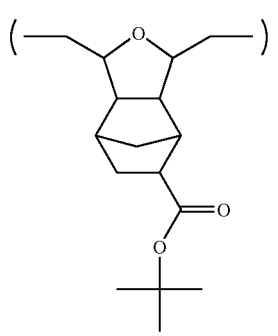
[13-4-1]
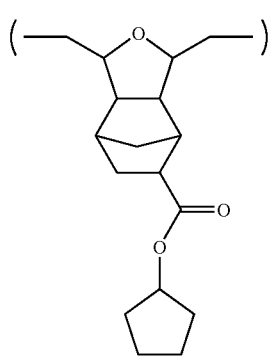
[13-4-2]
-continued
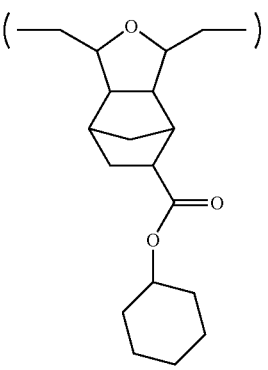
[13-4-3]
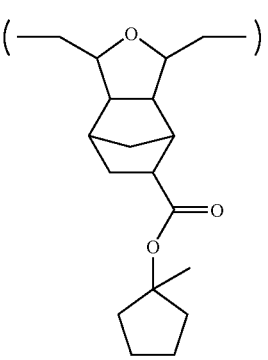
[13-4-4]
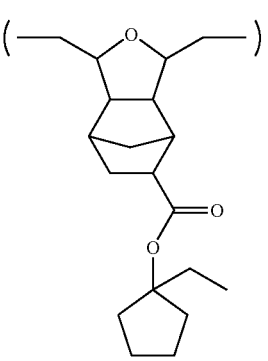
[13-4-5]
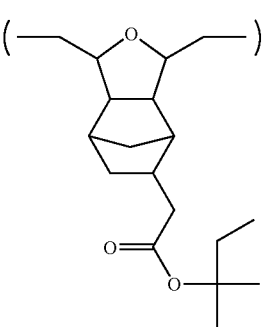
[13-4-6]

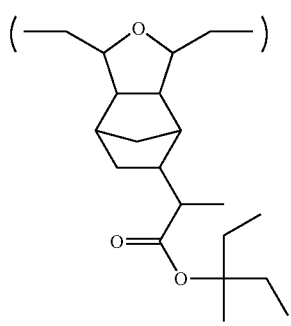
[13-4-7]
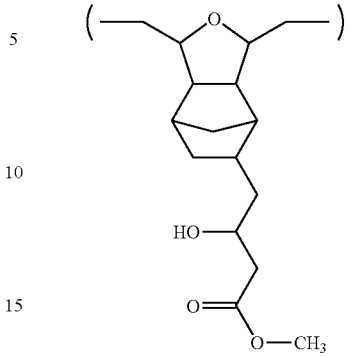
[13-4-11]
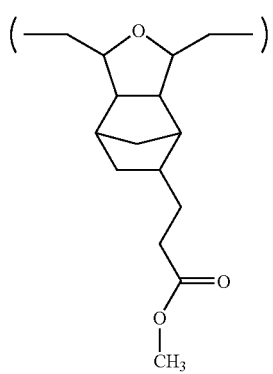
[13-4-8]
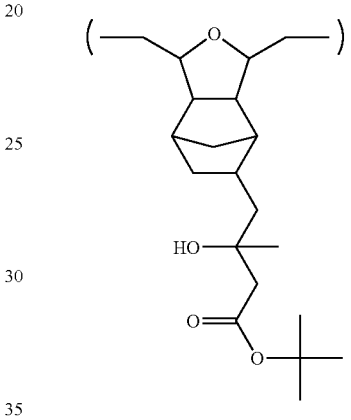
[13-4-12]
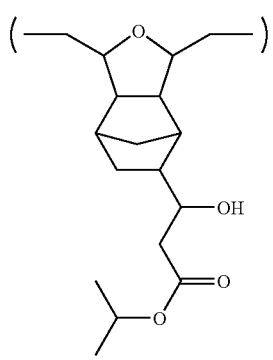
[13-4-9]
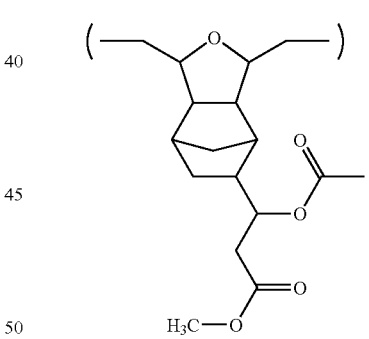
[13-4-13]
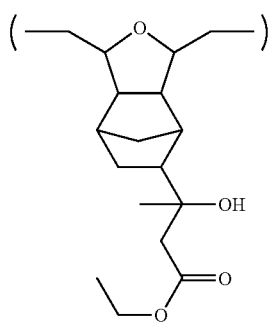
[13-4-10]
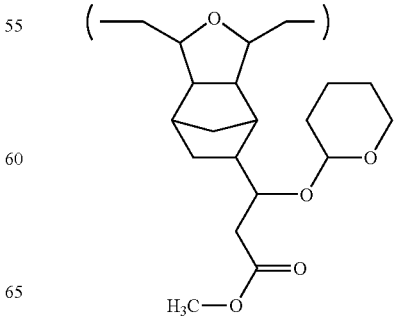
[13-4-14]

-continued

[13-4-15]
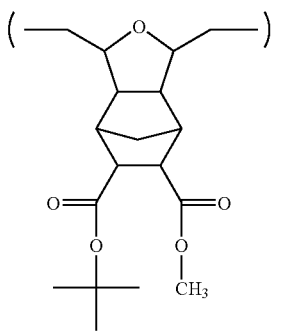

[13-4-16]
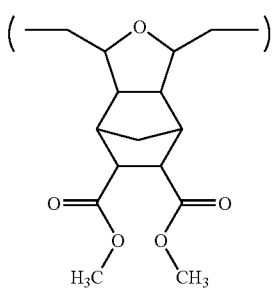

[13-4-17]
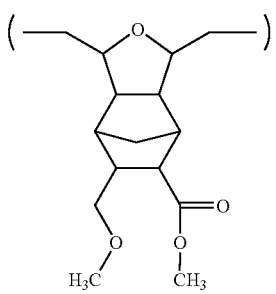

[13-4-18]
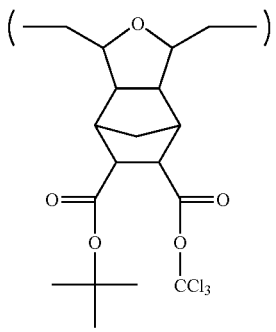

In a preferred embodiment, the constitutional molar ratio of the total of structural units [A] of formula [1], structural units [B] of formula [3] and structural units [C] of formula [4] to structural units [D] of formula [5], defined as ([A]+[B]+[C])/[D], is from 99/1 to 20/80. Inclusion of a certain amount of structural units [D] in addition to structural units [A], [B] and [C] is preferred. The structural units [D] are effective in increasing the freedom of design with respect to decomposition upon exposure, controlled development properties, controlled thermal properties, and solvent solubility. Preferably the constitutional molar ratio ([A]+[B]+[C])/[D] is from 98/2 to 30/70, more preferably from 97/3 to 40/60, and even more preferably from 95/5 to 50/50.

In a further preferred embodiment, the hydrogenated ring-opening metathesis polymers may contain, in addition to the structural units [A], [B], [C] and [D], structural units [E] of the following general formula [7]. Inclusion of units [E] is effective in further improving substrate adhesion and developer affinity.

[7]
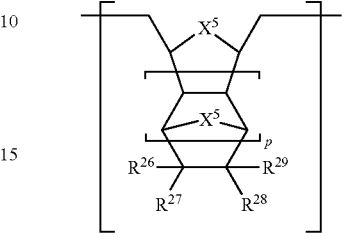

Herein at least one of $R^{26}$ to $R^{29}$ is a carboxyl-bearing functional group having the general formula [8]:

[8]
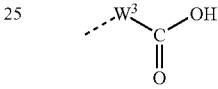

wherein the broken line denotes a valence bond, $W^3$ is a single bond, a divalent $C_1$-$C_{10}$ hydrocarbon group, or a divalent $C_1$-$C_{10}$ hydrocarbon group in which one hydrogen atom is substituted by —$OR^{30}$. $R^{30}$ is hydrogen, a straight, branched or cyclic $C_1$-$C_{10}$ alkyl group, a straight, branched or cyclic $C_2$-$C_{10}$ alkoxyalkyl group, or a straight, branched or cyclic $C_1$-$C_{10}$ acyl group. The remainders of $R^{26}$ to $R^{29}$ are each independently selected from the group consisting of hydrogen, a straight, branched or cyclic $C_1$-$C_{20}$ alkyl group, halogen, a straight, branched or cyclic $C_1$-$C_{20}$ haloalkyl group, a straight, branched or cyclic $C_1$-$C_{20}$ alkoxy group, a straight, branched or cyclic $C_2$-$C_{20}$ alkoxyalkyl group, a straight, branched or cyclic $C_2$-$C_{20}$ alkylcarbonyloxy group, a $C_7$-$C_{20}$ arylcarbonyloxy group, a straight, branched or cyclic $C_1$-$C_{20}$ alkylsulfonyloxy group, a $C_6$-$C_{20}$ arylsulfonyloxy group, a straight, branched or cyclic $C_2$-$C_{20}$ alkoxycarbonyl group, and a straight, branched or cyclic $C_3$-$C_{20}$ alkoxycarbonylalkyl group. $X^5$ which may be the same or different is —O— or —$CR^{31}_2$— wherein $R^{31}$ is hydrogen or a straight or branched $C_1$-$C_{10}$ alkyl group, and p is 0 or an integer of 1 to 3.

Of the groups represented by $R^{30}$, the straight, branched or cyclic $C_1$-$C_{10}$ alkyl groups include, for example, methyl, ethyl, propyl, isopropyl, n-butyl, isobutyl, tert-butyl, cyclopentyl, cyclohexyl, 1-ethylcyclopentyl and 1-ethylcyclohexyl. Examples of the straight, branched or cyclic $C_2$-$C_{10}$ alkoxyalkyl group include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl. Examples of the straight, branched or cyclic $C_1$-$C_{10}$ acyl group include formyl, acetyl, pivaloyl and cyclohexylcarbonyl. Of these $R^{30}$ groups, preferred are hydrogen, straight or branched $C_1$-$C_6$ alkyl, straight, branched or cyclic $C_2$-$C_7$ alkoxyalkyl, and straight or branched $C_2$-$C_7$ acyl. Most preferred are hydrogen, methyl, ethyl, methoxymethyl, 1-ethoxyethyl, tetrahydrofuran-2-yl, and acetyl.

When $W^3$ stands for a single bond, it means that the carboxyl group is directly attached, not via $W^3$. $W^3$ may also be a divalent $C_1$-$C_{10}$ hydrocarbon group, examples of which include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, and 1,4-cyclohexylene. Of these, methylene, ethylidene, ethylene, 1-methylethylene, 2-methylethylene, trimethylene, and 2-methyltrimethylene are preferred. $W^3$ may also be a divalent $C_1$-$C_{10}$ hydrocarbon group in which one hydrogen atom is substituted by —$OR^{30}$, for example, substituted forms of the foregoing hydrocarbon groups having one substituent group —$OR^{30}$ at an arbitrary position and having valence bonds at two positions. Most preferably, $W^3$ is a single bond.

The remainders of $R^{26}$ to $R^{29}$ are each independently selected from among hydrogen; straight, branched or cyclic $C_1$-$C_{20}$ alkyl groups, such as methyl, ethyl, propyl, isopropyl, n-butyl, tert-butyl, cyclohexyl and menthyl; halogen atoms such as chlorine, bromine, iodine and fluorine; straight, branched or cyclic $C_1$-$C_{20}$ haloalkyl groups, such as fluoromethyl, chloromethyl, bromomethyl, difluoromethyl, dichloromethyl, dibromomethyl, trifluoromethyl, trichloromethyl and tribromomethyl; straight, branched or cyclic $C_1$-$C_{20}$ alkoxy groups, such as methoxy, ethoxy, isopropoxy, n-butoxy, tert-butoxy and menthoxy; straight, branched or cyclic $C_2$-$C_{20}$ alkoxyalkyl groups, such as methoxymethyl, methoxyethyl, tert-butoxymethyl, tert-butoxyethyl and methoxymenthol and including alkoxysaccharides such as methylglucose; straight, branched or cyclic $C_2$-$C_{20}$ alkylcarbonyloxy groups such as acetoxy; $C_7$-$C_{20}$ arylcarbonyloxy groups such as naphthoyloxy; straight, branched or cyclic $C_1$-$C_{20}$ alkylsulfonyloxy groups such as mesyloxy; $C_6$-$C_{20}$ arylsulfonyloxy groups such as tosyloxy; straight, branched or cyclic $C_2$-$C_{20}$ alkoxycarbonyl groups such as methoxycarbonyl, ethoxycarbonyl, n-propoxycarbonyl, isopropoxycarbonyl, n-butoxycarbonyl, tert-butoxycarbonyl and cyclohexyloxycarbonyl; and straight, branched or cyclic $C_3$-$C_{20}$ alkoxycarbonylalkyl groups such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl and cyclohexyloxycarbonylmethyl. Of these, preferred are hydrogen, straight, branched or cyclic $C_1$-$C_{20}$ alkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkoxycarbonyl, and straight, branched or cyclic $C_3$-$C_{20}$ alkoxycarbonylalkyl. Most preferred are hydrogen, straight or branched $C_1$-$C_{10}$ alkyl, straight or branched $C_2$-$C_{10}$ alkoxycarbonyl, and straight or branched $C_3$-$C_{10}$ alkoxycarbonylalkyl.

$X^5$ is —O— or —$CR^{31}_2$— wherein $R^{31}$ is hydrogen or a straight or branched $C_1$-$C_{10}$ alkyl group. The letter p is 0 or an integer of 1 to 3. When p is 1 to 3, Xs may be the same or different. Exemplary of $R^{31}$ are hydrogen or straight or branched $C_1$-$C_{10}$ alkyl groups such as methyl, ethyl, n-propyl, isopropyl, n-butyl and tert-butyl. Preferably Xs is —O— or —$CH_2$—. More preferably all Xs groups are either —O— or —$CH_2$—. Preferably p is 0 or 1.

Illustrative examples of the structural units [E] of formula [7] include structural units of the following chemical formulas [14-1-1] to [14-4-16].

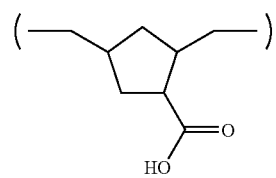

[14-1-1]

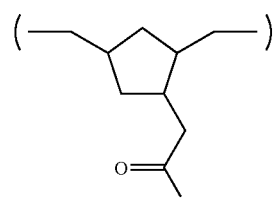

[14-1-2]

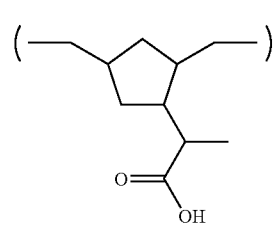

[14-1-3]

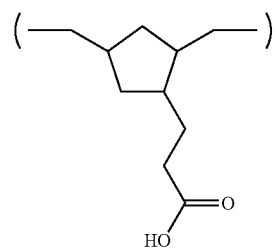

[14-1-4]

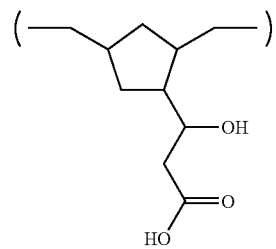

[14-1-5]

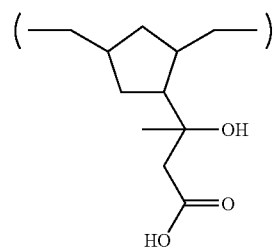

[14-1-6]

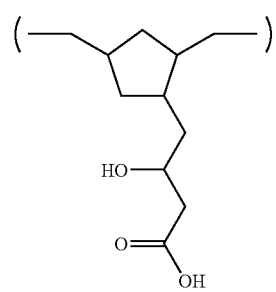

[14-1-7]

[14-1-8]
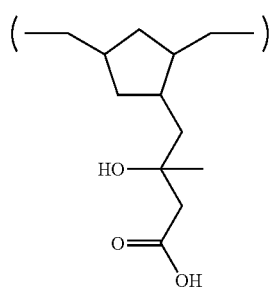
[14-1-9]
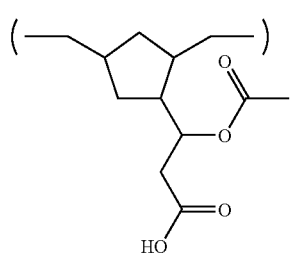
[14-1-10]
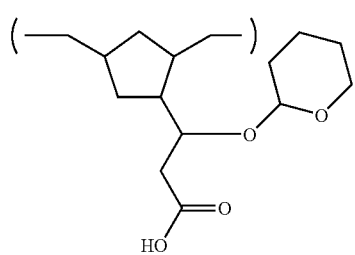
[14-1-11]
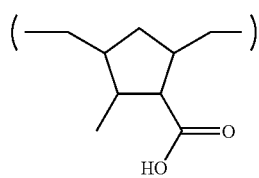
[14-1-12]
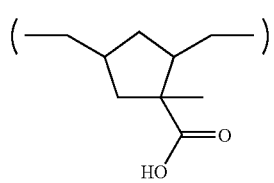
[14-1-13]
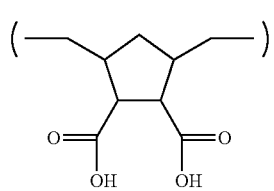
[14-1-14]
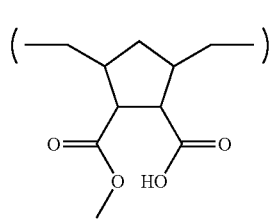
[14-1-15]
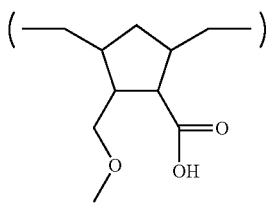
[14-1-16]
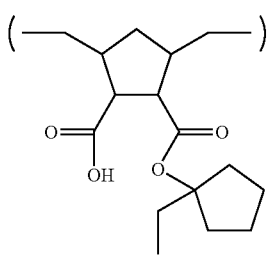
[14-2-1]
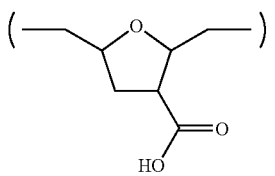
[14-2-2]
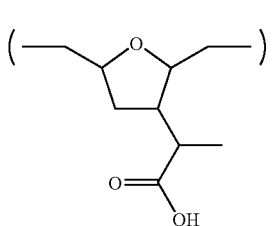
[14-2-3]
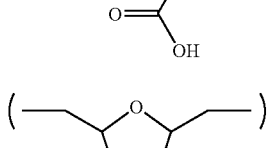
[14-2-4]
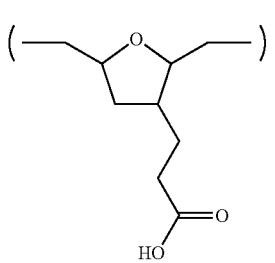
[14-2-5]
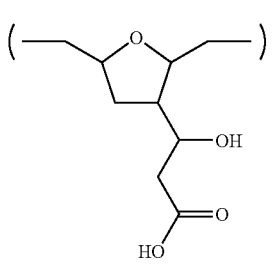

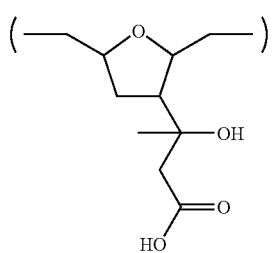
[14-2-6]
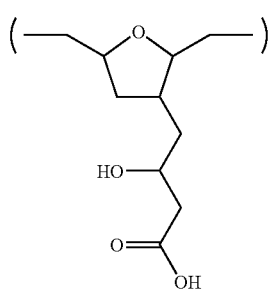
[14-2-7]
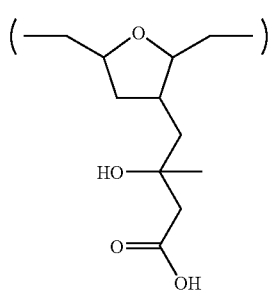
[14-2-8]
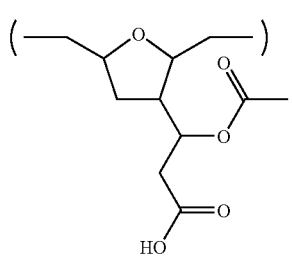
[14-2-9]
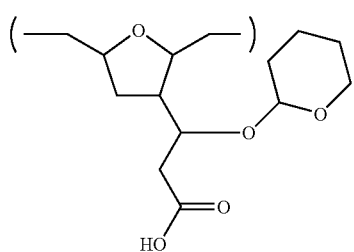
[14-2-10]
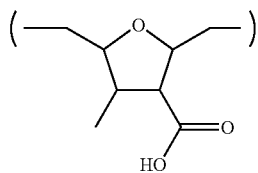
[14-2-11]
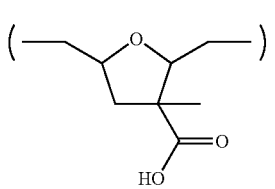
[14-2-12]
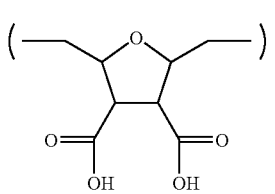
[14-2-13]
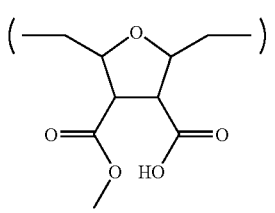
[14-2-14]
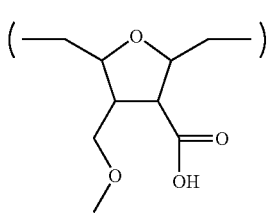
[14-2-15]
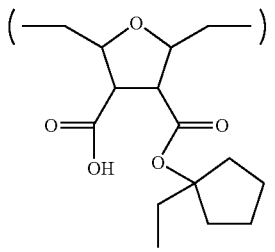
[14-2-16]
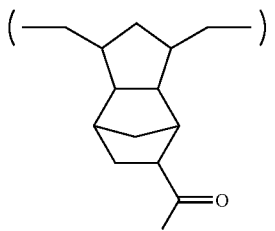
[14-3-1]
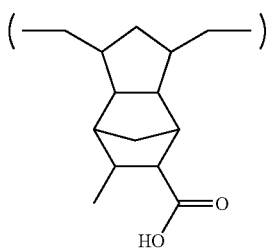
[14-3-2]

[14-3-3]
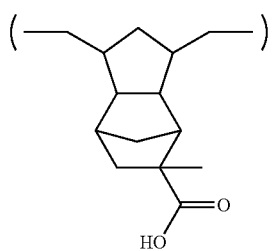
[14-3-4]
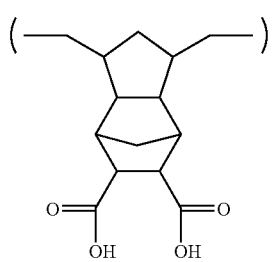
[14-3-5]
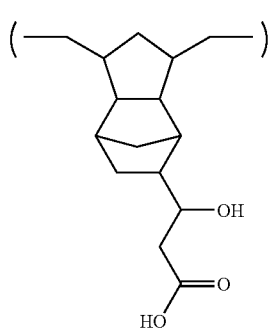
[14-3-6]
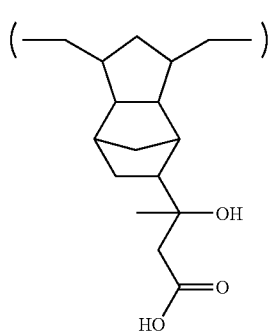
[14-3-7]
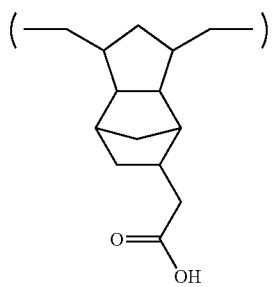
[14-3-8]
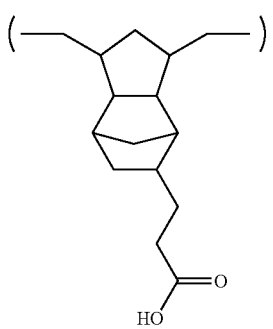
[14-3-9]
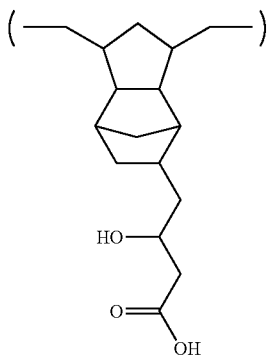
[14-3-10]
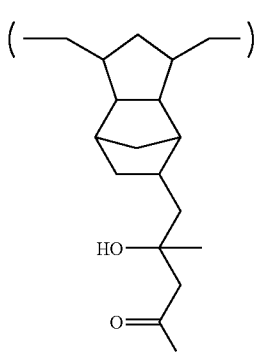
[14-3-11]
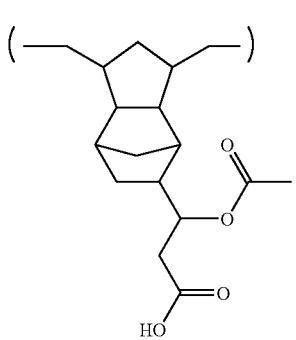

-continued
[14-3-12]
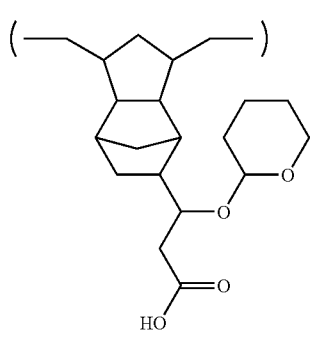
[14-3-13]
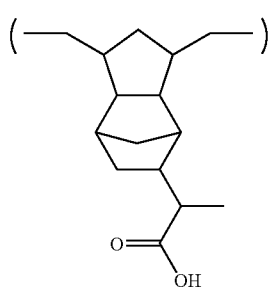
[14-3-14]
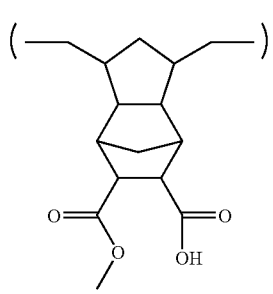
[14-3-15]
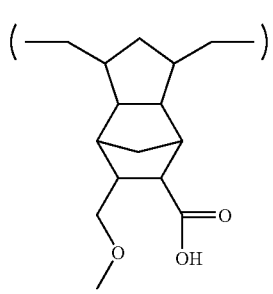
[14-3-16]
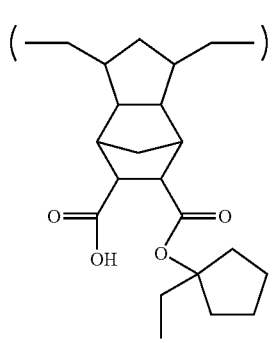
-continued
[14-4-1]
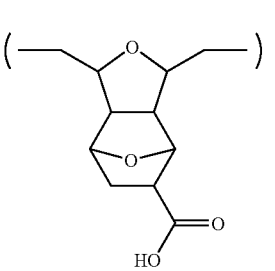
[14-4-2]
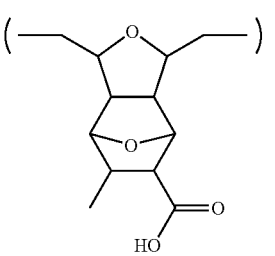
[14-4-3]
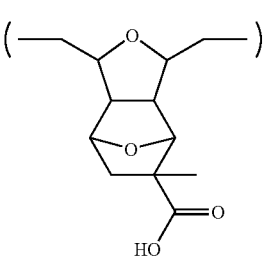
[14-4-4]
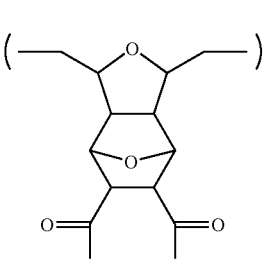
[14-4-5]
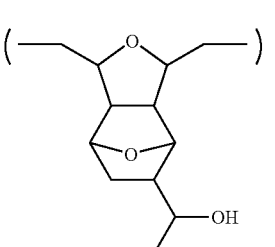

-continued
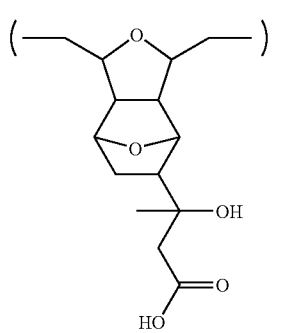
[14-4-6]
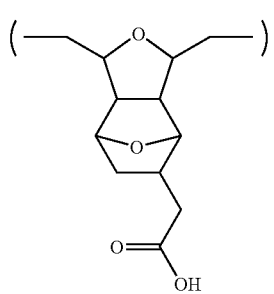
[14-4-7]
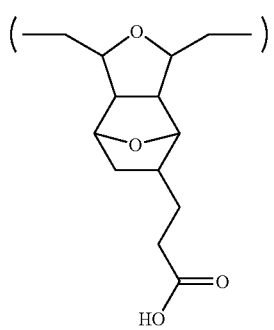
[14-4-8]
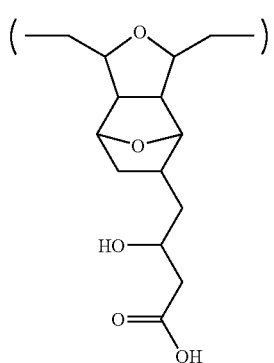
[14-4-9]
-continued
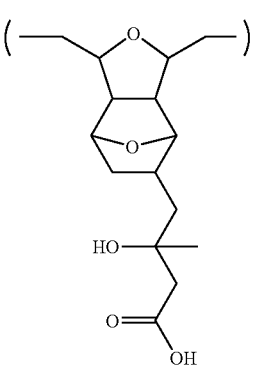
[14-4-10]
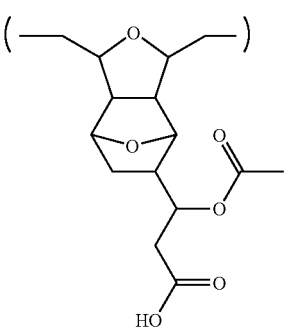
[14-4-11]
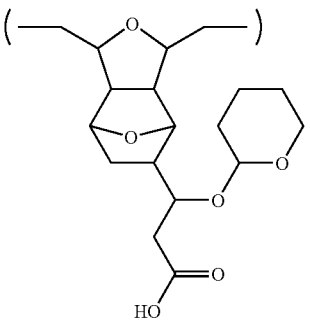
[14-4-12]
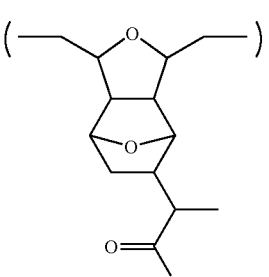
[14-4-13]
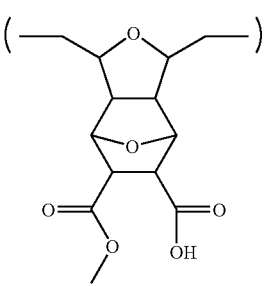
[14-4-14]

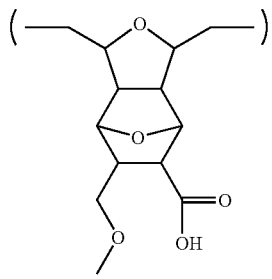

[14-4-15]

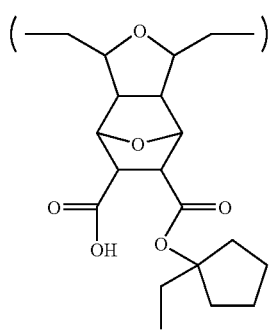

[14-4-16]

In a preferred embodiment, the constitutional molar ratio of the total of structural units [A] of formula [1], structural units [B] of formula [3] and structural units [C] of formula [4] to structural units [E] of formula [7], defined as ([A]+[B]+[C])/[E], is from 99/1 to 20/80. Inclusion of a certain amount of structural units [E] in addition to structural units [A], [B] and [C] is preferred. Preferably the constitutional molar ratio ([A]+[B]+[C])/[E] is from 98/2 to 30/70, more preferably from 97/3 to 40/60, and even more preferably from 95/5 to 50/50.

In another preferred embodiment, the constitutional molar ratio of the total of structural units [A] of formula [1], structural units [B] of formula [3], structural units [C] of formula [4] and structural units [D] of formula [5] to structural units [E] of formula [7], defined as ([A]+[B]+[C]+[D])/[E], is from 99/1 to 20/80. Inclusion of a certain amount of structural units [E] in addition to structural units [A], [B], [C] and [D] is preferred. Preferably the constitutional molar ratio ([A]+[B]+[C]+[D])/[E] is from 98/2 to 30/70, more preferably from 97/3 to 40/60, and even more preferably from 95/5 to 50/50.

The structural units [E] are effective in further improving adhesion to silicon substrates and other substrates to be coated and developer affinity.

In a still further preferred embodiment, the hydrogenated ring-opening metathesis polymers may contain structural units [F] of the following general formula [1,5] in addition to structural units [A] and [B] and/or [C], or structural units [A], [B] and/or [C], and [D], or structural units [A], [B] and/or [C], and [E], or structural units [A], [B] and/or [C], [D], and [E].

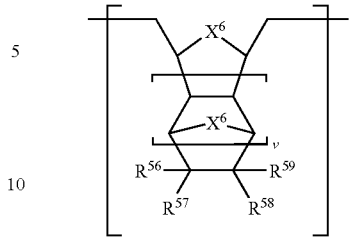

[15]

In formula [15], $R^{56}$ to $R^{59}$ are each independently selected from among hydrogen, straight, branched or cyclic $C_1$-$C_{20}$ alkyl, halogen, straight, branched or cyclic $C_1$-$C_{20}$ haloalkyl, straight, branched or cyclic $C_1$-$C_{20}$ alkoxy, straight, branched or cyclic $C_2$-$C_{20}$ alkoxyalkyl, hydroxyl, straight, branched or cyclic $C_1$-$C_{20}$ hydroxyalkyl, cyano, straight, branched or cyclic $C_2$-$C_{20}$ cyanoalkyl, straight, branched or cyclic $C_2$-$C_{20}$ alkylcarbonyloxy, straight, branched or cyclic $C_3$-$C_{20}$ alkylcarbonyloxyalkyl, $C_7$-$C_{20}$ arylcarbonyloxy, straight, branched or cyclic $C_1$-$C_{20}$ alkylsulfonyloxy, straight, branched or cyclic $C_2$-$C_{20}$ alkylsulfonyloxyalkyl, and $C_6$-$C_{20}$ arylsulfonyloxy; $X^6$, which may be the same or different, is —O— or —$CR^{60}_2$— wherein $R^{60}$ is hydrogen or straight or branched $C_1$-$C_{10}$ alkyl; and v is 0 or an integer of 1 to 3.

In the hydrogenated ring-opening metathesis polymer of the invention, the molar ratio of structural units [A] of formula [1] to the sum of structural units [B] of formula [3] and structural units [C] of formula [4], that is, [A]/([B]+[C]) is from 1/99 to 100/0. Namely, the inclusion of a certain amount of structural units [A] is essential. The structural units [A] having a functional group of formula [2] in which carboxylic acid is protected with a specific alkoxymethyl group are able to generate carboxylic acid in the presence of the acid generated by the photosensitive agent, and essential to form a resist pattern through exposure and subsequent development with an aqueous alkaline solution. Although the acid-catalyzed elimination reaction does not take place in some structural units depending on the type of alkoxymethyl group, most units may be decomposed under the action of a nucleophilic reagent, typically a trace amount of water present in the resist film (hydrolytic reaction in the case of water), to generate carboxylic acid. In general, tertiary alkyl groups are widely used as the protective group for carboxylic acid. It has been found that when a specific alkoxymethyl group is used as the protective group according to the invention, improvements in maximum resolution and proximity bias are achieved over the tertiary alkyl groups. It is believed that the oxygen functional moiety of alkoxymethyl group exerts the function of suppressing acid diffusion.

In contrast, no substantial improvements in maximum resolution and proximity bias are noticeable when the alkylene group between two oxygen atoms is not methylene, for example, in the case of an alkoxyalkyl ester group such as an ethoxyethyl ester group of the following formula [16] or a tetrahydropyranyl ester group of the following formula [17].

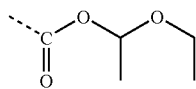

[16]

-continued

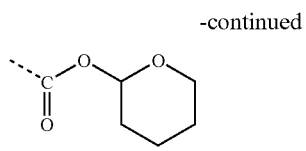
[17]

(The broken line denotes a valence bond.) It is believed that since a hydrogen atom (β hydrogen) is present on a vicinal carbon atom to the carbon atom between two oxygen atoms, acid-catalyzed elimination reaction readily takes place, failing to fully suppress acid diffusion.

The hydrogenated ring-opening metathesis polymers of the invention, due to inclusion of structural units [A], are increased in dissolution rate following exposure and improved in development, which leads to improved maximum resolution and reduced proximity bias. The structural units [B] and/or [C] are necessary to provide adhesion to silicon and other substrates to be coated. Due to inclusion of structural units [B] and/or [C], the polymers become more adherent to substrates to be coated and improved in resolution.

When structural units [D] are included in addition to structural units [A] and [B] and/or [C], which means the inclusion of an ester group having different reactivity from the alkoxymethyl ester group in structural units [A], the polymers are advantageously increased in the freedom of design with respect to decomposition upon exposure, controlled development properties, controlled thermal properties, and solvent solubility. In this embodiment, the preferred constitutional molar ratio ([A]+[B]+[C])/[D] is in the range from 99/1 to 20/80.

The structural units [E] of formula [7] contain carboxyl groups and are effective for improving adhesion to silicon and other substrates to be coated and solubility in solvents. When the constitutional molar ratio of the total of structural units [A], [B] and [C] to structural units [E], ([A]+[B]+[C])/[E], or the constitutional molar ratio of the total of structural units [A], [B], [C] and [D] to structural units [E], ([A]+[B]+[C]+[D])/[E] is from 99/1 to 20/80, the wetting tension of an exposed resist film with an aqueous alkaline solution during development is improved and development variations are minimized. Polymers comprising these structural units in the range are advantageous in preparing resist compositions, since they are dissolvable in polar solvents such as 2-heptanone together with highly polar photosensitive agents. This is very important as the resist composition to be coated to silicon and other substrates. The hydrogenated ring-opening metathesis polymers serve to enhance the solubility or dissolution rate in polar solvents so that resist compositions are effectively prepared, from which uniform flat coating films can be formed.

The hydrogenated ring-opening metathesis polymers in which at least one of $X^1$ in formula [1] representative of structural units [A], $X^2$ in formula [3] representative of structural units [B], and $X^3$ in formula [4] representative of structural units [C] is —O— and the remainders are —CH$_2$— are effective in further improving the adhesion to silicon and other substrates to be coated, the wetting tension with an aqueous alkaline solution during development, and the solubility in polar organic solvents such as ketones and alcohols used in the step of coating silicon wafers with resist compositions. In addition, the polymers exhibit improved affinity to water and improved developability with strippers or developers such as aqueous alkaline solutions after exposure.

The hydrogenated ring-opening metathesis polymers are prepared by polymerizing cyclic olefin monomers in the presence of a ring-opening metathesis catalyst and hydrogenating in the presence of a hydrogenation catalyst, the cyclic olefin monomers corresponding to structural units [A] of formula [1], structural units [B] of formula [3] and/or structural units [C] of formula [4], structural units [D] of formula [5], optionally structural units [E] of formula [7], and optionally structural units [F] of formula [15].

Suitable cyclic olefin monomers corresponding to structural units [A] of formula [1] are cyclic olefin monomers having a structure of the following formula [18].

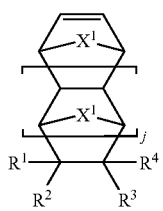
[18]

$R^1$ to $R^4$, $X^1$ and j are as defined in formula [1].

Suitable cyclic olefin monomers corresponding to structural units [B] and [C] of formulae [3] and [4] are cyclic olefin monomers having structures of the following formulae [19] and [20], respectively.

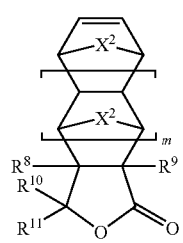
[19]

$R^8$ to $R^{11}$, $X^2$ and m are as defined in formula [3].

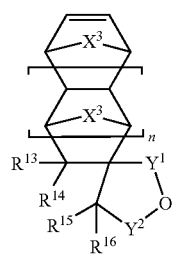
[20]

$R^{13}$ to $R^{16}$, $X^3$, $Y^1$, $Y^2$, and n are as defined in formula [4].

Suitable cyclic olefin monomers corresponding to structural units [D] of formula [5] are cyclic olefin monomers having a structure of the following formula [21].

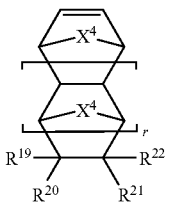

[21]

$R^{19}$ to $R^{22}$, $X^4$ and r are as defined in formula [5].

Suitable cyclic olefin monomers corresponding to structural units [F] of formula [15] are cyclic olefin monomers having a structure of the following formula [22].

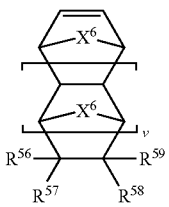

[22]

$R^{56}$ to $R^{59}$, $X^5$ and v are as defined in formula [15].

Any desired method may be employed in preparing the hydrogenated ring-opening metathesis polymers. In the polymerization reaction, any suitable catalyst may be used as long as it helps ring-opening metathesis reaction of the foregoing cyclic olefin monomers. In the hydrogenation reaction, any suitable catalyst may be used as long as it helps hydrogenation on polymers resulting from the ring-opening metathesis reaction. The hydrogenated products of ring-opening metathesis polymers are obtained by producing ring-opening metathesis polymers through the reaction of cyclic olefin monomers in the presence of a ring-opening metathesis catalyst, and hydrogenating the polymers under hydrogen pressure in a solvent in the presence of a hydrogenation catalyst. Polymerization and hydrogenation may be performed by the method described in JP-A 2001-354756, for example.

The ring-opening metathesis catalyst used in the preparation of ring-opening metathesis polymers is not particularly limited as long as it can promote ring-opening metathesis polymerization. Any of well-known ring-opening metathesis catalysts may be used. Known ring-opening metathesis catalysts include ring-opening metathesis catalysts based on organic transition metal complexes, ring-opening metathesis catalysts based on a combination of organic transition metal complexes with Lewis acids as co-catalyst, and ring-opening metathesis catalysts based on a combination of transition metal halides with Lewis acids as co-catalyst.

For hydrogenation reaction on a backbone double bond moiety in the ring-opening metathesis polymer, well-known hydrogenation catalysts may be used. Known heterogeneous catalysts include carrier-type metal catalysts having metals (e.g., palladium, platinum, nickel, rhodium, ruthenium) on carriers (e.g., carbon, silica, alumina, titania, magnesia, diatomaceous earth, synthetic zeolite). Known homogeneous catalysts include nickel naphthenate/triethylaluminum, acetylacetonatonickel/triisobutylaluminum, cobalt octenate/n-butyllithium, titanocene dichloride/diethylaluminum chloride, rhodium acetate, dichlorobis(triphenylphosphine) palladium, chlorotris(triphenylphosphine)rhodium, and dihydridotetrakis(triphenylphosphine)ruthenium.

The hydrogenated products of ring-opening metathesis polymers are obtained by adding hydrogen to a backbone double bond moiety in the ring-opening metathesis polymer in the presence of a catalyst with hydrogenation capability, preferably in a proportion of 80 to 100 wt %, and more preferably 90 to 100 wt %.

Preferably the hydrogenated ring-opening metathesis polymers have a dispersity (Mw/Mn) of 1.0 to 5.0. The polymers typically have a weight average molecular weight (Mw) of 2,000 to 200,000, preferably 3,000 to 100,000, and more preferably 5,000 to 50,000. It is noted that the weight average molecular weight (Mw) and number average molecular weight (Mn) of a polymer sample are determined by gel permeation chromatography (GPC) using a solvent capable of dissolving the sample, a column capable of separating the sample, and polystyrene standards. The dispersity, also known as molecular weight distribution, is defined as weight average molecular weight (Mw) divided by number average molecular weight (Mn), i.e., Mw/Mn.

By decomposing at least some of alkoxymethyl ester-bearing functional groups in formula [2] and/or ester-bearing functional groups in formula [6] in hydrogenated ring-opening metathesis polymers to convert them to carboxylic acid, there can be produced hydrogenated ring-opening metathesis polymers comprising structural units [A] of formula [1], structural units [B] of formula [3] and/or structural units [C] of formula [4], structural units [D] of formula [5], optionally structural units [E] of formula [7], and optionally structural units [F] of formula [15], wherein at least one of $X^1$ in formula [1] representative of structural units [A], $X^2$ in formula [3] representative of structural units [B], and $X^3$ in formula [4] representative of structural units [C] is —O—, and the constitutional molar ratio [A]/([B]+[C]) is from 1/99 to 100/0.

The step of decomposing at least some of alkoxymethyl ester-bearing functional groups in formula [2] and/or ester-bearing functional groups in formula [6] to convert them to carboxylic acid may be effected by a standard method. Suitable methods include, but are not limited to, decomposition reactions such as hydrolysis under basic conditions, hydrolysis under acidic conditions, and hydrolysis under neutral conditions, and acidolysis.

Briefly stated, the hydrogenated ring-opening metathesis polymer of the invention is defined as comprising at least structural units [A] of formula [1] wherein at least one of $R^1$ to $R^4$ is an alkoxymethyl ester-bearing functional group of formula [2]. Since the alkoxymethyl ester group is readily decomposed with the acid generated by a photosensitive agent into carboxylic acid that is an alkali soluble group, the polymer exhibits excellent resolution when used as resist material. The hydrogenated ring-opening metathesis polymer having an alkoxymethyl ester group of formula [2] may be produced by polymerizing a cyclic olefin monomer having the structure of formula [18] wherein at least one of $R^1$ to $R^4$ is an alkoxymethyl ester group of formula [2] in the presence of a ring-opening metathesis catalyst, and hydrogenating the resulting polymer in the presence of a hydrogenation catalyst. The polymer may also be produced by polymerizing a cyclic olefin monomer having the structure of formula [21] wherein at least one of $R^{19}$ to $R^{22}$ is an ester group of formula [6] other than the alkoxymethyl ester group in the presence of a ring-opening metathesis catalyst, hydrogenating the resulting polymer in the presence of a hydrogenation catalyst, decomposing at least some of ester groups into carboxylic acid by the above-described method, and then converting the carboxylic acid back to an alkoxymethyl ester group.

The step of converting carboxylic acid to an alkoxymethyl ester group may be effected by a standard method. Suitable methods include, but are not limited to, esterification by dehydration condensation reaction with alcohols, esterification with ortho-alkylating agents, esterification by condensation reaction with halides in the presence of organic basic compounds, and esterification by contacting metal salts of carboxylic acid with halides.

Resist Composition

The resist composition comprising the hydrogenated ring-opening metathesis polymer of the specific structure according to the invention as a base resin is useful as a positive working resist composition, especially chemically amplified positive working resist composition. The composition often contains an acid generator and an organic solvent in addition to the hydrogenated ring-opening metathesis polymer as a base resin.

Acid Generator

The acid generator is a compound capable of generating an acid upon exposure to high-energy radiation or electron beams and includes the following;
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium Salts of Formula (P1a-1), (P1a-2) or (P1b):

Herein, $R^{101a}$, $R^{101b}$, and $R^{101c}$ independently represent straight, branched or cyclic $C_1$-$C_{12}$ alkyl, alkenyl, oxoalkyl or oxoalkenyl groups, $C_6$-$C_{20}$ aryl groups, or $C_7$-$C_{12}$ aralkyl or aryloxoalkyl groups, wherein some or all of the hydrogen atoms may be replaced by alkoxy or other groups. Also, $R^{101b}$ and $R^{101c}$ taken together, may form a ring with the sulfur atom to which they are attached. $R^{101b}$ and $R^{101c}$ each are $C_1$-$C_6$ alkylene groups when they form a ring. K⁻ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by K⁻ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

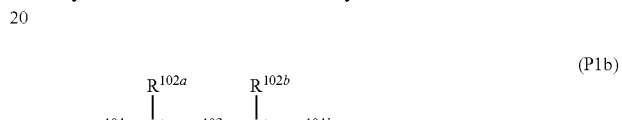

Herein, $R^{102a}$ and $R^{102b}$ independently represent straight, branched or cyclic $C_1$-$C_8$ alkyl groups. $R^{103}$ represents a straight, branched or cyclic $C_1$-$C_{10}$ alkylene groups. $R^{104a}$ and $R^{104b}$ independently represent 2-oxoalkyl groups of 3 to 7 carbon atoms. K⁻ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by K⁻ are the same as exemplified for formulae (P1a-1) and (P1a-2).

(ii) Diazomethane Derivatives of Formula (P2)

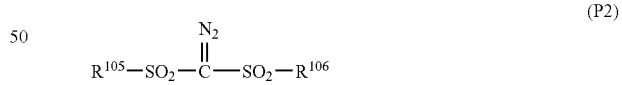

Herein, $R^{105}$ and $R^{106}$ independently represent straight, branched or cyclic $C_1$-$C_{12}$ alkyl or haloalkyl groups, $C_6$-$C_{20}$ aryl or haloaryl groups, or $C_7$-$C_{12}$ aralkyl groups.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary haloalkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary haloaryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

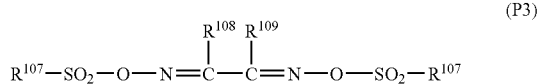

Herein, $R^{107}$, $R^{108}$, and $R^{109}$ independently represent straight, branched or cyclic $C_1$-$C_{12}$ alkyl or haloalkyl groups, $C_6$-$C_{20}$ aryl or haloaryl groups, or $C_7$-$C_{12}$ aralkyl groups. Also, $R^{108}$ and $R^{109}$ may bond together to form a ring with the carbon atom to which they are attached. $R^{108}$ and $R^{109}$ each are straight or branched $C_1$-$C_6$ alkylene groups when they form a ring.

Illustrative examples of the alkyl, haloalkyl, aryl, haloaryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

Herein, $R^{101a}$ and $R^{101b}$ are as defined above.

(v) Sulfonic Acid Esters of N-hydroxyimide Compounds of Formula (P5)

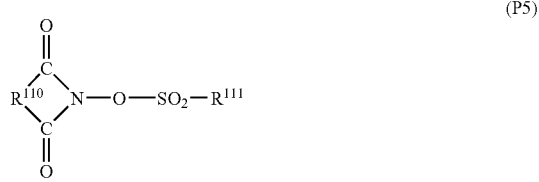

Herein, $R^{110}$ is a $C_6$-$C_{10}$ arylene group, $C_1$-$C_6$ alkylene group, or $C_2$-$C_6$ alkenylene group wherein some or all of the hydrogen atoms may be replaced by straight or branched $C_1$-$C_4$ alkyl or alkoxy groups, nitro, acetyl, or phenyl groups. $R^{111}$ is a straight, branched or cyclic $C_1$-$C_8$ alkyl group, alkenyl, alkoxyalkyl, phenyl or naphthyl group wherein some or all of the hydrogen atoms may be replaced by $C_1$-$C_4$ alkyl or alkoxy groups, phenyl groups (which may have substituted thereon a $C_1$-$C_4$ alkyl or alkoxy, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the $C_1$-$C_4$ alkyl groups include methyl, ethyl, propyl, isopropyl, n-butyl, isobutyl and tert-butyl; the $C_1$-$C_4$ alkoxy groups include methoxy, ethoxy, propoxy, isopropoxy, n-butoxy, isobutoxy, and tert-butoxy; the phenyl groups which may have substituted thereon a $C_1$-$C_4$ alkyl or alkoxy, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate, triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane, bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone and dicyclohexyl disulfone;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethanesulfonate, and
N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, and 1,2'-naphthylcarbonylmethyltetrahydrothiophenium triflate;

diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;

glyoxime derivatives such as
bis-O-(p-toluenesulfonyl)-α-dimethylglyoxime and
bis-O-(n-butanesulfonyl)-α-dimethylglyoxime;

bissulfone derivatives such as bisnaphthylsulfonylmethane; and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These acid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The acid generator is added in an amount of 0.1 to 15 parts, and especially 0.5 to 8 parts by weight, per 100 parts by weight of the base resin (all parts are by weight, hereinafter).

Less than 0.1 part of the acid generator may provide a poor sensitivity whereas more than 15 parts of the acid generator may adversely affect transparency and resolution.

Organic Solvent

The organic solvent used herein may be any organic solvent in which the base resin, acid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether and 1-ethoxy-2-propanol because the acid generator is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

Other Polymer

To the resist composition of the invention, another polymer other than the inventive hydrogenated ring-opening metathesis polymer may also be added. The other polymers that can be added to the resist composition are, for example, those polymers comprising units of the following formula (R1) or (R2) and having a weight average molecular weight of 1,000 to 500,000, especially 5,000 to 100,000 although the other polymers are not limited thereto.

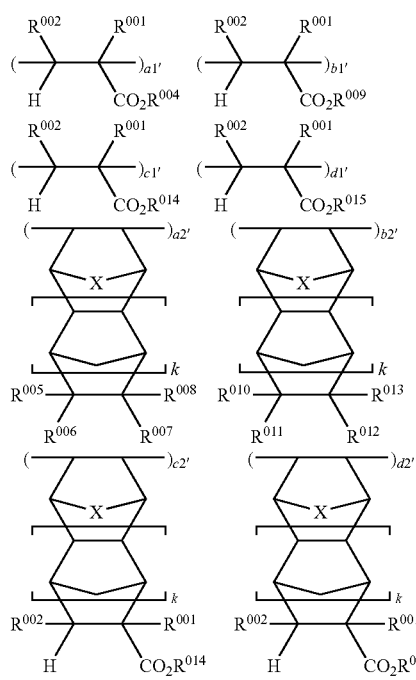

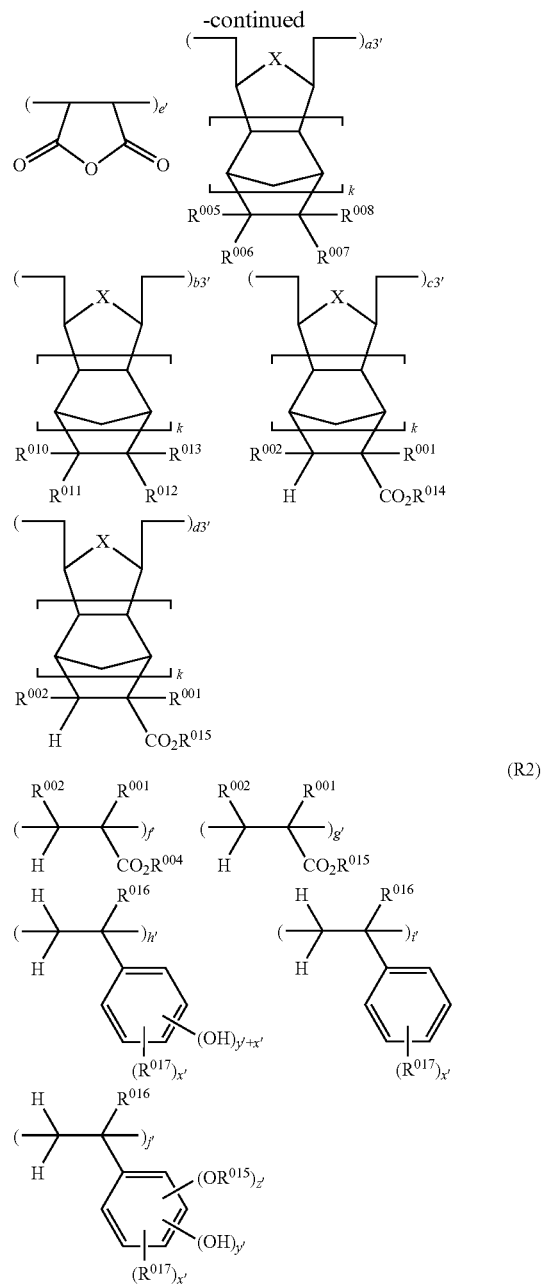

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic $C_1$-$C_{15}$ alkyl group. $R^{004}$ is hydrogen or a monovalent $C_1$-$C_{15}$ hydrocarbon group having a carboxyl or hydroxyl group. At least one of $R^{005}$ to $R^{008}$ represents a monovalent $C_1$-$C_{15}$ hydrocarbon group having a carboxyl or hydroxyl group while the remaining R's independently represent hydrogen or a straight, branched or cyclic $C_1$-$C_{15}$ alkyl group. Alternatively, a combination of $R^{005}$ to $R^{008}$ (e.g., a pair of $R^{005}$ and $R^{006}$, or $R^{006}$ and $R^{007}$) may bond together to form a ring with the carbon atom to which they are attached, and in that event, at least one of ring-forming $R^{005}$ to $R^{008}$ is a divalent $C_1$-$C_{10}$ hydrocarbon group having a carboxyl or hydroxyl group, while the remaining R's are independently single bonds or straight, branched or cyclic $C_1$-$C_{15}$ alkylene groups. $R^{009}$ is a monovalent $C_3$-$C_{15}$ hydrocarbon group containing a —$CO_2$— partial structure. At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. A combination of $R^{010}$ to $R^{013}$ (e.g., $R^{010}$ and $R^{011}$, or $R^{011}$ and $R^{012}$) may bond together to form a ring with the carbon atom to which they are attached, and in that event, at least one of ring-forming $R^{010}$ to $R^{013}$ is a divalent $C_1$-$C_{15}$ hydrocarbon group containing a —$CO_2$— partial structure, while the remaining R's are independently single bonds or straight, branched or cyclic $C_1$-$C_{15}$ alkylene groups. $R^{014}$ is a polycyclic $C_7$-$C_{15}$ hydrocarbon group or an alkyl group containing a polycyclic hydrocarbon group. $R^{015}$ is an acid labile group. $R^{016}$ is hydrogen or methyl. $R^{017}$ is a straight, branched or cyclic $C_1$-$C_8$ alkyl group. X is $CH_2$ or an oxygen atom. Letter k' is 0 or 1;

a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1;

f', g', h', i', and j' are numbers from 0 to less than 1, satisfying f'+g'+h'+i'+j'=1.

The inventive polymer (hydrogenated ring-opening metathesis polymer) and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The other polymer is not limited to one type and a mixture of two or more other polymers may be added. The use of plural polymers allows for easy adjustment of resist properties.

Dissolution Regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

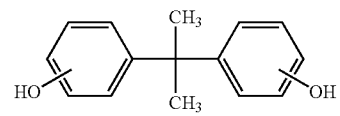
(D1)

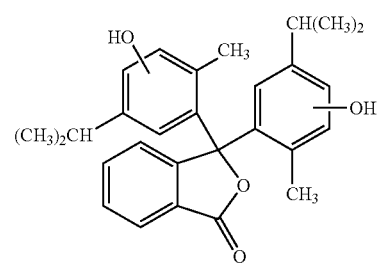
(D2)

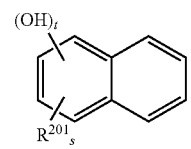
(D3)

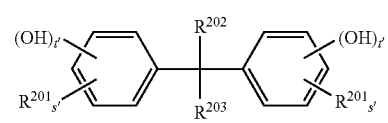
(D4)

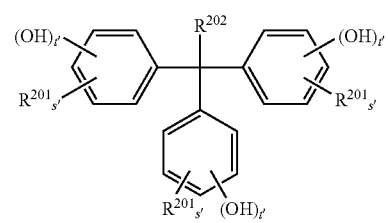
(D5)

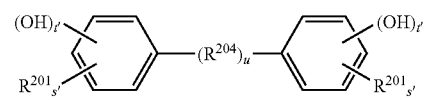
(D6)

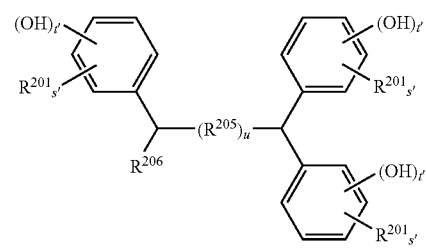
(D7)

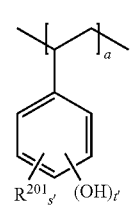
(D8)

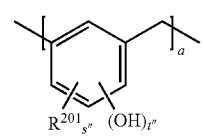
(D9)

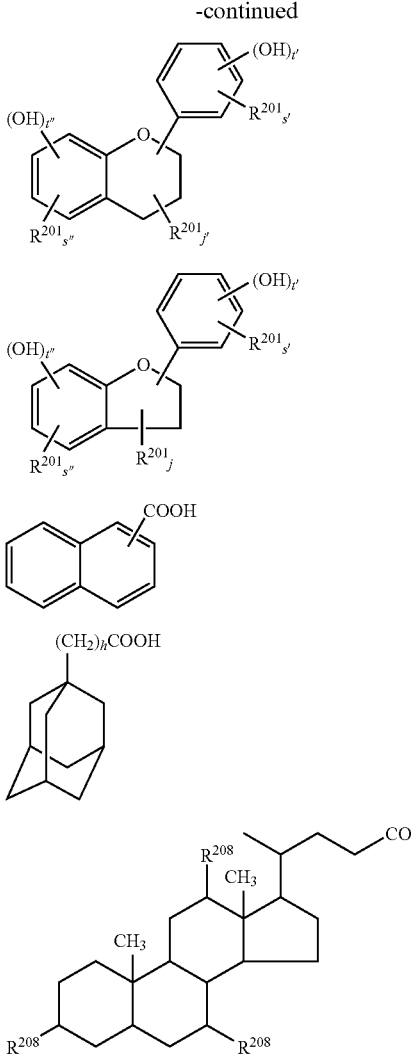

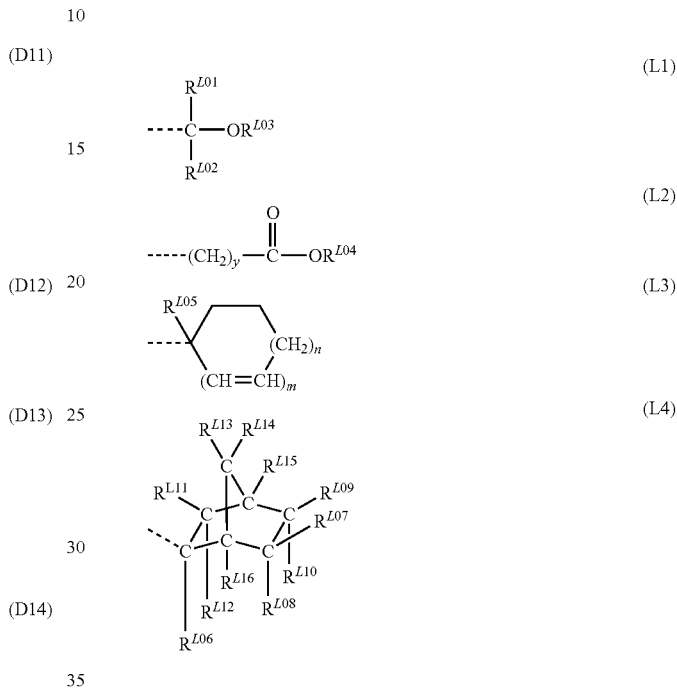

In these formulas, $R^{201}$ and $R^{202}$ are each hydrogen or a straight or branched $C_1$-$C_8$ alkyl or alkenyl; $R^{203}$ is hydrogen, a straight or branched $C_1$-$C_8$ alkyl or alkenyl, or —$(R^{207})_h$—COOH; $R^{204}$ is —$(CH_2)_i$— (where i=2 to 10), a $C_6$-$C_{10}$ arylene, carbonyl, sulfonyl, an oxygen atom, or a sulfur atom; $R^{205}$ is a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$-$C_{10}$ alkylene; $R^{208}$ is hydrogen or hydroxyl; the letter j is an integer from 0 to 5; u and h are each 0 or 1; s, t, s', t', s'', and t'' are each numbers which satisfy s+t=8, s'+t'=5, and s''+t''=4, and are such that each phenyl skeleton has at least one hydroxyl group; and α is a number such that the compounds of formula (D8) or (D9) have a molecular weight of from 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as —COOH and —$CH_2$COOH; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxyl-substituted phenyl or naphthyl.

The acid labile groups on the other polymer (represented by $R^{015}$) and on the dissolution regulator may be selected from a variety of such groups and include groups of the following general formulae (L1) to (L4), tertiary $C_4$-$C_{20}$ alkyl groups, trialkylsilyl groups in which each of the alkyls has 1 to 6 carbon atoms, and oxoalkyl groups of 4 to 20 carbon atoms.

In these formulas, $R^{L01}$ and $R^{L02}$ are each hydrogen or a straight, branched or cyclic $C_1$-$C_{18}$ alkyl; and $R^{L03}$ is a monovalent $C_1$-$C_{18}$ hydrocarbon group which may contain a heteroatom (e.g., oxygen). A pair of $R^{L01}$ and $R^{L02}$, a pair of $R^{L01}$ and $R^{L03}$, or a pair of $R^{L02}$ and $R^{L03}$ may together form a ring with the carbon atom to which they are attached, with the proviso that $R^{L01}$, $R^{L02}$, and $R^{L03}$ are each a straight or branched $C_1$-$C_{18}$ alkylene when they form a ring. $R^{L04}$ is a tertiary $C_4$-$C_{20}$ alkyl group, a trialkysilyl group in which each of the alkyls has 1 to 6 carbon atoms, a $C_4$-$C_{20}$ oxoalkyl group, or a group of the formula (L1). $R^{L05}$ is a monovalent $C_1$-$C_8$ hydrocarbon group which may contain a heteroatom or an optionally substituted $C_6$-$C_{20}$ aryl group. $R^{L06}$ is a monovalent $C_1$-$C_8$ hydrocarbon group which may contain a heteroatom or an optionally substituted $C_6$-$C_{20}$ aryl group. $R^{L07}$ to $R^{L16}$ independently represent hydrogen or monovalent $C_1$-$C_{15}$ hydrocarbon groups which may contain a hetero atom.

Alternatively, a combination of $R^{L07}$ to $R^{L16}$ may bond together to form a ring (e.g., a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, etc.). Each of $R^{L07}$ to $R^{L16}$ represents a divalent $C_1$-$C_{15}$ hydrocarbon group which may contain a hetero atom, when they form a ring. Two of $R^{L07}$ to $R^{L16}$ which are attached to vicinal carbon atoms may bond together directly to form a double bond (e.g., a pair of $R^{L07}$ and $R^{L09}$, $R^{L09}$ and $R^{L15}$, $R^{L13}$ and $R^{L15}$, etc.). Letter y is an integer of 0 to 6. Letter m is equal to 0 or 1, n is equal to 0, 1, 2 or 3, and 2m+n is equal to 2 or 3.

The dissolution regulator may be formulated in an amount of 0 to 50 parts, preferably 0 to 40 parts, and more preferably 0 to 30 parts, per 100 parts of the base resin, and may be used singly or as a mixture of two or more thereof. More than 50 parts of the dissolution regulator would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Basic Compound

In the resist composition of the invention, a basic compound may be blended. A suitable basic compound used herein is a compound capable of suppressing the rate of diffusion when the acid generated by the acid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogen-containing compounds include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B1) may also be included alone or in admixture.

$$N(X)_n(Y)_{3-n} \tag{B1}$$

In the formula, n is equal to 1, 2 or 3; Y is independently hydrogen or a straight, branched or cyclic $C_1$-$C_{20}$ alkyl group which may contain a hydroxyl group or ether; and X is independently selected from groups of the following general formulas (X1) to (X3), and two or three X's may bond together to form a ring.

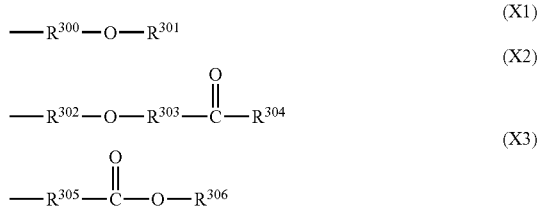

In the formulas, $R^{300}$, $R^{302}$ and $R^{305}$ are independently straight or branched $C_1$-$C_4$ alkylene groups; $R^{301}$ and $R^{304}$ are independently hydrogen, straight, branched or cyclic $C_1$-$C_{20}$ alkyl groups, which may contain one or more hydroxyl group, ether, ester or lactone ring; and $R^{303}$ is a single bond or a straight or branched $C_1$-$C_4$ alkylene group.

Illustrative examples of the compounds of formula (B1) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compound is preferably formulated in an amount of 0.001 to 10 parts, and especially 0.01 to 1 part, per part of the acid generator. Less than 0.001 part of the basic compound may fail to achieve the desired effects thereof, while the use of more than 10 parts may result in too low a sensitivity and resolution.

Other Components

In the resist composition, a compound bearing a ≡C—COOH group in a molecule may be blended. Exemplary, non-limiting compounds bearing a ≡C—COOH group include one or more compounds selected from Groups I and II below.

Including this compound improves the PED stability of the resist and ameliorates edge roughness on nitride film substrates.

Group I

Compounds of the general formulas (A1) to (A10) below in which some or all of the hydrogen atoms on the phenolic hydroxyl groups have been replaced by —$R^{401}$—COOH (wherein $R^{401}$ is a straight or branched $C_1$-$C_{10}$ alkylene), and in which the molar ratio C/(C+D) of phenolic hydroxyl groups (C) to ≡C—COOH groups (D) in the molecule is from 0.1 to 1.0.

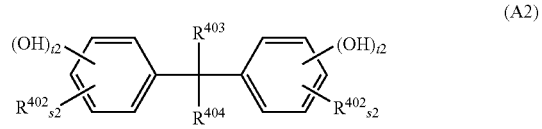

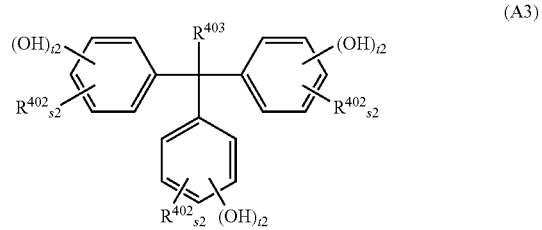

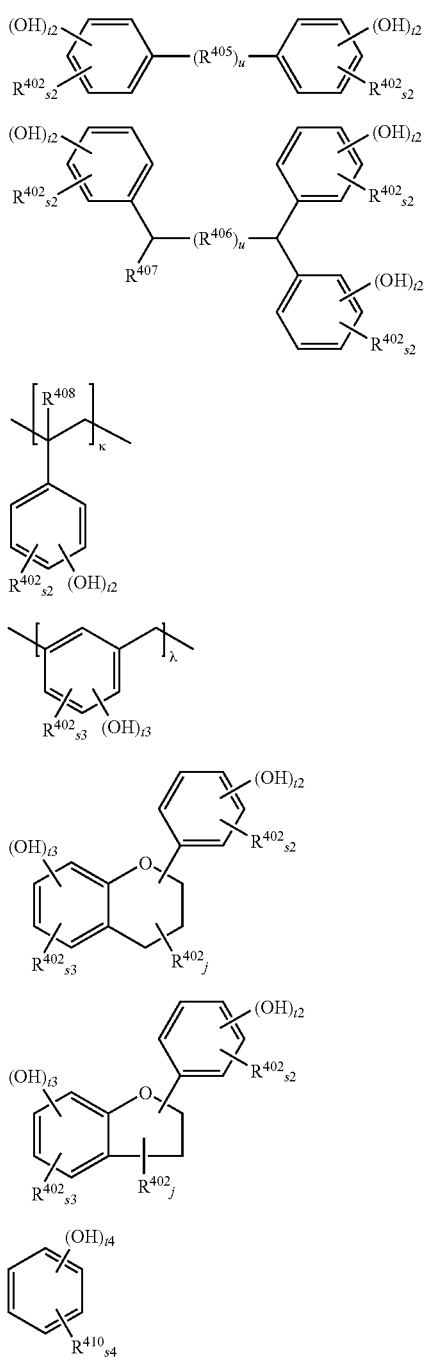
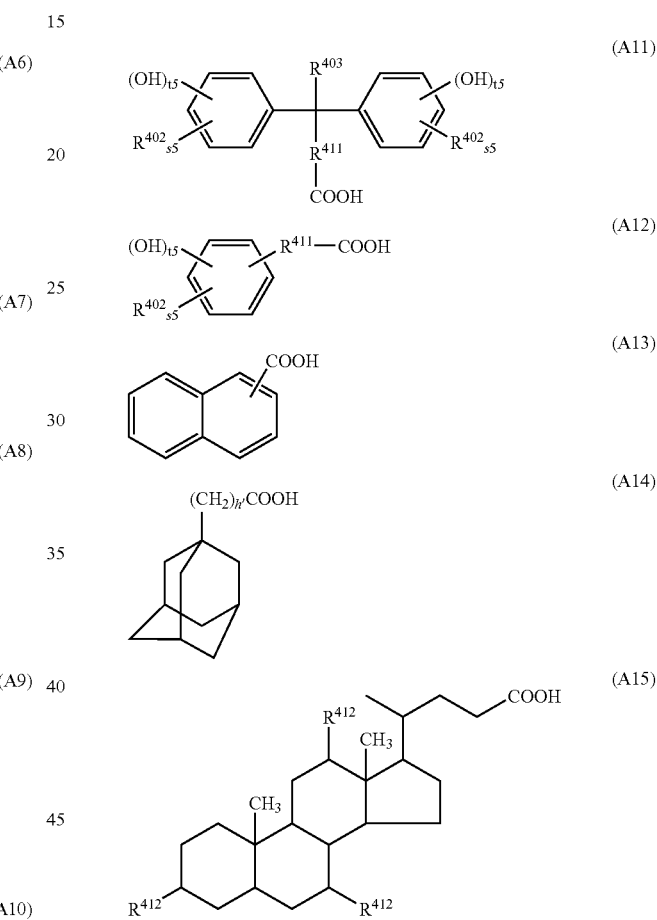

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —($R^{409}$)$_h$—COOR' group (R' being hydrogen or —$R^{409}$—COOH); $R^{405}$ is —(CH$_2$)$_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$— COOH group; $R^{411}$ is a straight or branched $C_1$-$C_{10}$ alkylene; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II

Compounds of general formulas (A11) to (A15) below.

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is equal to 0 or 1.

Illustrative, non-limiting examples of the compound bearing a ≡C—COOH group include compounds of the general formulas AI-1 to AI-14 and AII-1 to AII-10 below.

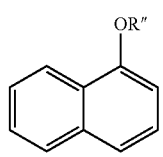

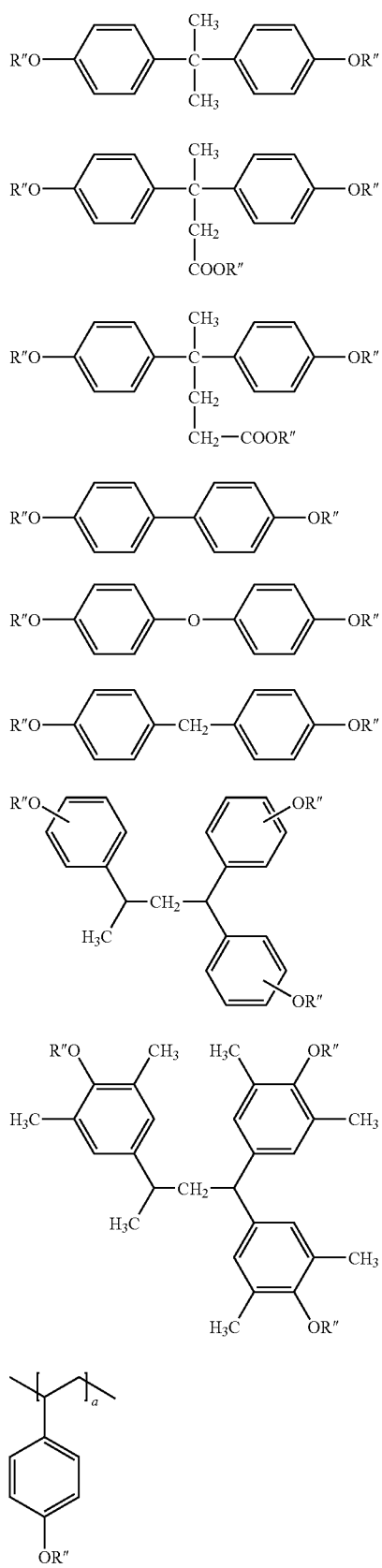
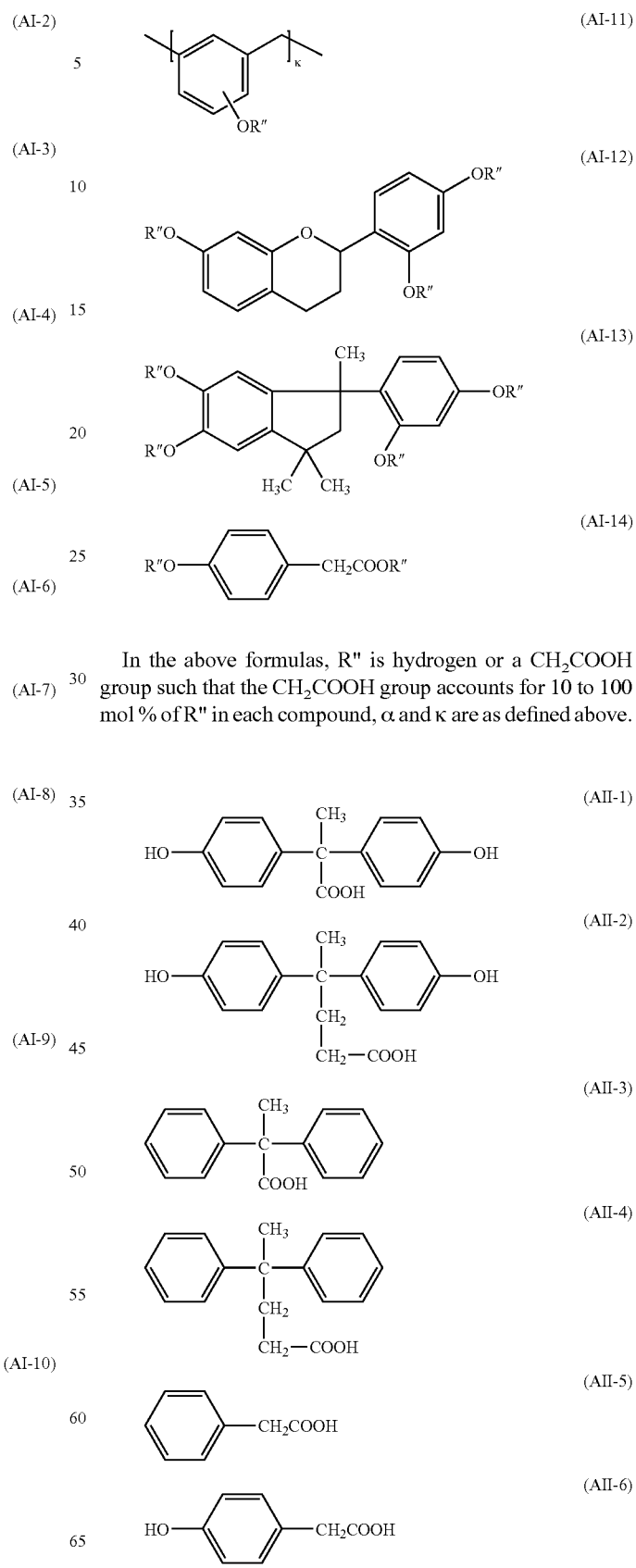
In the above formulas, R″ is hydrogen or a CH₂COOH group such that the CH₂COOH group accounts for 10 to 100 mol % of R″ in each compound, α and κ are as defined above.

-continued

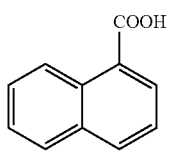
(AII-7)

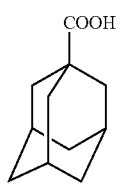
(AII-8)

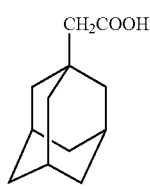
(AII-9)

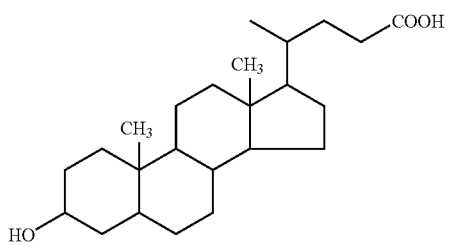
(AII-10)

The compound bearing a =C—COOH group within the molecule may be used singly or as combinations of two or more thereof. The compound bearing a =C—COOH group within the molecule is added in an amount ranging from 0 to 5 parts, preferably 0.1 to 5 parts, more preferably 0.1 to 3 parts, further preferably 0.1 to 2 parts, per 100 parts of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below.

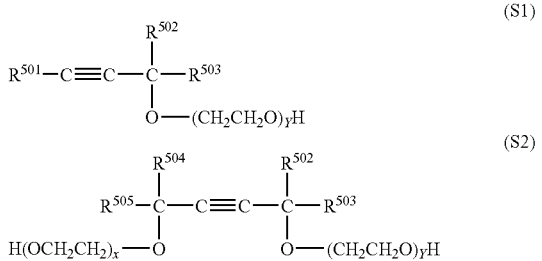

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 0.1% by weight, per 100% by weight of the resist composition. Less than 0.01% by weight may be ineffective for improving coating characteristics and shelf stability, whereas more than 2% by weight may result in a resist having a low resolution.

The resist composition of the invention may include, as an optional ingredient, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M Co., Ltd., Surflon S-141, S-145, KH-10, KH-20, KH-30 and KH-40 from Asahi Glass Co., Ltd., Unidyne DS-401, DS-403 and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants are Fluorad FC-430 from Sumitomo 3M Co., Ltd., KH-20 and KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.2 to 2.0 µm, which is then pre-baked on a hot plate at 60 to 150° C. for 1 to 10 minutes, and preferably at 80 to 130° C. for 1 to 5 minutes. A mask having the desired pattern is then placed over the resist film, and the film exposed through the mask to an electron beam or to high-energy radiation such as deep-UV, excimer laser, or x-ray in a dose of about 1 to 200 mJ/cm², and preferably about 5 to 100 mJ/cm², then post-exposure baked (PEB) on a hot plate at 60 to 150° C. for 1 to 5 minutes, and preferably at 80 to 130° C. for 1 to 3 minutes. Finally, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray method for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV having a wavelength of 248 to 193 nm, excimer laser, x-ray, or an electron beam. The desired pattern may not be obtainable outside the upper and lower limits of the above range.

The hydrogenated ring-opening metathesis polymer used herein has improved heat resistance, pyrolysis resistance and light transmission and is suited as a photoresist for semiconductor microfabrication using UV or deep-UV and of great worth in the industry. The resist composition comprising the polymer as a base resin lends itself to micropatterning with electron beam or deep-UV since it is sensitive to high-energy radiation and has excellent sensitivity, resolution, and etching resistance. Especially because of the minimized absorption at the exposure wavelength of an ArF or KrF excimer laser, a finely defined pattern having sidewalls perpendicular to the substrate can easily be formed.

EXAMPLE

Examples are given below by way of illustration and not by way of limitation. The abbreviation Me stands for methyl, Pri for isopropyl, and Ph for phenyl.

Examples

Hydrogenated products of ring-opening metathesis polymers were synthesized according to the following procedure. The physical properties of the polymers were assessed by the following tests.

Average Molecule Weight:

GPC analysis was conducted on a solution in tetrahydrofuran of the polymer resulting from ring-opening metathesis of cyclic olefins or the hydrogenated product of the polymer, using detectors 830-RI and 875-UV (Nippon Bunko K.K.) and columns Shodexk-805, 804, 803, 802.5 while flowing the solution at a rate of 1.0 ml/min at room temperature. The molecular weight was calibrated using polystyrene standards.

Hydrogenation:

The hydrogenated product of ring-opening metathesis polymer in powder form was dissolved in deuterated chloroform. Using 270 MHz $^1$H-NMR, a peak of $\delta$=4.0 to 6.5 ppm attributable to the carbon-to-carbon double bond on the backbone was observed. A percent hydrogenation was computed from a reduction of this peak before and after hydrogenation reaction.

Molar Compositional Ratio of Structural Units:

The hydrogenated product of ring-opening metathesis polymer in powder form was dissolved in deuterated tetrahydrofuran. A molar percent ratio was computed from an integrated value of peaks of $\delta$=170 to 190 ppm attributable to carbonyl observed using 400 MHz $^{13}$C-NMR.

Proportion of Carboxylic Acid in Polymer:

It was determined by neutralization titration using Bromothymol Blue indicator.

Example 1

Synthesis of Polymer 1

In a 500-ml autoclave, 27.81 g of 8-(methoxymethyloxycarbonyl)-tetracyclo[4.4.0.1$^{2,5}$.1$^{7,10}$]-3-dodecene and 17.04 g of 4,10-dioxatricyclo[5.2.1.0$^{2,6}$]dec-8-en-3-one as cyclic olefin monomers were dissolved in 250 ml of tetrahydrofuran (THF). To the solution were added 1.25 g of 1,5-hexadiene and 343 mg of Mo(N-2,6-Pri$_2$C$_6$H$_3$)(CHCMe$_2$Ph)(OCMe(CF$_3$)$_2$)$_2$ as a polymerization catalyst. Reaction was effected for 2 hours at 50° C. Thereafter, 100 mg of butyraldehyde was added to the reaction mixture, which was stirred for 30 minutes to stop the reaction. The ring-opening metathesis polymer solution was poured into methanol for precipitation. Subsequent filtration, methanol washing and vacuum drying yielded 43.7 g of a ring-opening metathesis polymer powder.

Thereafter, in a 500-ml autoclave, 40.0 g of the ring-opening metathesis polymer powder was dissolved in 200 ml of THF. A previously prepared solution of 40 mg of chlorohydridocarbonyltris(triphenylphosphine)ruthenium(II) and 13 mg of triethylamine in 40 ml of THF was added thereto as a hydrogenation catalyst. Hydrogenation reaction was effected at a hydrogen pressure of 8.0 MPa and 140° C. for 5 hours.

The temperature was brought back to room temperature and the hydrogen gas was released. The hydrogenated ring-opening metathesis polymer solution was poured into methanol for precipitation. Subsequent filtration and vacuum drying yielded 39.2 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 13,100 and a Mw/Mn of 2.19. On $^{13}$C-NMR analysis, the polymer had a compositional ratio of structural units [A]/[B] equal to 50/50 (molar ratio). FIG. 1 shows a $^1$H-NMR spectrum (600 MHz, THF-d8) of the hydrogenated ring-opening metathesis polymer.

Example 2

Synthesis of Polymer 2

Ring-opening metathesis polymerization was effected as in Example 1 except that some reactants were changed to 34.10 g of 8-(2,2-dimethylpropyloxymethyloxycarbonyl)-tetracyclo-[4.4.0.1$^{2,5}$.1$^{7,10}$]-3-dodecene and 17.04 g of 4,10-dioxatricyclo-[5.2.1.0$^{2,6}$]dec-8-en-3-one as cyclic olefin monomers, 2.53 g of 1,6-heptadiene, and 269 mg of Mo(N-2,6-Me$_2$C$_6$H$_3$)(CHCMe$_2$Ph)-(OCMe$_2$(CF$_3$))$_2$ as a polymerization catalyst. There was yielded 50.8 g of a ring-opening metathesis polymer powder.

As in Example 1, hydrogenation reaction was effected on 40.0 g of the ring-opening metathesis polymer powder, yielding 38.9 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 8,400 and a Mw/Mn of 1.98. On $^{13}$C-NMR analysis, the polymer had a compositional ratio of structural units [A]/[B] equal to 50/50 (molar ratio).

Example 3

Synthesis of Polymer 3

Ring-opening metathesis polymerization was effected as in Example 1 except that some reactants were changed to 33.65 g of 8-(1-ethylcyclopentyloxycarbonyl)-tetracyclo-[4.4.0.1$^{2,5}$.1$^{7,10}$]-3-dodecene and 17.04 g of 4,10-dioxatricyclo-[5.2.1.0$^{2,6}$]dec-8-en-3-one as cyclic olefin monomers, 2.32 g of 1,6-heptadiene, and 221 mg of Mo(N-2,6-Me$_2$C$_6$H$_3$)(CHCMe$_2$Ph)-(OCMe$_3$)$_2$ as a polymerization catalyst. There was yielded 50.1 g of a ring-opening metathesis polymer powder.

As in Example 1, hydrogenation reaction was effected on 40.0 g of the ring-opening metathesis polymer powder, yielding 39.2 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 9,000 and a Mw/Mn of 2.01. On $^{13}$C-NMR analysis, the polymer had a compositional ratio of structural units [B]/[D] equal to 50/50 (molar ratio).

A 500-ml autoclave was charged with 30.0 g of the hydrogenated ring-opening metathesis polymer along with 14 ml of 2N HCl and 300 ml of THF. The mixture was stirred at 80° C. for 12 hours, cooled, and poured into methanol for precipitation, followed by filtration and vacuum drying, yielding 22.1 g of an ester-decomposed hydrogenated ring-opening metathesis polymer in white powder form. On $^{13}$C-NMR analysis, the polymer had a compositional ratio of structural units [B]/[E] equal to 50/50 (molar ratio). On GPC analysis, the polymer had a weight average molecular weight Mw of 9,100 and a Mw/Mn of 2.09.

To a mixture of 20.0 g of the thus obtained hydrogenated ring-opening metathesis polymer in which the ester had been decomposed into carboxylic acid, 6.18 g of triethylamine, and 80.0 g of N,N-dimethylformamide, 11.14 g of 1-adamantyl chloromethyl ether was added dropwise at 5° C., and the mixture was allowed to react for 3 hours. Water was added to quench the reaction, after which dilute hydrochloric acid, THF and ethyl acetate were added, and the water layer was separated off. Then the organic layer was washed with water and concentrated. The crude product was diluted with THF, and the resulting polymer solution was poured into deionized water for precipitation. Subsequent filtration, deionized water washing, and vacuum drying yielded 27.9 g of a hydrogenated ring-opening metathesis polymer in white powder form. On GPC analysis, the polymer had a weight average molecular weight Mw of 9,400 and a Mw/Mn of 2.12. On $^{13}$C-NMR analysis, the polymer had a compositional ratio of structural units [A]/[B] equal to 50/50 (molar ratio).

Example 4

Synthesis of Polymer 4

Reaction was effected as in Example 3 except that 20.0 g of the hydrogenated ring-opening metathesis polymer in which the ester had been decomposed into carboxylic acid (Mw=9,100, Mw/Mn=2.09) obtained in Example 3, 6.18 g of triethylamine, 80.0 g of N,N-dimethylformamide, 11.14 g of 2-adamantyl chloromethyl ether were used. There was obtained 28.1 g of a hydrogenated ring-opening metathesis polymer in white powder form. On GPC analysis, the polymer had a weight average molecular weight Mw of 9,700 and a Mw/Mn of 2.14. On $^{13}$C-NMR analysis, the polymer had a compositional ratio of structural units [A]/[B] equal to 50/50 (molar ratio).

Example 5

Synthesis of Polymer 5

In a 500-ml autoclave, 33.37 g of 8-(methoxymethyloxycarbonyl)-tetracyclo[4.4.0.1$^{2,5}$.1$^{7,10}$]-3-dodecene and 13.63 g of 4,10-dioxatricyclo[5.2.1.0$^{2,6}$] dec-8-en-3-one as cyclic olefin monomers were dissolved in 250 ml of THF. To the solution was added 5.30 g of Mo(N-2,6-Me$_2$C$_6$H$_3$)(CHCMe$_2$Ph)(OCMe(CF$_3$)$_2$)$_2$ as a polymerization catalyst. Reaction was effected for 3 hours at room temperature. Thereafter, 0.65 g of butyraldehyde was added to the reaction mixture, which was stirred for 30 minutes to stop the reaction. The ring-opening metathesis polymer solution was poured into methanol for precipitation. Subsequent filtration, methanol washing and vacuum drying yielded 44.7 g of a ring-opening metathesis polymer powder.

Thereafter, in a 500-ml autoclave, 40.0 g of the ring-opening metathesis polymer powder was dissolved in 250 ml of THF, and 4.0 g of 5% palladium on carbon was added thereto as a hydrogenation catalyst. Hydrogenation reaction was effected at a hydrogen pressure of 8.1 MPa and 165° C. for 5 hours. The temperature was brought back to room temperature and the hydrogen gas was released. The hydrogenated ring-opening metathesis polymer solution was poured into methanol for precipitation. Subsequent filtration and vacuum drying yielded 39.6 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 16,600 and a Mw/Mn of 1.13. On $^{13}$C-NMR analysis, the polymer had a compositional ratio of structural units [A]/[B] equal to 60140 (molar ratio).

Example 6

Synthesis of Polymer 6

Ring-opening metathesis polymerization was effected as in Example 1 except that some reactants were changed to 22.25 g of 8-(methoxymethyloxycarbonyl)-tetracyclo[4.4.0.1$^{2,5}$.1$^{7,10}$]-3-dodecene and 20.45 g of 4,10-dioxatricyclo[5.2.1.0$^{2,6}$]dec-8-en-3-one as cyclic olefin monomers, 6.43 g of 1-octene, and 431 mg of W(N-2,6-Pri$_2$C$_6$H$_3$)(CHCMe$_2$Ph)(OC(CF$_3$)$_3$)$_2$ as a polymerization catalyst. There was yielded 46.1 g of a ring-opening metathesis polymer powder.

Then 40.0 g of the ring-opening metathesis polymer powder was dissolved in 250 ml of THF, and a solution of 40 mg of dichlorotris(triphenylphosphine)ruthenium(II) and 13 mg of triethylamine in 40 ml of THF was added thereto as a hydrogenation catalyst. Hydrogenation reaction was effected as in Example 1. There was yielded 39.2 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 7,300 and a Mw/Mn of 2.54. On $^{13}$C-NMR analysis, the polymer had a compositional ratio of structural units [A]/[B] equal to 40/60 (molar ratio).

Example 7

Synthesis of Polymer 7

Ring-opening metathesis polymerization was effected as in Example 5 except that some reactants were changed to 27.81 g of 8-(methoxymethyloxycarbonyl)-tetracyclo[4.4.0.1$^{2,5}$.1$^{7,10}$]-3-dodecene and 18.61 g of spiro[dihydrofuran-2(3H)-one-3,5'-7'-oxabicyclo[2.2.1]hepta-2'-ene] as cyclic olefin monomers and 5.89 g of Mo(N-2,6-Pri$_2$C$_6$H$_3$)(CHCMe$_2$Ph)(OCMe$_2$(CF$_3$))$_2$ as a polymerization catalyst. There was yielded 44.1 g of a ring-opening metathesis polymer powder.

Then 40.0 g of this ring-opening metathesis polymer powder was dissolved in 250 ml of THF. Hydrogenation reaction was effected as in Example 5, yielding 38.7 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 14,000 and a Mw/Mn of 1.16. On $^{13}$C-NMR analysis, the polymer had a compositional ratio of structural units [A]/[C] equal to 50/50 (molar ratio).

Example 8

Synthesis of Polymer 8

Ring-opening metathesis polymerization was effected as in Example 1 except that some reactants were changed to 21.09 g of 8-(1-ethylcyclopentyloxycarbonyl)-tetracyclo-[4.4.0.1$^{2,5}$.1$^{7,10}$]-3-dodecene, 13.63 g of 4,10-dioxatricyclo-[5.2.1.0$^{2,6}$]dec-8-en-3-one and 10.09 g of 4-oxatricyclo-[5.2.1.0$^{2,6}$]dec-8-en-3-one as cyclic olefin monomers, 2.84 g of 1,6-heptadiene, and 431 mg of W(N-2,6-Pri$_2$C$_6$H$_3$)(CHCMe$_2$Ph)-(OC(CF$_3$)$_3$)$_2$ as a polymerization catalyst. There was yielded 44.2 g of a ring-opening metathesis polymer powder.

Then 40.0 g of this ring-opening metathesis polymer powder was dissolved in 250 ml of THF. Hydrogenation reaction was effected as in Example 1, yielding 39.8 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 7,200 and a Mw/Mn of 2.12. On $^{13}$C-NMR analysis, the polymer had a compositional ratio of structural units [B]/[D] equal to 70/30 (molar ratio).

Aside from using 30.0 g of the hydrogenated ring-opening metathesis polymer obtained above and effecting reaction at 80° C. for 6 hours, the procedure of Example 3 was repeated. There was obtained 24.3 g of a hydrogenated ring-opening metathesis polymer in which the ester was decomposed into carboxylic acid. On $^{13}$C-NMR analysis, the polymer had a compositional ratio of structural units [B]/[E] equal to 70/30 (molar ratio). On GPC analysis, the polymer had a weight average molecular weight Mw of 7,300 and a Mw/Mn of 2.15.

Aside from using 20.0 g of the thus obtained hydrogenated ring-opening metathesis polymer in which the ester had been decomposed into carboxylic acid, 3.94 g of triethylamine, 80.0 g of N,N-dimethylformamide, and 2.85 g of chloromethyl methyl ether, the procedure of Example 3 was repeated. There was obtained 20.5 g of a hydrogenated ring-opening metathesis polymer in white powder form. On GPC analysis, the polymer had a weight average molecular weight Mw of 7,500 and a Mw/Mn of 2.16. On $^{13}$C-NMR analysis, the polymer had a compositional ratio of structural units [A]/[B] equal to 30/70 (molar ratio).

Example 9

Synthesis of Polymer 9

Ring-opening metathesis polymerization was effected as in Example 1 except that some reactants were changed to 13.46 g of 8-(1-ethylcyclopentyloxycarbonyl)-tetracyclo-[4.4.0.1$^{2,5}$.1$^{7,10}$]-3-dodecene, 13.63 g of 4,10-dioxatricyclo-[5.2.1.0$^{2,6}$]dec-8-en-3-one and 13.46 g of 4-oxatricyclo-[5.2.1.0$^{2,6}$]dec-8-en-3-one as cyclic olefin monomers, 2.83 g of 1,5-hexadiene, and 382 mg of W(N-2,6-Pri$_2$C$_6$H$_3$)(CHCMe$_2$Ph)-(OCMe(CF$_3$)$_2$)$_2$ as a polymerization catalyst. There was yielded 40.9 g of a ring-opening metathesis polymer powder.

Then 40.0 g of this ring-opening metathesis polymer powder was dissolved in 250 ml of THF, and a solution of 40 mg of dichlorotris(triphenylphosphine)ruthenium(II) and 13 mg of triethylamine in 40 ml of THF was added thereto as a hydrogenation catalyst. Hydrogenation reaction was effected as in Example 1, yielding 39.9 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 6,700 and a Mw/Mn of 2.03. On $^{13}$C-NMR analysis, the polymer had a compositional ratio of structural units [B]/[D] equal to 80/20 (molar ratio).

Aside from using 30.0 g of the hydrogenated ring-opening metathesis polymer obtained above and effecting reaction at 80° C. for 3 hours, the procedure of Example 3 was repeated. There was obtained 25.5 g of a hydrogenated ring-opening metathesis polymer in which the ester was decomposed into carboxylic acid. On $^{13}$C-NMR analysis, the polymer had a compositional ratio of structural units [B]/[E] equal to 80/20 (molar ratio). On GPC analysis, the polymer had a weight average molecular weight Mw of 6,900 and a Mw/Mn of 2.10.

Aside from using 20.0 g of the thus obtained hydrogenated ring-opening metathesis polymer in which the ester had been decomposed into carboxylic acid, 2.71 g of triethylamine, 80.0 g of N,N-dimethylformamide, and 4.90 g of 2-adamantyl chloromethyl ether, the procedure of Example 3 was repeated. There was obtained 22.8 g of a hydrogenated ring-opening metathesis polymer in white powder form. On GPC analysis, the polymer had a weight average molecular weight Mw of 6,800 and a Mw/Mn of 2.11. On $^{13}$C-NMR analysis, the polymer had a compositional ratio of structural units [A]/[B] equal to 20/80 (molar ratio).

Example 10

Synthesis of Polymer 10

Ring-opening metathesis polymerization was effected as in Example 5 except that some reactants were changed to 20.19 g of 8-(1-ethylcyclopentyloxycarbonyl)-tetracyclo-[4.4.0.1$^{2,5}$.1$^{7,10}$]-3-dodecene, 13.63 g of 4,10-dioxatricyclo-[5.2.1.0$^{2,6}$]dec-8-en-3-one and 11.03 g of spiro[dihydrofuran-2(3H)-one-3,5'-bicyclo[2.2.1]hept-2'-en] as cyclic olefin monomers, and 6.04 g of Ru(P(C$_6$H$_{11}$)$_3$)$_2$(CHPh)Cl$_2$ as a polymerization catalyst. There was yielded 42.6 g of a ring-opening metathesis polymer powder.

Then 40.0 g of this ring-opening metathesis polymer powder was dissolved in 250 ml of THF, and a solution of 40 mg of dichlorotris(triphenylphosphine)ruthenium(II) and 13 mg of triethylamine in 40 ml of THF was added thereto as a hydrogenation catalyst. Hydrogenation reaction was effected as in Example 1, yielding 39.2 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 9,900 and a Mw/Mn of 1.60. On $^{13}$C-NMR analysis, the polymer had a compositional ratio of structural units [B]/[C]/[D] equal to 40/30/30 (molar ratio).

Aside from using 30.0 g of the hydrogenated ring-opening metathesis polymer obtained above and effecting reaction at 80° C. for 4 hours, the procedure of Example 3 was repeated. There was obtained 24.4 g of a hydrogenated ring-opening metathesis polymer in which the ester was decomposed into carboxylic acid. On $^{13}$C-NMR analysis, the polymer had a compositional ratio of structural units [B]/[C]/[E] equal to 40/30/30 (molar ratio). On GPC analysis, the polymer had a weight average molecular weight Mw of 10,100 and a Mw/Mn of 1.61.

Aside from using 20.0 g of the thus obtained hydrogenated ring-opening metathesis polymer in which the ester had been decomposed into carboxylic acid, 3.84 g of triethylamine, 80.0 g of N,N-dimethylformamide, and 6.94 g of 2-adamantyl chloromethyl ether, the procedure of Example 3 was repeated. There was obtained 24.4 g of a hydrogenated ring-opening metathesis polymer in white powder form. On GPC analysis, the polymer had a weight average molecular weight Mw of 10,200 and a Mw/Mn of 1.62. On $^{13}$C-NMR analysis, the polymer had a compositional ratio of structural units [A]/[B]/[C] equal to 30/40/30 (molar ratio).

Example 11

Synthesis of Polymer 11

Ring-opening metathesis polymerization was effected as in Example 1 except that some reactants were changed to 27.81 g of 8-(methoxymethyloxycarbonyl)-tetracyclo[4.4.0.1$^{2,5}$.1$^{7,10}$]-3-dodecene, 17.04 g of 4,10-dioxatricyclo[5.2.1.0$^{2,6}$]dec-8-en-3-one as cyclic olefin monomers, 1.80 g of 1,6-heptadiene, and 246 mg of Mo(N-2,6-Pri$_2$C$_6$H$_3$)(CHCMe$_2$Ph)(OCMe$_3$)$_2$ as a polymerization catalyst. There was yielded 44.1 g of a ring-opening metathesis polymer powder.

Aside from using 40.0 g of this ring-opening metathesis polymer powder, hydrogenation reaction was effected as in Example 1. There was obtained 38.8 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 11,000 and a Mw/Mn of 1.77. On $^{13}$C-NMR analysis, the polymer had a compositional ratio of structural units [A]/[B] equal to 50/50 (molar ratio).

Aside from dissolving 30.0 g of this hydrogenated ring-opening metathesis polymer in 300 ml of THF, adding 20 ml of 0.1N HCl, and effecting reaction at 60° C. for 2.5 hours, the procedure of Example 3 was repeated. There was obtained 27.1 g of a hydrogenated ring-opening metathesis polymer in which the ester was decomposed into carboxylic acid. On GPC analysis, the polymer had a weight average molecular weight Mw of 11,200 and a Mw/Mn of 1.82. On $^{13}$C-NMR analysis, the polymer had a compositional ratio of structural units [A]/[B]/[E] equal to 39/50/11 (molar ratio).

Example 12

Synthesis of Polymer 12

Ring-opening metathesis polymerization was effected as in Example 1 except that some reactants were changed to 26.92 g of 8-(1-ethylcyclopentyloxycarbonyl)-tetracyclo-[4.4.0.1$^{2,5}$.1$^{7,10}$]-3-dodecene, 20.45 g of 4,10-dioxatricycle-[5.2.1.0$^{2,6}$]dec-8-en-3-one as cyclic olefin monomers, 6.43 g of 1-octene, and 334 mg of W(N-2,6-Pri$_2$C$_6$H$_3$)(CHCMe$_2$Ph)-(OCMe$_2$(CF$_3$))$_2$ as a polymerization catalyst. There was yielded 50.5 g of a ring-opening metathesis polymer powder.

Then 40.0 g of this ring-opening metathesis polymer powder was dissolved in 250 ml of THF, and a solution of 40 mg of dichlorotris(triphenylphosphine)ruthenium(II) and 13 mg of triethylamine in 40 ml of THF was added thereto as a hydrogenation catalyst. Hydrogenation reaction was effected as in Example 1, yielding 39.8 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 7,500 and a Mw/Mn of 2.48. On $^{13}$C-NMR analysis, the polymer had a compositional ratio of structural units [B]/[D] equal to 60/40 (molar ratio).

Aside from using 30.0 g of the hydrogenated ring-opening metathesis polymer obtained above and effecting reaction at 80° C. for 8 hours, the procedure of Example 3 was repeated. There was obtained 23.3 g of a hydrogenated ring-opening metathesis polymer in which the ester was decomposed into carboxylic acid. On $^{13}$C-NMR analysis, the polymer had a compositional ratio of structural units [B]/[E] equal to 60/40 (molar ratio). On GPC analysis, the polymer had a weight average molecular weight Mw of 8,100 and a Mw/Mn of 2.62.

Aside from using 20.0 g of the thus obtained hydrogenated ring-opening metathesis polymer in which the ester had been decomposed into carboxylic acid, 2.71 g of triethylamine, 80.0 g of N,N-dimethylformamide, and 2.76 g of chloromethyl methyl ether, the procedure of Example 3 was repeated. There was obtained 20.4 g of a hydrogenated ring-opening metathesis polymer in white powder form. On GPC analysis, the polymer had a weight average molecular weight Mw of 8,300 and a Mw/Mn of 2.86. On $^{13}$C-NMR analysis, the polymer had a compositional ratio of structural units [A]/[B]/[E] equal to 30/60/10 (molar ratio).

Example 13

Synthesis of Polymer 13

Ring-opening metathesis polymerization was effected as in Example 1 except that some reactants were changed to 33.65 g of 8-(1-ethylcyclopentyloxycarbonyl)-tetracyclo-[4.4.0.1$^{2,5}$.1$^{7,10}$]-3-dodecene, 20.18 g of 4,10-dioxa-5,5-dimethyltricyclo[5.2.1.0$^{2,6}$]dec-8-en-3-one as cyclic olefin monomers, 1.27 g of 1,5-hexadiene, and 343 mg of Mo(N-2,6-Pri$_2$C$_6$H$_3$)(CHCMe$_2$Ph)(OCMe(CF$_3$)$_2$)$_2$. There was yielded 52.2 g of a ring-opening metathesis polymer powder.

Then 40.0 g of this ring-opening metathesis polymer powder was dissolved in 250 ml of THF, and 4.0 g of 5% palladium on carbon was added thereto as a hydrogenation catalyst. Hydrogenation reaction was effected at a hydrogen pressure of 8.1 MPa and 165° C. for 5 hours. The temperature was brought back to room temperature and the hydrogen gas was released. The hydrogenated ring-opening metathesis polymer solution was poured into methanol for precipitation. Subsequent filtration and vacuum drying yielded 39.5 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 12,900 and a Mw/Mn of 2.19. On $^{13}$C-NMR analysis, the polymer had a compositional ratio of structural units [B]/[D] equal to 50/50 (molar ratio).

Aside from using 30.0 g of the hydrogenated ring-opening metathesis polymer obtained above and effecting reaction at 80° C. for 12 hours, the procedure of Example 3 was repeated. There was obtained 22.8 g of a hydrogenated ring-opening metathesis polymer in which the ester was decomposed into carboxylic acid. On $^{13}$C-NMR analysis, the polymer had a compositional ratio of structural units [B]/[E] equal to 50/50

(molar ratio). On GPC analysis, the polymer had a weight average molecular weight Mw of 13,000 and a Mw/Mn of 2.21.

Aside from using 20.0 g of the thus obtained hydrogenated ring-opening metathesis polymer in which the ester had been decomposed into carboxylic acid, 4.58 g of triethylamine, 80.0 g of N,N-dimethylformamide, and 3.31 g of chloromethyl methyl ether, the procedure of Example 3 was repeated. There was obtained 20.7 g of a hydrogenated ring-opening metathesis polymer in white powder form. On GPC analysis, the polymer had a weight average molecular weight Mw of 13,200 and a Mw/Mn of 2.23. On $^{13}$C-NMR analysis, the polymer had a compositional ratio of structural units [A]/[B]/[E] equal to 40/50/10 (molar ratio).

Example 14

Synthesis of Polymer 14

Ring-opening metathesis polymerization was effected as in Example 1 except that some reactants were changed to 20.41 g of 5-(methoxymethyloxycarbonyl)-bicyclo[2.2.1]hept-2-ene, 17.04 g of 4,10-dioxa-5,5-dimethyltricyclo[5.2.1.0$^{2,6}$]dec-8-en-3-one as cyclic olefin monomers, 2.30 g of 1,5-hexadiene, and 295 mg of Mo(N-2,6-Pri$_2$C$_6$H$_3$)(CHCMe$_2$Ph)(OCMe$_2$(CF$_3$))$_2$. There was yielded 37.5 g of a ring-opening metathesis polymer powder.

Then 30.0 g of this ring-opening metathesis polymer powder was dissolved in 250 ml of THF. Hydrogenation reaction was effected as in Example 1, yielding 30.1 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 8,100 and a Mw/Mn of 2.14. On $^{13}$C-NMR analysis, the polymer had a compositional ratio of structural units [A]/[B] equal to 50/50 (molar ratio).

Example 15

Synthesis of Polymer 15

Ring-opening metathesis polymerization was effected as in Example 1 except that some reactants were changed to 26.24 g of 5-(1-ethylcyclopentyloxycarbonyl)-bicyclo[2.2.1]hept-2-ene, 17.04 g of 4,10-dioxa-5,5-dimethyltricyclo[5.2.1.0$^{2,6}$]-dec-8-en-3-one as cyclic olefin monomers, 1.80 g of 1,5-hexadiene, and 269 mg of Mo(N-2,6-Me$_2$C$_6$H$_3$)(CHCMe$_2$Ph)-(OCMe$_2$(CF$_3$))$_2$. There was yielded 42.7 g of a ring-opening metathesis polymer powder.

Then 40.0 g of this ring-opening metathesis polymer powder was dissolved in 250 ml of THF. Hydrogenation reaction was effected as in Example 1, yielding 41.0 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 9,700 and a Mw/Mn of 2.08. On $^{13}$C-NMR analysis, the polymer had a compositional ratio of structural units [B]/[D] equal to 50/50 (molar ratio).

Aside from using 30.0 g of the hydrogenated ring-opening metathesis polymer obtained above and effecting reaction at 80° C. for 15 hours, the procedure of Example 3 was followed. There was obtained 21.4 g of a hydrogenated ring-opening metathesis polymer in which the ester was decomposed into carboxylic acid. On $^{13}$C-NMR analysis, the polymer had a compositional ratio of structural units [B]/[E] equal to 50/50 (molar ratio). On GPC analysis, the polymer had a weight average molecular weight Mw of 9,800 and a Mw/Mn of 2.11.

Aside from using 20.0 g of the thus obtained hydrogenated ring-opening metathesis polymer in which the ester had been decomposed into carboxylic acid, 7.57 g of triethylamine, 80.0 g of N,N-dimethylformamide, and 9.31 g of 2,2-dimethylpropyl chloromethyl ether, the procedure of Example 3 was followed. There was obtained 25.5 g of a hydrogenated ring-opening metathesis polymer in white powder form. On GPC analysis, the polymer had a weight average molecular weight Mw of 10,200 and a Mw/Mn of 2.16. On $^{13}$C-NMR analysis, the polymer had a compositional ratio of structural units [A]/[B] equal to 50/50 (molar ratio).

Example 16

Synthesis of Polymer 16

The procedure of Example 15 was followed aside from using 20.0 g of the hydrogenated ring-opening metathesis polymer having the ester decomposed into carboxylic acid (Mw=9,800, Mw/Mn=2.11) obtained in Example 15, 6.06 g of triethylamine, 80.0 g of N,N-dimethylformamide, and 4.39 g of chloromethyl methyl ether. There was obtained 22.4 g of a hydrogenated ring-opening metathesis polymer in white powder form. On GPC analysis, the polymer had a weight average molecular weight Mw of 9,900 and a Mw/Mn of 2.15. On $^{13}$C-NMR analysis, the polymer had a compositional ratio of structural units [A]/[B]/[E] equal to 40/50/10 (molar ratio).

Example 17

Synthesis of Polymer 17

The procedure of Example 15 was followed aside from using 20.0 g of the hydrogenated ring-opening metathesis polymer having the ester decomposed into carboxylic acid (Mw=9,800, Mw/Mn=2.11) obtained in Example 15, 6.06 g of triethylamine, 80.0 g of N,N-dimethylformamide, and 10.95 g of 2-adamantyl chloromethyl ether. There was obtained 27.5 g of a hydrogenated ring-opening metathesis polymer in white powder form. On GPC analysis, the polymer had a weight average molecular weight Mw of 10,500 and a Mw/Mn of 2.18. On $^{13}$C-NMR analysis, the polymer had a compositional ratio of structural units [A]/[B]/[E] equal to 40/50/10 (molar ratio).

Example 18

Synthesis of Polymer 18

Ring-opening metathesis polymerization was effected as in Example 5 except that some reactants were changed to 40.56 g of 8-(1-ethylcyclopentyloxycarbonyl)-tetracyclo-[4.4.0.1$^{2,5}$.1$^{7,10}$]-3-dodecene, 13.63 g of 4,10-dioxatricyclo-[5.2.1.0$^{2,6}$]dec-8-en-3-one as cyclic olefin monomers, and 5.95 g of Mo(N-2,6-Me$_2$C$_6$H$_3$)(CHCMe$_2$Ph)(OCMe(CF$_3$)$_2$)$_2$ as a polymerization catalyst. There was yielded 51.5 g of a ring-opening metathesis polymer powder.

Then 40.0 g of this ring-opening metathesis polymer powder was dissolved in 250 ml of THF, and 4.0 g of 5% palladium on carbon was added thereto as a hydrogenation catalyst. Hydrogenation reaction was effected at a hydrogen pressure of 8.1 MPa and 165° C. for 5 hours. The temperature was brought back to room temperature and the hydrogen gas was released. The hydrogenated ring-opening metathesis polymer solution was poured into methanol for precipitation. Subsequent filtration and vacuum drying yielded 39.9 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 16,200 and a Mw/Mn of 1.22. On $^{13}$C-NMR analysis, the polymer had a compositional ratio of structural units [B]/[D] equal to 40/60 (molar ratio).

Aside from using 30.0 g of the hydrogenated ring-opening metathesis polymer obtained above and effecting reaction at 80° C. for 18 hours, the procedure of Example 3 was followed. There was obtained 21.7 g of a hydrogenated ring-opening metathesis polymer in which the ester was decomposed into carboxylic acid. On $^{13}$C-NMR analysis, the polymer had a compositional ratio of structural units [B]/[E] equal to 40/60 (molar ratio). On GPC analysis, the polymer had a weight average molecular weight Mw of 16,600 and a Mw/Mn of 1.24.

The procedure of Example 3 was followed aside from using 20.0 g of the thus obtained hydrogenated ring-opening metathesis polymer in which the ester had been decomposed into carboxylic acid, 5.99 g of triethylamine, 80.0 g of N,N-dimethylformamide, 2.60 g of chloromethyl methyl ether, and 4.33 g of 2-adamantyl chloromethyl ether. There was obtained 23.7 g of a hydrogenated ring-opening metathesis polymer in white powder form. On GPC analysis, the polymer had a weight average molecular weight Mw of 16,300 and a Mw/Mn of 1.25. On $^{13}$C-NMR analysis, the polymer had a compositional ratio of structural units [A]/[B]/[E] equal to 50/40/10 (molar ratio).

Example 19

Synthesis of Polymer 19

Ring-opening metathesis polymerization was effected as in Example 5 except that some reactants were changed to 29.34 g of 8-(methyloxycarbonyl)-tetracyclo[4.4.0.1$^{2,5}$.1$^{7,10}$]-3-dodecene, 13.63 g of 4,10-dioxatricyclo[5.2.1.0$^{2,6}$]dec-8-en-3-one as cyclic olefin monomers, and 5.78 g of Ru(P(C$_6$H$_{11}$)$_3$)$_2$(CHPh)Cl$_2$ as a polymerization catalyst. There was yielded 40.8 g of a ring-opening metathesis polymer powder.

Aside from dissolving 40.0 g of this ring-opening metathesis polymer powder in 250 ml of THF, hydrogenation reaction was effected as in Example 1. There was obtained 39.6 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 10,200 and a Mw/Mn of 1.65. On $^{13}$C-NMR analysis, the polymer had a compositional ratio of structural units [B]/[D] equal to 40/60 (molar ratio).

Aside from using 30.0 g of the hydrogenated ring-opening metathesis polymer obtained above and effecting reaction at 80° C. for 15 hours, the procedure of Example 3 was followed. There was obtained 23.7 g of a hydrogenated ring-opening metathesis polymer in which the ester was partially decomposed into carboxylic acid. On $^{13}$C-NMR analysis, the polymer had a compositional ratio of structural units [B]/[D]/[E] equal to 40/20/40 (molar ratio). On GPC analysis, the polymer had a weight average molecular weight Mw of 10,300 and a Mw/Mn of 1.65.

The procedure of Example 3 was followed aside from using 20.0 g of the thus obtained hydrogenated ring-opening metathesis polymer in which the ester had been partially decomposed into carboxylic acid, 4.71 g of triethylamine, 80.0 g of N,N-dimethylformamide, and 3.42 g of chloromethyl methyl ether. There was obtained 20.8 g of a hydrogenated ring-opening metathesis polymer in white powder form. On GPC analysis, the polymer had a weight average molecular weight Mw of 10,500 and a Mw/Mn of 1.65. On $^{13}$C-NMR analysis, the polymer had a compositional ratio of structural units [A]/[B]/[D]/[E] equal to 30/4020/10 (molar ratio).

Example 20

Synthesis of Polymer 20

Ring-opening metathesis polymerization was effected as in Example 5 except that some reactants were changed to 34.99 g of 8-(tert-butyloxycarbonyl)-tetracyclo[4.4.0.1$^{2,5}$.1$^{7,10}$]-3-dodecene, 13.63 g of 4,10-dioxatricyclo[5.2.1.0$^{2,6}$]dec-8-en-3-one as cyclic olefin monomers, and 6.39 g of Ru(P(C$_6$H$_{11}$)$_3$)$_2$(CHPh)Cl$_2$ as a polymerization catalyst. There was yielded 46.2 g of a ring-opening metathesis polymer powder.

Aside from dissolving 40.0 g of this ring-opening metathesis polymer powder in 250 ml of THF, hydrogenation reaction was effected as in Example 1. There was obtained 39.0 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 9,500 and a Mw/Mn of 1.61. On $^{13}$C-NMR analysis, the polymer had a compositional ratio of structural units [B]/[D] equal to 40/60 (molar ratio).

Aside from using 30.0 g of the hydrogenated ring-opening metathesis polymer obtained above and effecting reaction at 80° C. for 20 hours, the procedure of Example 3 was followed. There was obtained 22.8 g of a hydrogenated ring-opening metathesis polymer in which the ester was partially decomposed into carboxylic acid. On $^{13}$C-NMR analysis, the polymer had a compositional ratio of structural units [B]/[D]/[E] equal to 40/10/50 (molar ratio). On GPC analysis, the polymer had a weight average molecular weight Mw of 9,600 and a Mw/Mn of 1.62.

The procedure of Example 3 was followed aside from using 20.0 g of the thus obtained hydrogenated ring-opening metathesis polymer in which the ester had been partially decomposed into carboxylic acid, 4.65 g of triethylamine, 80.0 g of N,N-dimethylformamide, and 3.38 g of chloromethyl methyl ether. There was obtained 20.4 g of a hydrogenated ring-opening metathesis polymer in white powder form. On GPC analysis, the polymer had a weight average molecular weight Mw of 9,700 and a Mw/Mn of 1.62.

On $^{13}$C-NMR analysis, the polymer had a compositional ratio of structural units [A]/[B]/[D]/[E] equal to 40/40/10/10 (molar ratio).

Example 21

Synthesis of Polymer 21

Ring-opening metathesis polymerization was effected as in Example 1 except that some reactants were changed to 33.65 g of 8-(1-ethylcyclopentyloxycarbonyl)-tetracyclo-[4.4.0.1$^{2,5}$.1$^{7,10}$]-3-dodecene, 17.04 g of 4,10-dioxatricyclo-[5.2.1.0$^{2,6}$]dec-8-en-3-one as cyclic olefin monomers, 5.03 g of 1-octene, and 260 mg of W(N-2,6-Me$_2$C$_6$H$_3$)(CHCMe$_2$Ph)(OCMe$_3$)$_2$ as a polymerization catalyst. There was yielded 52.5 g of a ring-opening metathesis polymer powder.

Then 40.0 g of this ring-opening metathesis polymer powder was dissolved in 250 ml of THF, and 4.0 g of 5% palladium on carbon was added thereto as a hydrogenation catalyst. Hydrogenation reaction was effected at a hydrogen pressure of 8.1 MPa and 165° C. for 5 hours. The temperature was brought back to room temperature and the hydrogen gas was released. The hydrogenated ring-opening metathesis polymer solution was poured into methanol for precipitation. Subsequent filtration and vacuum drying yielded 38.5 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 8,700 and a Mw/Mn of 2.68. On $^{13}$C-NMR analysis, the polymer had a compositional ratio of structural units [B]/[D] equal to 50/50 (molar ratio).

The procedure of Example 3 was followed aside from dissolving 30.0 g of the hydrogenated ring-opening metathesis polymer obtained above in 300 ml of THF, adding 6 ml of 2N HCl thereto, and effecting reaction at 80° C. for 4 hours. There was obtained 27.5 g of a hydrogenated ring-opening metathesis polymer in which the ester was partially decomposed into carboxylic acid. On $^{13}$C-NMR analysis, the polymer had a compositional ratio of structural units [B]/[D]/[E] equal to 50/30/20 (molar ratio). On GPC analysis, the polymer had a weight average molecular weight Mw of 8,900 and a Mw/Mn of 2.71.

The procedure of Example 3 was followed aside from using 20.0 g of the thus obtained hydrogenated ring-opening metathesis polymer in which the ester had been partially decomposed into carboxylic acid, 1.06 g of triethylamine, 80.0 g of N,N-dimethylformamide, and 0.77 g of chloromethyl methyl ether. There was obtained 19.5 g of a hydrogenated ring-opening metathesis polymer in white powder form. On GPC analysis, the polymer had a weight average molecular weight Mw of 9,000 and a Mw/Mn of 2.92. On $^{13}$C-NMR analysis, the polymer had a compositional ratio of structural units [A]/[B]/[D]/[E] equal to 10/50/30/10 (molar ratio).

Example 22

Synthesis of Polymer 22

Ring-opening metathesis polymerization was effected as in Example 1 except that some reactants were changed to 55.62 g of 8-(methoxymethyloxycarbonyl)-tetracyclo[4.4.0.1$^{2,5}$.1$^{7,10}$]-3-dodecene as a cyclic olefin monomer, 1.36 g of 1,5-hexadiene, and 246 mg of Mo(N-2,6-Me$_2$C$_6$H$_3$)(CHCMe$_2$Ph)-(OCMe$_3$)$_2$ as a polymerization catalyst. There was yielded 54.0 g of a ring-opening metathesis polymer powder.

Aside from using 40.0 g of this ring-opening metathesis polymer powder, hydrogenation reaction was effected as in Example 1. There was obtained 38.5 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 12,200 and a Mw/Mn of 1.89. On $^{13}$C-NMR analysis, the polymer had a compositional ratio of structural units [A] equal to 100 (molar ratio).

Example 23

Synthesis of Polymer 23

Ring-opening metathesis polymerization was effected as in Example 1 except that some reactants were changed to 27.81 g of 8-(methoxymethyloxycarbonyl)-tetracyclo[4.4.0.1$^{2,5}$.1$^{7,10}$]-3-dodecene and 16.82 g of 4-oxatricyclo[5.2.1.0$^{2,6}$]dec-8-en-3-one as cyclic olefin monomers, 2.11 g of 1,6-heptadiene, and 382 mg of W(N-2,6-Me$_2$C$_6$H$_3$)(CHCMe$_2$Ph)(OCMe(CF$_3$)$_2$)$_2$ as a polymerization catalyst. There was yielded 44.2 g of a ring-opening metathesis polymer powder.

Then 40.0 g of this ring-opening metathesis polymer powder was dissolved in 250 ml of THF, and 4.0 g of 5% palladium on carbon was added thereto as a hydrogenation catalyst. Hydrogenation reaction was effected at a hydrogen pressure of 8.1 MPa and 165° C. for 5 hours. The temperature was brought back to room temperature and the hydrogen gas was released. The hydrogenated ring-opening metathesis polymer solution was poured into methanol for precipitation. Subsequent filtration and vacuum drying yielded 38.8 g of a hydrogenated ring-opening metathesis polymer in white powder form. On $^1$H-NMR analysis of the resulting hydrogenated ring-opening metathesis polymer, no peak attributable to the proton on the backbone olefin was observed, indicating a percent hydrogenation of 100%. On GPC analysis, the polymer had a weight average molecular weight Mw of 9,800 and a Mw/Mn of 2.19. On $^{13}$C-NMR analysis, the polymer had a compositional ratio of structural units [A]/[B] equal to 50/50 (molar ratio).

Example 24

Synthesis of Polymer 24

Reaction was effected as in Example 11 aside from using 30.0 g of the hydrogenated ring-opening metathesis polymer (Mw=9,800, Mw/Mn=2.19) obtained in Example 23. There was obtained 27.1 g of a hydrogenated ring-opening metathesis polymer in which the ester was partially decomposed into carboxylic acid. On GPC analysis, the polymer had a weight average molecular weight Mw of 9,900 and a Mw/Mn of 2.30. On $^{13}$C-NMR analysis, the polymer had a compositional ratio of structural units [A]/[B]/[E] equal to 38/50/12 (molar ratio).

(Polymer 1)
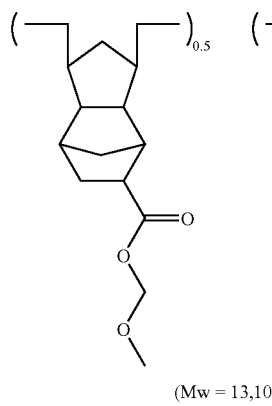
(Mw = 13,100)
(Polymer 2)
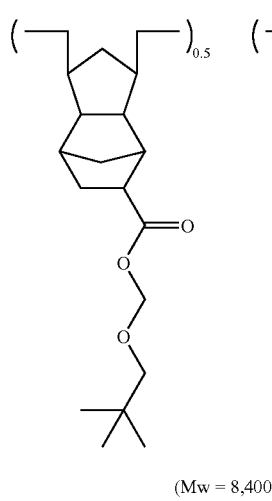
(Mw = 8,400)
(Polymer 3)
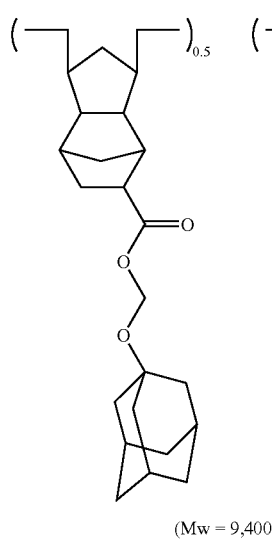
(Mw = 9,400)
-continued
(Polymer 4)
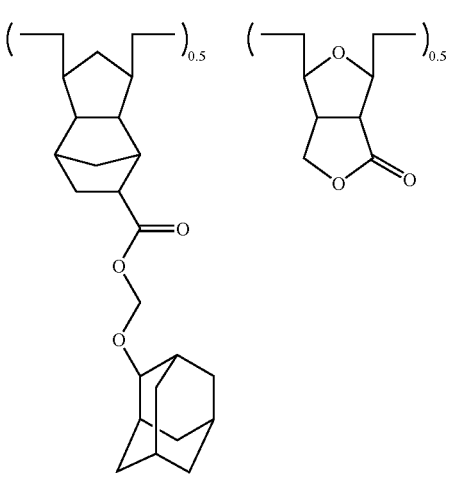
(Mw = 9,700)
(Polymer 5)
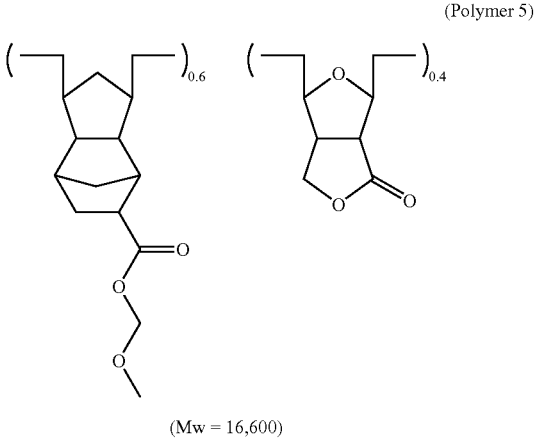
(Mw = 16,600)
(Polymer 6)
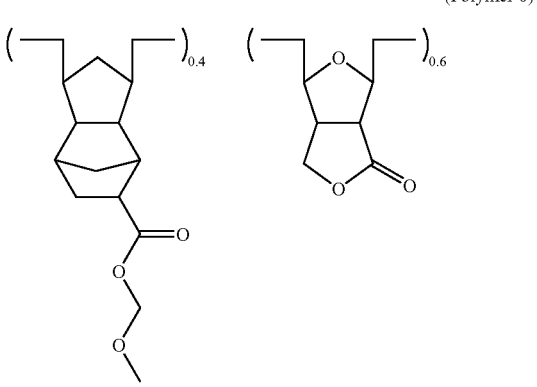
(Mw = 7,300)

-continued
(Polymer 7)
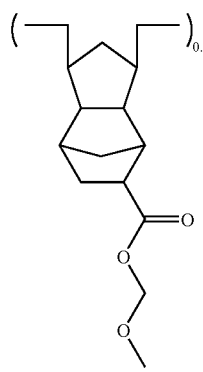 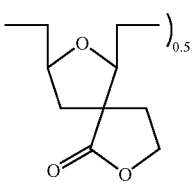
(Mw = 14,000)
(Polymer 8)
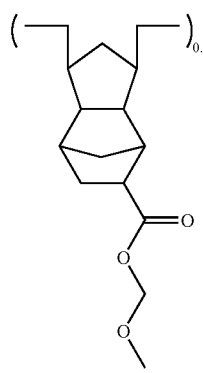 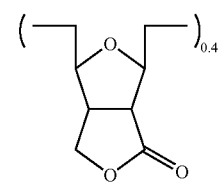
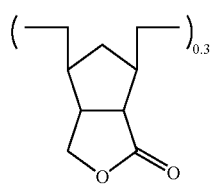
(Mw = 7,500)
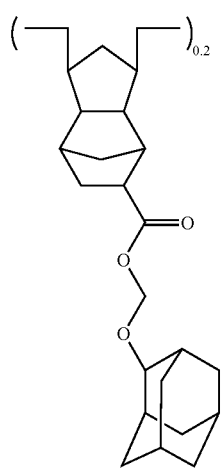
-continued
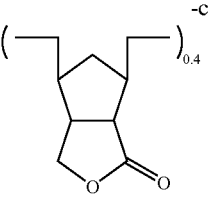
(Mw = 6,800)
(Polymer 10)
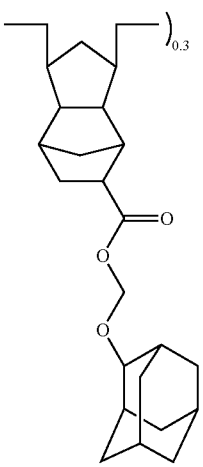
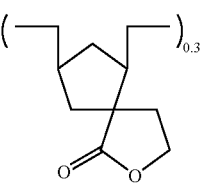
(Mw = 10,200)
(Polymer 9)
(Polymer 11)
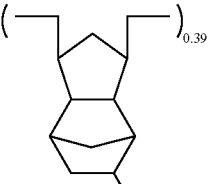 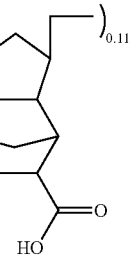
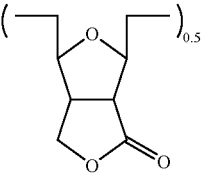
(Mw = 11,200)

-continued
(Polymer 12)
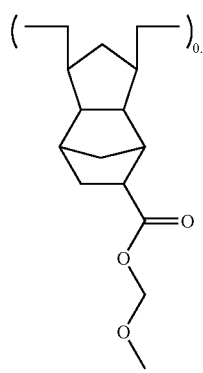 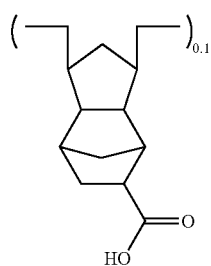
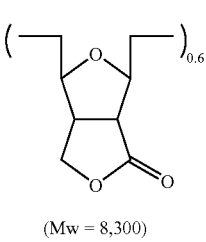
(Mw = 8,300)
(Polymer 13)
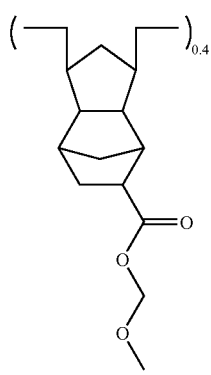
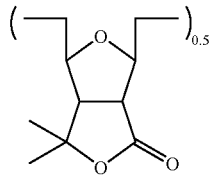
(Mw = 13,200)
(Polymer 14)
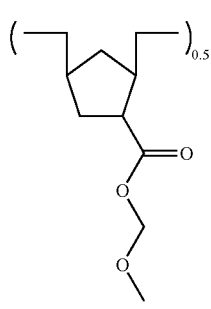
(Mw = 8,100)
-continued
(Polymer 15)
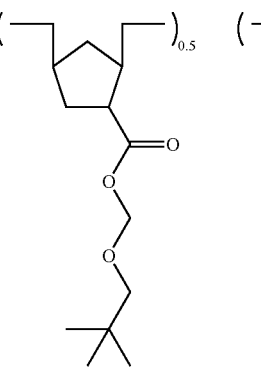 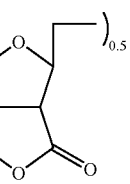
(Mw = 10,200)
(Polymer 16)
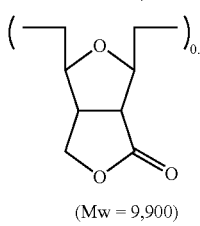
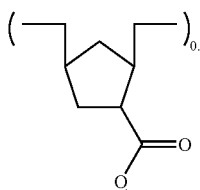
(Mw = 9,900)
(Polymer 17)
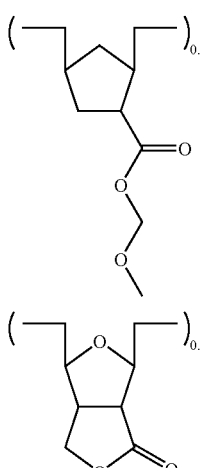
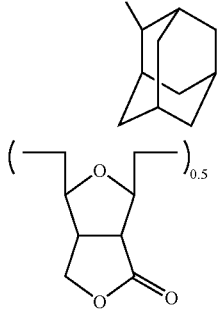
(Mw = 10,500)

-continued
(Polymer 18)
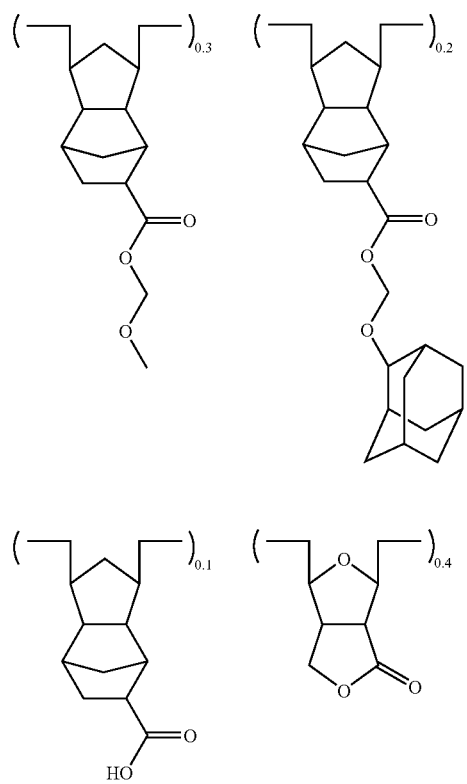
(Mw = 16,300)
(Polymer 19)
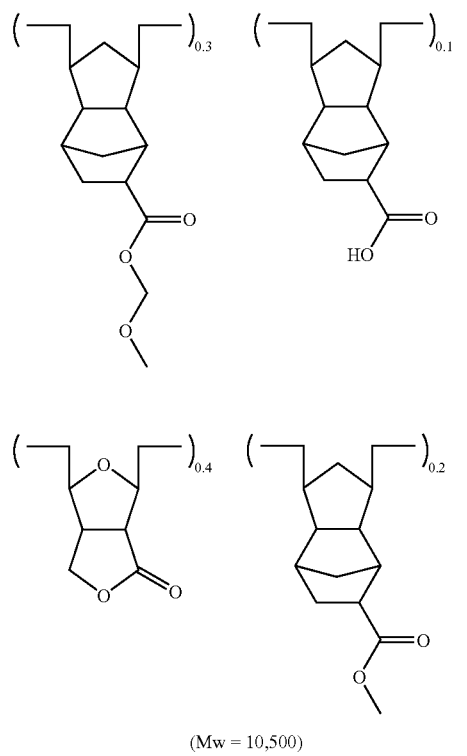
(Mw = 10,500)
-continued
(Polymer 20)
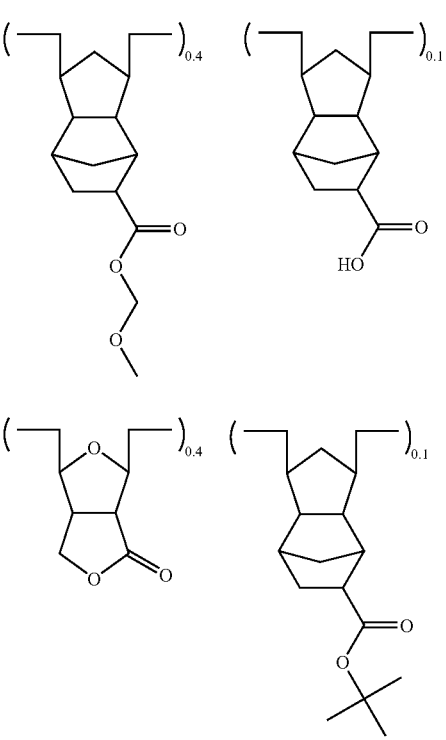
(Mw = 9,700)
(Polymer 21)
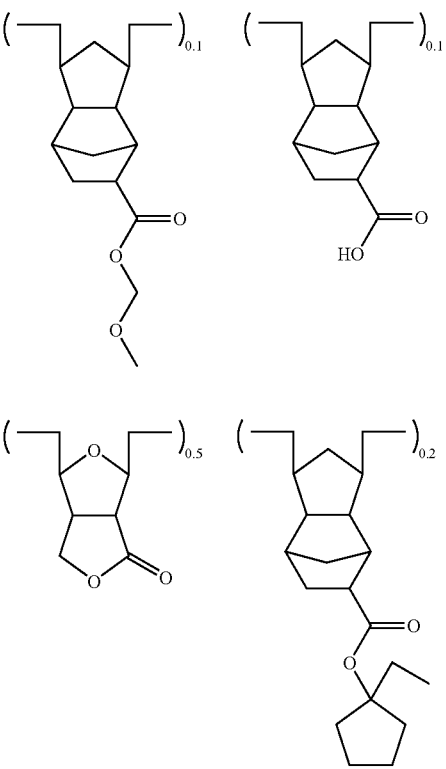
(Mw = 9,000)

-continued

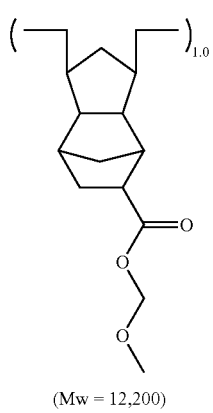

(Polymer 22)

(Mw = 12,200)

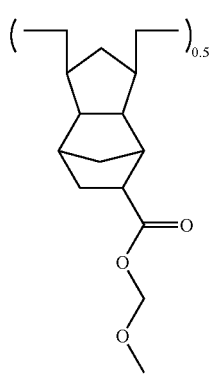

(Polymer 23)

(Mw = 9,800)

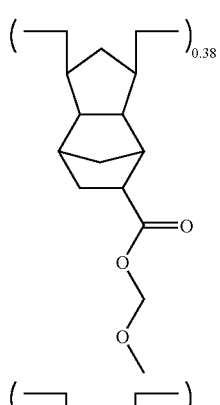

(Polymer 24)

(Mw = 9,900)

Resist compositions were formulated using the inventive polymers as the base resin and examined for resolution and etching resistance.

Examples I-1 to I-24 and Comparative Examples II-1 to II-8

Resist compositions were prepared by using Polymers 1 to 24 (invention) or Polymers 25 to 32 (comparison, shown below) as the base resin, and dissolving the polymer, an acid generator and a basic compound in a solvent in accordance with the formulation shown in Table 1. These compositions were each filtered through a Teflon® filter (pore diameter 0.2 µm), thereby giving resist solutions.

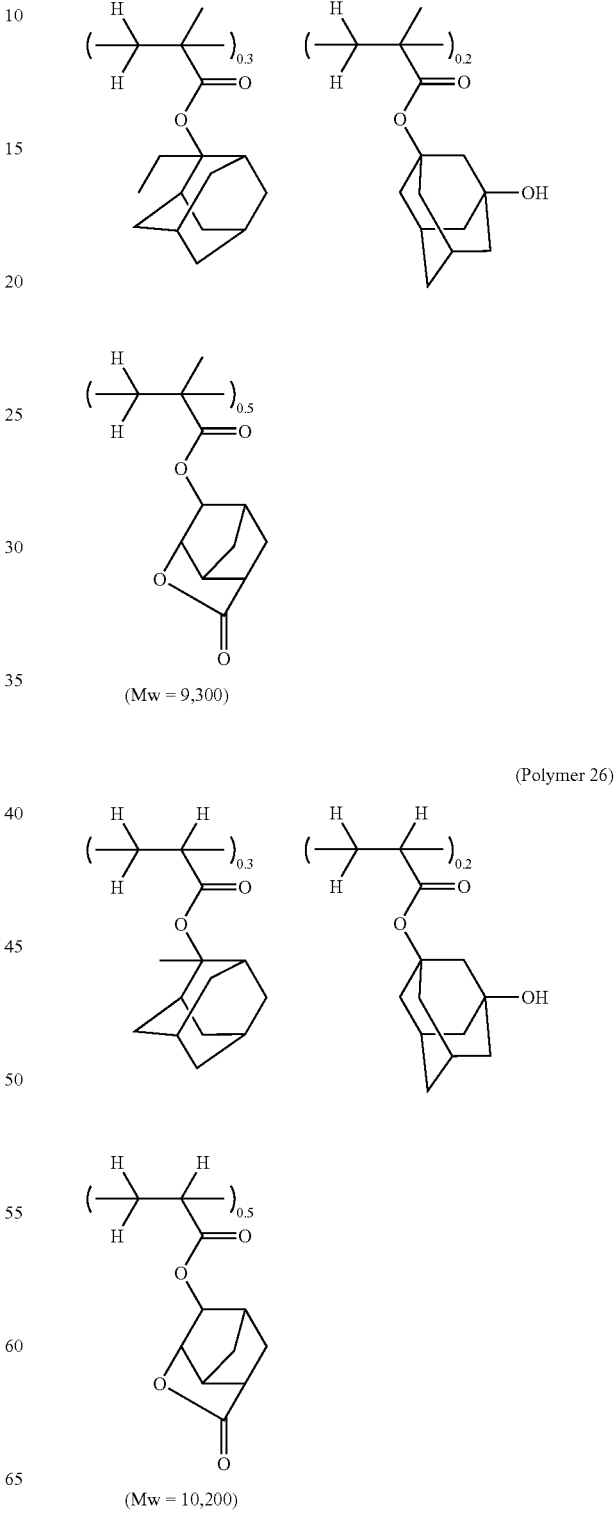

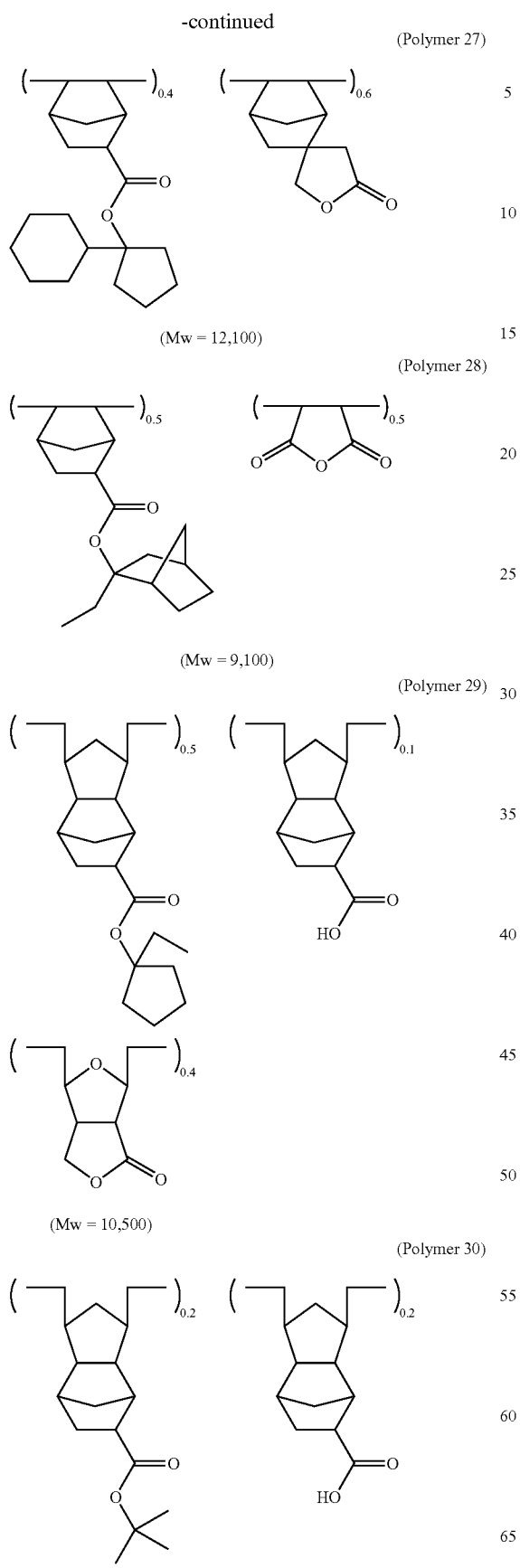
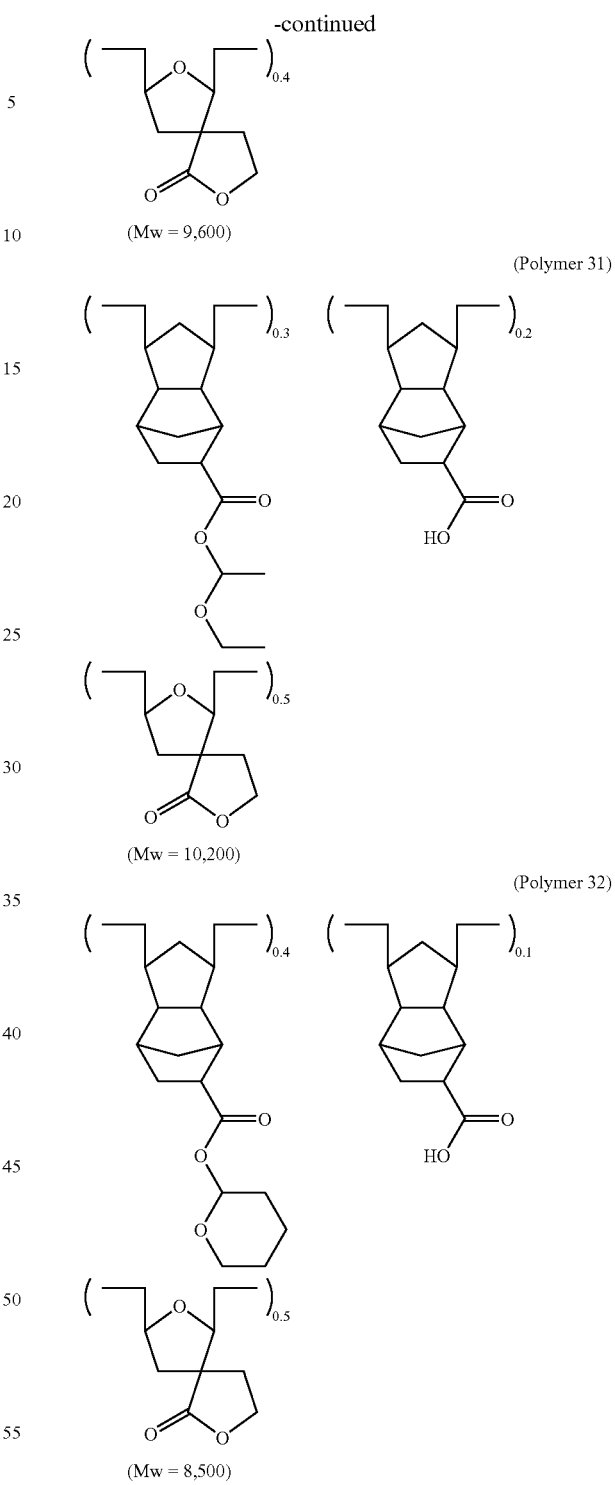

These resist solutions were spin-coated onto silicon wafers having an antireflective coating (ARC29A by Nissan Chemical Industries, Ltd.) of 78 nm thick coated thereon, then baked at 100° C. to 130° C. for 60 seconds to give resist films having a thickness of 250 nm. The resist films were exposed using an ArF excimer laser stepper (Nikon Corporation, NA 0.68), then baked (PEB) at 100° C. to 130° C. for 60 seconds, and puddle developed with an aqueous solution of 2.38% tetramethylammonium hydroxide (TMAH), thereby forming 1:1 and 1:10 line-and-space patterns.

The wafer as developed was cut and the section observed under a scanning electron microscope (SEM). The optimal dose (Eop, mJ/cm$^2$) is defined as the exposure dose which provides a 1:1 resolution at the top and bottom of a 0.13 μm line-and-space pattern. The resolution of a resist under test is defined as the minimum line width (μm) of the lines and spaces that remain separated at the optimal dose (smaller values indicate better resolution). The proximity bias is the line width of 0.13 μm 1:1 line-and-space pattern minus the line width of 0.13 μm 1:10 line-and-space pattern (smaller values are favorable). For those resist compositions from which 0.13 μm line-and-space patterns can not be resolved, the optimal dose is defined as the exposure dose which ensures to form a line-and-space pattern with a greater line width of 0.14 μm or 0.15 μm, and the proximity bias is regarded unmeasurable (UM).

Separately, on a silicon wafer which had been surface treated in hexamethyldisilazane (HMDS) gas phase at 90° C. for 60 seconds, each of the resist solutions was spin-coated and heat treated at 100° C. for 60 seconds, forming a resist film of 300 nm thick. In a dry etching test using a dry etcher (Tokyo Electron Ltd.), the resist film was etched with $CF_4$/$CHF_3$ gas. A change per minute of film thickness was measured, and an etching rate was computed relative to the reference SEPR-430S (Shin-Etsu Chemical Co., Ltd.).

Table 1 shows the composition of resist materials in Examples, and their test results of resolution at optimum soft-baking (SB)/post-exposure baking (PEB) temperatures and etching test. Table 2 shows the composition and test results of resist materials in Comparative Examples. In Tables 1 and 2, the acid generator, basic compound and solvent are as identified below. It is noted that the solvent contained 0.01% by weight of surfactant KH-20 (Asahi Glass Co., Ltd.).

TPSNf: triphenylsulfonium nonafluorobutanesulfonate
TMMEA: trismethoxymethoxyethylamine
CyHO: cyclohexanone

TABLE 1

| Example | Resin (pbw) | Acid generator (pbw) | Basic compound (pbw) | Solvent (pbw) | SB/PEB temp. (° C.) | Eop (mJ/cm$^2$) | Resolution (μm) | Proximity bias (nm) | Etching rate |
|---|---|---|---|---|---|---|---|---|---|
| I-1 | Polymer 1 (80) | TPSNf (1) | TMMEA (0.236) | CyHO (640) | 100/110 | 25.0 | 0.11 | 18 | 1.03 |
| I-2 | Polymer 2 (80) | TPSNf (1) | TMMEA (0.236) | CyHO (640) | 100/110 | 24.0 | 0.11 | 19 | 1.03 |
| I-3 | Polymer 3 (80) | TPSNf (1) | TMMEA (0.236) | CyHO (640) | 100/110 | 24.0 | 0.11 | 15 | 1.01 |
| I-4 | Polymer 4 (80) | TPSNf (1) | TMMEA (0.236) | CyHO (640) | 110/110 | 26.0 | 0.11 | 12 | 1.01 |
| I-5 | Polymer 5 (80) | TPSNf (1) | TMMEA (0.236) | CyHO (640) | 110/110 | 25.0 | 0.12 | 15 | 1.02 |
| I-6 | Polymer 6 (80) | TPSNf (1) | TMMEA (0.236) | CyHO (640) | 110/110 | 28.0 | 0.11 | 14 | 1.04 |
| I-7 | Polymer 7 (80) | TPSNf (1) | TMMEA (0.236) | CyHO (640) | 100/110 | 24.0 | 0.12 | 13 | 1.03 |
| I-8 | Polymer 8 (80) | TPSNf (1) | TMMEA (0.236) | CyHO (640) | 100/110 | 27.0 | 0.11 | 12 | 1.05 |
| I-9 | Polymer 9 (80) | TPSNf (1) | TMMEA (0.236) | CyHO (640) | 110/120 | 25.0 | 0.12 | 11 | 1.07 |
| I-10 | Polymer 10 (80) | TPSNf (1) | TMMEA (0.236) | CyHO (640) | 110/110 | 26.0 | 0.11 | 16 | 1.05 |
| I-11 | Polymer 11 (80) | TPSNf (1) | TMMEA (0.236) | CyHO (640) | 100/110 | 23.0 | 0.11 | 18 | 1.03 |
| I-12 | Polymer 12 (80) | TPSNf (1) | TMMEA (0.236) | CyHO (640) | 105/110 | 24.0 | 0.11 | 12 | 1.04 |
| I-13 | Polymer 13 (80) | TPSNf (1) | TMMEA (0.236) | CyHO (640) | 100/110 | 27.0 | 0.12 | 18 | 1.03 |
| I-14 | Polymer 14 (80) | TPSNf (1) | TMMEA (0.236) | CyHO (640) | 100/105 | 27.0 | 0.12 | 17 | 1.02 |
| I-15 | Polymer 15 (80) | TPSNf (1) | TMMEA (0.236) | CyHO (640) | 100/105 | 26.0 | 0.12 | 19 | 1.04 |
| I-16 | Polymer 16 (80) | TPSNf (1) | TMMEA (0.236) | CyHO (640) | 100/100 | 25.0 | 0.12 | 19 | 1.09 |
| I-17 | Polymer 17 (80) | TPSNf (1) | TMMEA (0.236) | CyHO (640) | 110/110 | 25.0 | 0.12 | 18 | 1.07 |
| I-18 | Polymer 18 (80) | TPSNf (1) | TMMEA (0.236) | CyHO (640) | 110/110 | 23.0 | 0.11 | 15 | 1.03 |
| I-19 | Polymer 19 (80) | TPSNf (1) | TMMEA (0.236) | CyHO (640) | 100/110 | 25.0 | 0.12 | 13 | 1.06 |
| I-20 | Polymer 20 (80) | TPSNf (1) | TMMEA (0.236) | CyHO (640) | 100/110 | 22.0 | 0.11 | 18 | 1.03 |
| I-21 | Polymer 21 (80) | TPSNf (1) | TMMEA (0.236) | CyHO (640) | 100/110 | 23.0 | 0.11 | 15 | 1.03 |
| I-22 | Polymer 22 (80) | TPSNf (1) | TMMEA (0.236) | CyHO (640) | 100/100 | 18.0 | 0.13 | 19 | 1.00 |
| I-23 | Polymer 23 (80) | TPSNf (1) | TMMEA (0.236) | CyHO (640) | 110/110 | 28.0 | 0.12 | 14 | 1.03 |
| I-24 | Polymer 24 (80) | TPSNf (1) | TMMEA (0.236) | CyHO (640) | 110/120 | 26.0 | 0.12 | 11 | 1.03 |

TABLE 2

| Comparative Example | Resin (pbw) | Acid generator (pbw) | Basic compound (pbw) | Solvent (pbw) | SB/PEB temp. (°C.) | Eop (mJ/cm$^2$) | Resolution (μm) | Proximity bias (nm) | Etching rate |
|---|---|---|---|---|---|---|---|---|---|
| II-1 | Polymer 25 (80) | TPSNf (1) | TMMEA (0.236) | CyHO (640) | 110/110 | 26.0 | 0.12 | 18 | 1.29 |
| II-2 | Polymer 26 (80) | TPSNf (1) | TMMEA (0.236) | CyHO (640) | 120/120 | 22.0 | 0.11 | 19 | 1.27 |
| II-3 | Polymer 27 (80) | TPSNf (1) | TMMEA (0.236) | CyHO (640) | 100/110 | 23.0 | 0.15 | UM | 1.09 |
| II-4 | Polymer 28 (80) | TPSNf (1) | TMMEA (0.236) | CyHO (640) | 100/110 | 23.0 | 0.14 | UM | 1.15 |
| II-5 | Polymer 29 (80) | TPSNf (1) | TMMEA (0.236) | CyHO (640) | 100/110 | 23.0 | 0.15 | UM | 1.03 |
| II-6 | Polymer 30 (80) | TPSNf (1) | TMMEA (0.236) | CyHO (640) | 100/110 | 23.0 | 0.13 | 43 | 1.04 |
| II-7 | Polymer 31 (80) | TPSNf (1) | TMMEA (0.236) | CyHO (640) | 100/110 | 18.0 | 0.13 | 38 | 1.05 |
| II-8 | Polymer 32 (80) | TPSNf (1) | TMMEA (0.236) | CyHO (640) | 100/110 | 19.0 | 0.13 | 48 | 1.03 |

As seen from Tables 1 and 2, the resist compositions within the scope of the invention exhibit a high resolution and reduced proximity bias upon ArF excimer laser exposure, and have high etching resistance.

Japanese Patent Application No. 2007-272193 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A hydrogenated ring-opening metathesis polymer comprising structural units [A] and optional structural units [B] and/or [C] in a constitutional molar ratio defined as [A]/([B]+[C]) from 1/99 to 100/0, said units [A] having the general formula [1]:

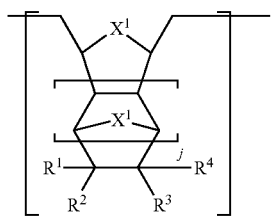

[1]

wherein at least one of $R^1$ to $R^4$ is an alkoxymethyl ester-bearing functional group having the general formula [2]:

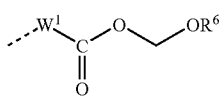

[2]

wherein the broken line denotes a valence bond, $W^1$ is a single bond, divalent $C_1$-$C_{10}$ hydrocarbon, or divalent $C_1$-$C_{10}$ hydrocarbon in which one hydrogen atom is substituted by —$OR^5$, $R^5$ is hydrogen, straight, branched or cyclic $C_1$-$C_{10}$ alkyl, straight, branched or cyclic $C_2$-$C_{10}$ alkoxyalkyl, or straight, branched or cyclic $C_1$-$C_{10}$ acyl, and $R^6$ is straight, branched or cyclic $C_1$-$C_{20}$ alkyl, and the remainders of $R^1$ to $R^4$ are each independently selected from the group consisting of hydrogen, straight, branched or cyclic $C_1$-$C_{20}$ alkyl, halogen, straight, branched or cyclic $C_1$-$C_{20}$ haloalkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkylcarbonyloxy, $C_7$-$C_{20}$ arylcarbonyloxy, straight, branched or cyclic $C_1$-$C_{20}$ alkylsulfonyloxy, $C_6$-$C_{20}$ arylsulfonyloxy, straight, branched or cyclic $C_2$-$C_{20}$ alkoxycarbonyl, and straight, branched or cyclic $C_3$-$C_{20}$ alkoxycarbonylalkyl, $X^1$ which may be the same or different is —O— or —$CR^7{}_2$— wherein $R^7$ is hydrogen or straight or branched $C_1$-$C_{10}$ alkyl, and j is 0 or an integer of 1 to 3, said units [B] having the general formula [3]:

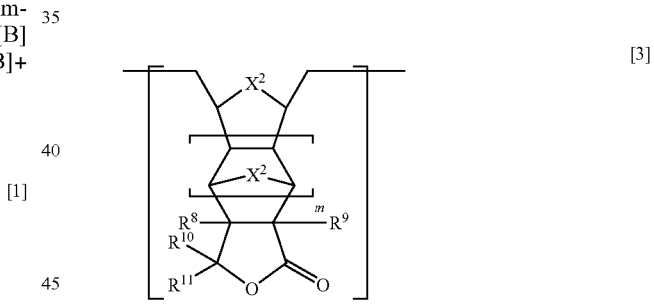

[3]

wherein $R^8$ to $R^{11}$ are each independently hydrogen or straight, branched or cyclic $C_1$-$C_{10}$ alkyl, $X^2$ which may be the same or different is —O— or —$CR^{12}{}_2$— wherein $R^{12}$ is hydrogen or straight or branched $C_1$-$C_{10}$ alkyl, and m is 0 or an integer of 1 to 3, said units [C] having the general formula [4]:

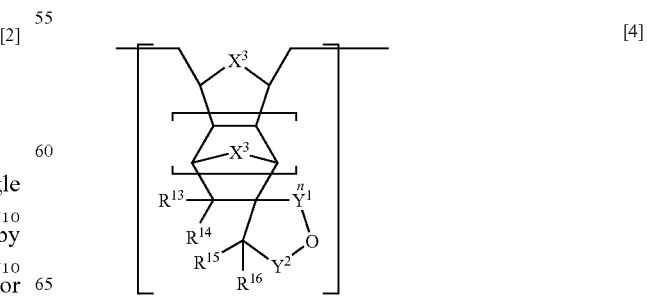

[4]

wherein $R^{13}$ to $R^{16}$ are each independently hydrogen or straight, branched or cyclic $C_1$-$C_{10}$ alkyl, $X^3$ which may be the same or different is —O— or —$CR^{17}{}_2$— wherein $R^{17}$ is hydrogen or straight or branched $C_1$-$C_{10}$ alkyl, one of $Y^1$ and $Y^2$ is —(C═O)— and the other is —$CR^{18}{}_2$— wherein $R^{18}$ is hydrogen or straight or branched $C_1$-$C_{10}$ alkyl, and n is 0 or an integer of 1 to 3.

2. The hydrogenated ring-opening metathesis polymer of claim 1 wherein at least one of $X^1$ in formula [1], $X^2$ in formula [3], and $X^3$ in formula [4] is —O—.

3. The hydrogenated ring-opening metathesis polymer of claim 1 wherein at least one of $R^1$ to $R^4$ is an alkoxymethyl ester-bearing functional group of formula [2] wherein $R^6$ is methyl, neopentyl, 1-adamantyl or 2-adamantyl.

4. The hydrogenated ring-opening metathesis polymer of claim 1, further comprising structural units [D] having the general formula [5]:

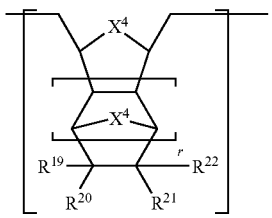

[5]

wherein at least one of $R^{19}$ to $R^{22}$ is an ester-bearing functional group having the general formula [6]:

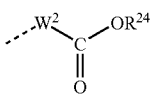

[6]

wherein the broken line denotes a valence bond, $W^2$ is a single bond, divalent $C_1$-$C_{10}$ hydrocarbon, or divalent $C_1$-$C_{10}$ hydrocarbon in which one hydrogen atom is substituted by —$OR^{23}$, $R^{23}$ is hydrogen, straight, branched or cyclic $C_1$-$C_{10}$ alkyl, straight, branched or cyclic $C_2$-$C_{10}$ alkoxyalkyl, or straight, branched or cyclic $C_1$-$C_{10}$ acyl, and $R^{24}$ is straight, branched or cyclic $C_1$-$C_{20}$ alkyl or straight, branched or cyclic $C_1$-$C_{20}$ haloalkyl, and the remainders of $R^{19}$ to $R^{22}$ are each independently selected from the group consisting of hydrogen, straight, branched or cyclic $C_1$-$C_{20}$ alkyl, halogen, straight, branched or cyclic $C_1$-$C_{20}$ haloalkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkylcarbonyloxy, $C_7$-$C_{20}$ arylcarbonyloxy, straight, branched or cyclic $C_1$-$C_{20}$ alkylsulfonyloxy, $C_6$-$C_{20}$ arylsulfonyloxy, straight, branched or cyclic $C_2$-$C_{20}$ alkoxycarbonyl, and straight, branched or cyclic $C_3$-$C_{20}$ alkoxycarbonylalkyl, $X^4$ which may be the same or different is —O— or —$CR^{25}{}_2$— wherein $R^{25}$ is hydrogen or straight or branched $C_1$-$C_{10}$ alkyl, and r is 0 or an integer of 1 to 3.

5. The hydrogenated ring-opening metathesis polymer of claim 4 wherein the total of structural units [A] of formula [1], structural units [B] of formula [3] and structural units [C] of formula [4], and structural units [D] of formula [5] are present in a constitutional molar ratio defined as ([A]+[B]+[C])/[D] from 99/1 to 20/80.

6. The hydrogenated ring-opening metathesis polymer of claim 1, further comprising structural units [E] having the general formula [7]:

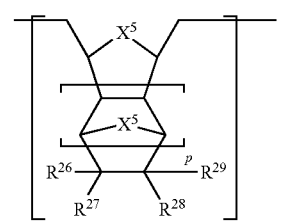

[7]

wherein at least one of $R^{26}$ to $R^{29}$ is a carboxyl-bearing functional group having the general formula [8]:

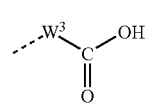

[8]

wherein the broken line denotes a valence bond, $W^3$ is a single bond, divalent $C_1$-$C_{10}$ hydrocarbon, or divalent $C_1$-$C_{10}$ hydrocarbon in which one hydrogen atom is substituted by —$OR^{30}$, $R^{30}$ is hydrogen, straight, branched or cyclic $C_1$-$C_{10}$ alkyl, straight, branched or cyclic $C_2$-$C_{10}$ alkoxyalkyl, or straight, branched or cyclic $C_1$-$C_{10}$ acyl, and the remainders of $R^{26}$ to $R^{29}$ are each independently selected from the group consisting of hydrogen, straight, branched or cyclic $C_1$-$C_{20}$ alkyl, halogen, straight, branched or cyclic $C_1$-$C_{20}$ haloalkyl, straight, branched or cyclic $C_1$-$C_{20}$ alkoxy, straight, branched or cyclic $C_2$-$C_{20}$ alkoxyalkyl, straight, branched or cyclic $C_2$-$C_{20}$ alkylcarbonyloxy, $C_7$-$C_{20}$ arylcarbonyloxy, straight, branched or cyclic $C_1$-$C_{20}$ alkylsulfonyloxy, $C_6$-$C_{20}$ arylsulfonyloxy, straight, branched or cyclic $C_2$-$C_{20}$ alkoxycarbonyl, and straight, branched or cyclic $C_3$-$C_{20}$ alkoxycarbonylalkyl, $X^5$ which may be the same or different is —O— or —$CR^{31}{}_2$— wherein $R^{31}$ is hydrogen or straight or branched $C_1$-$C_{10}$ alkyl, and p is 0 or an integer of 1 to 3.

7. The hydrogenated ring-opening metathesis polymer of claim 6 wherein the total of structural units [A] of formula [1], structural units [B] of formula [3] and structural units [C] of formula [4], and structural units [E] of formula [7] are present in a constitutional molar ratio defined as ([A]+[B]+[C])/[E] from 99/1 to 20/80.

8. The hydrogenated ring-opening metathesis polymer of claim 6 wherein the total of structural units [A] of formula [1], structural units [B] of formula [3], structural units [C] of formula [4] and structural units [D] of formula [5], and structural units [E] of formula [7] are present in a constitutional molar ratio defined as ([A]+[B]+[C]+[D])/[E] from 99/1 to 20/80.

9. The hydrogenated ring-opening metathesis polymer of claim 1, having a weight average molecular weight of 2,000 to 200,000 as measured by gel permeation chromatography versus polystyrene standards.

10. A resist composition comprising the hydrogenated ring-opening metathesis polymer of claim 1 as a base resin.

11. A pattern forming process comprising the steps of
applying a resist composition comprising the hydrogenated ring-opening metathesis polymer of claim 1 as a base resin onto a substrate to form a coating,
heat treating the coating and then exposing it to high-energy radiation or electron beam through a photomask, and
optionally heat treating the exposed coating and developing it with a developer.

* * * * *